United States Patent
Jinta et al.

(10) Patent No.: US 9,535,296 B2
(45) Date of Patent: Jan. 3, 2017

(54) DISPLAY APPARATUS, METHOD OF MANUFACTURING A DISPLAY APPARATUS, ELECTRONIC APPLIANCE, AND METHOD OF DRIVING A DISPLAY APPARATUS

(71) Applicant: JOLED INC., Tokyo (JP)

(72) Inventors: Seiichiro Jinta, Kanagawa (JP); Seonghee Noh, Kanagawa (JP); Shinichi Teraguchi, Kanagawa (JP); Eiji Hasegawa, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/396,814

(22) PCT Filed: Jun. 20, 2013

(86) PCT No.: PCT/JP2013/003869
§ 371 (c)(1),
(2) Date: Oct. 24, 2014

(87) PCT Pub. No.: WO2014/020817
PCT Pub. Date: Feb. 6, 2014

(65) Prior Publication Data
US 2015/0138463 A1 May 21, 2015

(30) Foreign Application Priority Data

Jul. 31, 2012 (JP) ................................. 2012-170409
Jan. 30, 2013 (JP) ................................. 2013-015414

(51) Int. Cl.
*G02F 1/1343* (2006.01)
*H01L 51/52* (2006.01)
(Continued)

(52) U.S. Cl.
CPC ....... *G02F 1/1343* (2013.01); *G02F 1/133345* (2013.01); *G02F 1/133514* (2013.01);
(Continued)

(58) Field of Classification Search
CPC ................... G02F 1/133345; G02F 1/133514;
G02F 1/1343; H01L 2251/5315; H01L
27/3211; H01L 27/3218; H01L 27/322;
H01L 27/3223; H01L 27/3246; H01L
27/3248; H01L 51/5218; H01L 51/5271;
Y10T 156/1057
(Continued)

(56) References Cited

U.S. PATENT DOCUMENTS 7,847,477 B2 12/2010 Arai
8,400,055 B2 * 3/2013 Naono ................ H01L 27/3276
313/503
(Continued)

FOREIGN PATENT DOCUMENTS

CN    100550102 C    10/2009
CN    101800194      8/2010
(Continued)

OTHER PUBLICATIONS

Taiwan Office Examination Report and Search Report issued in connection with related Taiwan patent application No. 102123700 dated Sep. 3, 2015 with English translation.
(Continued)

*Primary Examiner* — Donald Raleigh
*Assistant Examiner* — Kevin Quarterman
(74) *Attorney, Agent, or Firm* — Dentons US LLP

(57) ABSTRACT

There is provided a display apparatus including a wiring pattern formed over a substrate, a first insulating film which is laminated over the wiring pattern and in which a contact hole is formed in an up-down direction at a specified position, lower electrodes each formed over the first insulating film and including a contact portion that is inserted through the contact hole and electrically connected to the wiring pattern, a light emitting layer formed over the lower
(Continued)

electrodes, an upper electrode formed over the light emitting layer, a light emitting region regulating member regulating a light emitting region where the light emitting layer is interposed between the lower electrodes and the upper electrode as a region including the contact portion, and a color filter disposed over the substrate in a region corresponding to at least the contact portion.

20 Claims, 44 Drawing Sheets

(51) Int. Cl.
G02F 1/1333 (2006.01)
G02F 1/1335 (2006.01)
H01L 27/32 (2006.01)
(52) U.S. Cl.
CPC ........ *H01L 27/322* (2013.01); *H01L 27/3246* (2013.01); *H01L 51/5218* (2013.01); *H01L 51/5271* (2013.01); H01L 27/3211 (2013.01); H01L 27/3218 (2013.01); H01L 27/3223 (2013.01); H01L 27/3248 (2013.01); H01L 2251/5315 (2013.01); Y10T 156/1057 (2015.01)
(58) Field of Classification Search
USPC .......................................... 313/498–512, 112
See application file for complete search history.

(56) References Cited

U.S. PATENT DOCUMENTS

| 2003/0137325 | A1* | 7/2003 | Yamazaki | H01L 27/322 327/80 |
|---|---|---|---|---|
| 2003/1700491 | | 9/2003 | Liao | |
| 2005/0007015 | A1 | 1/2005 | Yokoyama | |
| 2005/0046342 | A1 | 3/2005 | Park et al. | |
| 2009/0026446 | A1* | 1/2009 | Lee | H01L 27/3211 257/40 |
| 2009/0251048 | A1 | 10/2009 | Choi et al. | |
| 2009/0302757 | A1 | 12/2009 | Arai | |
| 2009/0315458 | A1* | 12/2009 | Choi | H01L 27/3276 313/505 |
| 2010/0062147 | A1* | 3/2010 | Kinoshita | G02F 1/133516 427/58 |
| 2010/0200869 | A1 | 8/2010 | Sekiya | |
| 2011/0073885 | A1 | 3/2011 | Kim et al. | |
| 2011/0148944 | A1* | 6/2011 | Kobayashi | G09G 3/3225 345/690 |
| 2012/0097933 | A1* | 4/2012 | Ando | H01L 51/001 257/40 |

FOREIGN PATENT DOCUMENTS

| CN | 102034850 | 4/2011 |
|---|---|---|
| CN | 102403334 | 4/2012 |
| EP | 1 339 112 A2 | 8/2003 |
| EP | 1 482572 A1 | 12/2004 |
| GB | 2483764 A | 3/2012 |
| JP | 2001-076868 | 3/2001 |
| JP | 2001-250694 | 9/2001 |
| JP | 3744766 | 12/2005 |
| JP | 2006-058751 | 3/2006 |
| JP | 2007-171828 | 7/2007 |
| JP | 2007-234241 | 9/2007 |
| JP | 2007-280622 | 10/2007 |
| JP | 2008-218296 | 9/2008 |
| JP | 2008-298966 | 12/2008 |
| JP | 2009-295538 | 12/2009 |
| JP | 2010-182638 | 8/2010 |
| JP | 2005-011793 | 6/2016 |
| TW | 200603659 A | 1/2006 |
| TW | 1261484 | 9/2006 |
| TW | 1275320 | 3/2007 |
| TW | 201034505 A | 9/2010 |
| TW | 201208081 A1 | 2/2012 |
| TW | 201226997 A | 7/2012 |

OTHER PUBLICATIONS

Japanese Patent Office Action corresponding to JP Serial No. 2013-015414 dated Jun. 21, 2016.
Chinese Office Action dated Dec. 3, 2015 corresponding to Chinese Serial No. 201380021841.4.

* cited by examiner

Fig. 27
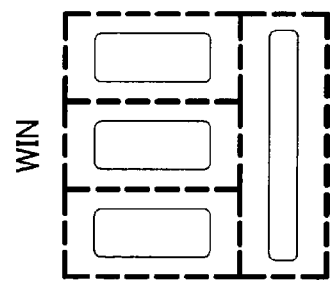
+
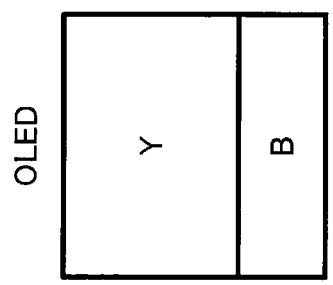
+
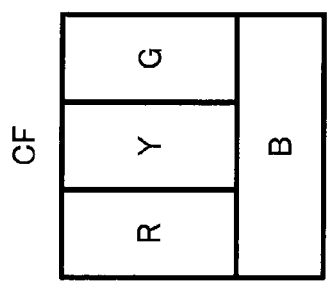
=
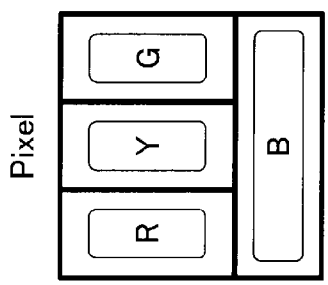

[Fig. 29]

DISPLAY APPARATUS, METHOD OF MANUFACTURING A DISPLAY APPARATUS, ELECTRONIC APPLIANCE, AND METHOD OF DRIVING A DISPLAY APPARATUS

TECHNICAL FIELD

The present disclosure relates to a display apparatus, an electronic appliance, a method of manufacturing a display apparatus, and a method of driving a display apparatus.

The present disclosure contains subject matter related to that disclosed in Japanese Priority Patent Application JP 2013-015414 filed in the Japan Patent Office on Jan. 30, 2013, the entire contents of which are hereby incorporated by reference.

BACKGROUND ART

In recent years, self-emissive display apparatuses that use LEDs (Light Emitting Diodes) and OLEDs (Organic Light Emitting Diodes) as light emitting elements have become widespread. In such display apparatuses, a light emitting element is disposed between an anode and a cathode and light is emitted by applying a voltage to the element. A region where the element is interposed between the electrodes is called a "light emitting region". The larger the proportion of the display region occupied by such light emitting regions, the more efficiently such display apparatus can emit light.

However, in reality, the size of the light emitting regions is limited due to various reasons. For this reason, technologies for having light more efficiently outputted from the limited light emitting regions have been proposed. As one example, JP 2008-218296A discloses a technology that controls the light distribution angle, distribution, and the like while keeping the light distribution characteristics uniform by reflecting light with concave mirror portions erected around the light emitting surfaces of the light emitting elements.

Meanwhile, JP 2007-171828A discloses a technology where a pixel driving circuit of a display apparatus causes a light emitting element to function in a reverse bias as a capacitive element. In such case, the size of the light emitting region affects the capacity when the light emitting element functions as a capacitive element. Here, the larger the light emitting region, the larger the capacity when the light emitting region functions as a capacitive element.

CITATION LIST

Patent Literature

[PTL 1]
JP 2008-218296A
[PTL 2]
JP 2007-171828A

SUMMARY

Technical Problem

As described above, for an emissive display apparatus, there is demand to make the light emitting regions larger. For this reason, the present disclosure provides a new and improved display apparatus, method of manufacturing a display apparatus, electronic appliance, and method of driving a display apparatus capable of making the light emitting regions larger for an emissive light emitting apparatus.

Solution to Problem

According to an embodiment of the present disclosure, there is provided a display apparatus including a wiring pattern formed over a substrate, a first insulating film which is laminated over the wiring pattern and in which a contact hole is formed in an up-down direction at a specified position, lower electrodes each formed over the first insulating film and including a contact portion that is inserted through the contact hole and electrically connected to the wiring pattern, a light emitting layer formed over the lower electrodes, an upper electrode formed over the light emitting layer, a light emitting region regulating member regulating a light emitting region where the light emitting layer is interposed between the lower electrodes and the upper electrode as a region including the contact portion, and a color filter disposed over the substrate in a region corresponding to at least the contact portion.

According to an embodiment of the present disclosure, there is provided a method of manufacturing a display apparatus, the method including forming a wiring pattern over a substrate, laminating a first insulating film over the wiring pattern and forming a contact hole in an up-down direction at a specified position over the first insulating film, forming, over the first insulating film, a lower electrode including a contact portion that is inserted through the contact hole and electrically connected to the wiring pattern, forming a light emitting layer over the lower electrode, forming an upper electrode over the light emitting layer, regulating a light emitting region where the light emitting layer is interposed between the lower electrode and the upper electrode as a region including the contact portion, and disposing a color filter over the substrate in a region corresponding to at least the contact portion.

According to an embodiment of the present disclosure, there is provided an electronic appliance including a display apparatus including a wiring pattern formed over a substrate, a first insulating film which is laminated over the wiring pattern and in which a contact hole is formed in an up-down direction at a specified position, a lower electrode formed over the first insulating film and including a contact portion that is inserted through the contact hole and electrically connected to the wiring pattern, a light emitting layer formed over the lower electrode, an upper electrode formed over the light emitting layer, a light emitting region regulating member regulating a light emitting region where the light emitting layer is interposed between the lower electrode and the upper electrode as a region including the contact portion, and a color filter disposed over the substrate in a region corresponding to at least the contact portion.

According to an embodiment of the present disclosure, there is provided a method of driving a display apparatus including a wiring pattern formed over a substrate, a first insulating film which is laminated over the wiring pattern and in which a contact hole is formed in an up-down direction at a specified position, a lower electrode formed over the first insulating film and including a contact portion that is inserted through the contact hole and electrically connected to the wiring pattern, a light emitting layer formed over the lower electrode, an upper electrode formed over the light emitting layer, a light emitting region regulating member regulating a light emitting region where the light emitting layer is interposed between the lower electrode and the upper electrode as a region including the contact portion, and a color filter disposed over the substrate in a region corresponding to at least the contact portion, the method including driving the display apparatus using a pixel driving circuit electrically connected to the wiring pattern so that a light emitting element including the light emitting layer function as a capacitive element in a reverse bias.

By including the contact portion of the lower electrode in the light emitting region, it is possible to make the light emitting region larger than in a case where the contact portion is not included. Shifts in the color of emitted light due to changes in the thickness of the light emitting layer at the contact portion can be removed using the color filter.

Advantageous Effects of Invention

According to the above embodiments of the present disclosure, it is possible to make the light emitting region larger in an emissive light emitting apparatus.

BRIEF DESCRIPTION OF DRAWINGS

FIG. 27 is a plan view showing a first variation of a light emitting layer.

DESCRIPTION OF EMBODIMENTS

Figure 1:
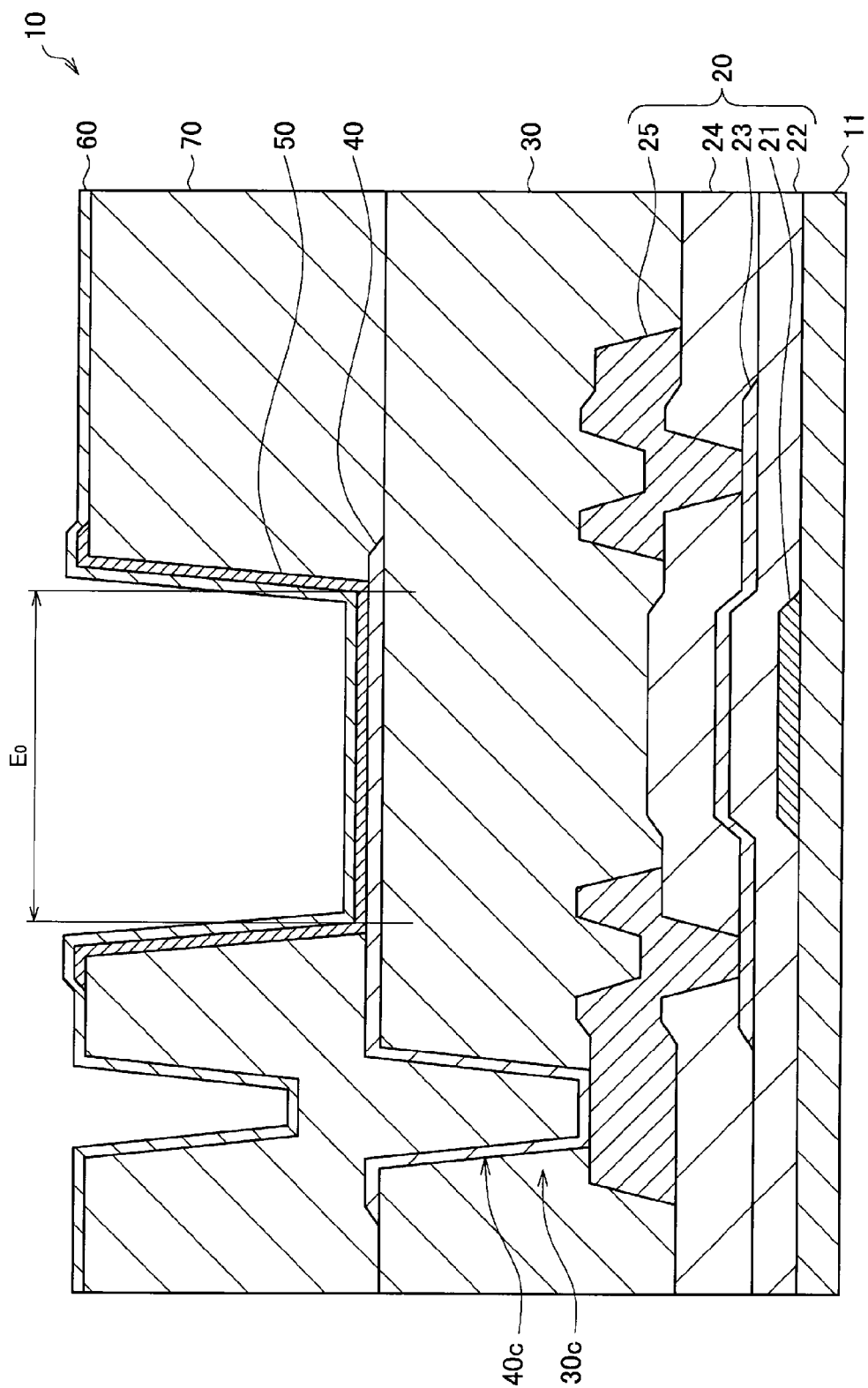
FIG. 1 is a cross-sectional view showing an example where a light emitting region is limited by a contact portion.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The following description is given in the order indicated below.
1. First Embodiment
  1-1. Description of Related Technology
  1-2. Configuration of Display Apparatus
  1-3. Method of Manufacturing Display Apparatus
2. Second Embodiment
3. Third Embodiment
4. Fourth Embodiment
5. Variations of Light Emitting Regions-1
6. Fifth Embodiment
7. Sixth Embodiment
8. Variations of Light Emitting Regions-2
9. Light Emitting Layer Variations
10. Pixel Pattern Layouts
11. Application to Electronic Appliance
12. Supplementary Explanation 1. First Embodiment 1-1. Description of Related Technology First, to enable the reader to understand the embodiments of the present disclosure, related technology will be described. As mentioned earlier, the size of the light emitting regions of an emissive display apparatus is limited due to various reasons. One reason is the presence of contact portions that connect lower electrodes to a wiring pattern. This will now be described with reference to FIG. 1 and FIG. 2.

FIG. 1 is a cross-sectional view showing one example where a light emitting region is limited by a contact portion. FIG. 1 shows an organic EL (ElectroLuminescence) display 10. The organic EL display 10 includes a substrate 11, a TFT (Thin Film Transistor) layer 20, a smoothing insulating film 30, a lower electrode 40, a light emitting layer 50, an upper electrode 60, and an opening regulating insulating film 70. The TFT layer 20 includes a gate electrode 21, a gate insulating film 22, a semiconductor layer 23, an interlayer insulating film 24, and a wiring pattern 25. The organic EL display 10 is a top emission-type display apparatus where light is outputted from the upper electrode 60 side.

In the illustrated organic EL display 10, the light emitting region $E_0$ is the region where the light emitting layer 50 is interposed between the lower electrode 40 and the upper electrode 60. Here, the light emitting region $E_0$ is regulated by the opening formed in the opening regulating insulating film 70. Since the opening regulating insulating film 70 is interposed between the lower electrode 40 and the light emitting layer 50 in regions aside from the light emitting region $E_0$, the light emitting layer 50 does not emit light in such regions.

Here, the lower electrode 40 is electrically connected to the wiring pattern 25 at a contact portion 40c. The contact portion 40c is a part where the lower electrode 40 is inserted through a contact hole 30c formed in the smoothing insulating film 30. The contact hole 30c is an opening formed so as to pass through the smoothing insulating film 30 in the up-down direction.

As shown in the drawing, the light emitting region $E_0$ of the organic EL display 10 is set so as to not include the contact portion 40c of the lower electrode 40. If the light emitting layer 50 were formed over the lower electrode 40 with the contact portion 40c as the light emitting region $E_0$, the thickness of the light emitting layer 50 would differ compared to other parts due to the formed stepped part (that is, the light emitting layer 50 being depressed toward the wiring pattern 25). If the thickness of the light emitting layer 50 changes within the light emitting region, there will be a color shift in the emitted light at such part. In particular, the color shift will be especially large if the thickness of the light emitting layer 50 is set according to the cavity design.

Figure 2:
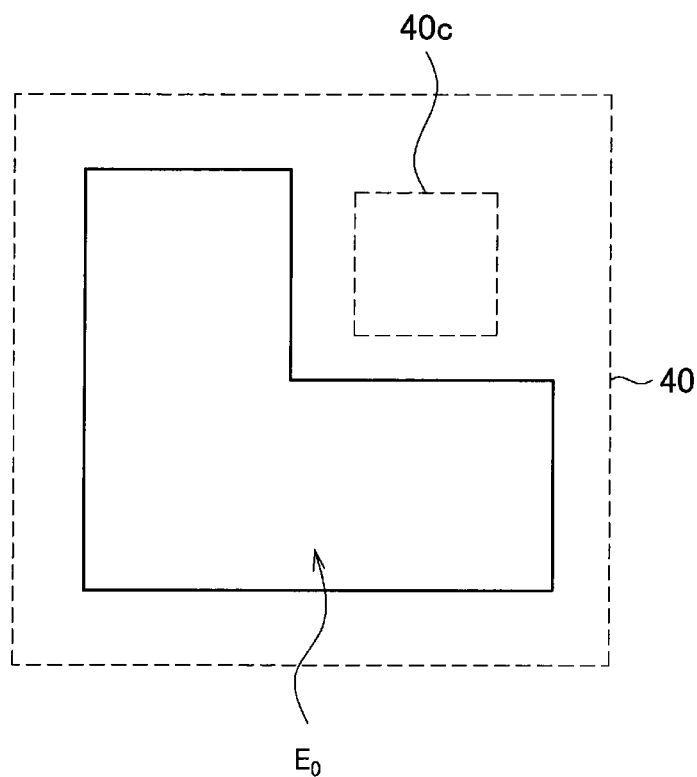
FIG. 2 is a plan view showing an example where the light emitting region is limited by the contact portion.

FIG. 2 is a plan view showing an example where the light emitting region is restricted by the contact portion. As described above, in the organic EL display 10, the light emitting region $E_0$ is set so as to not include the contact portion 40c of the lower electrode 40. Accordingly, as shown in the drawing, the size of the light emitting region $E_0$ is smaller than the size of the lower electrode 40 by an amount corresponding to the contact portion 40c.

The embodiments of the present disclosure described below avoid the restriction in the size of the light emitting regions due to the contact portions between the lower electrode and the wiring pattern as in the example described above and thereby make it possible to set the light emitting regions larger.

1-2. Configuration of Display Apparatus

Overall Configuration

Figure 3:
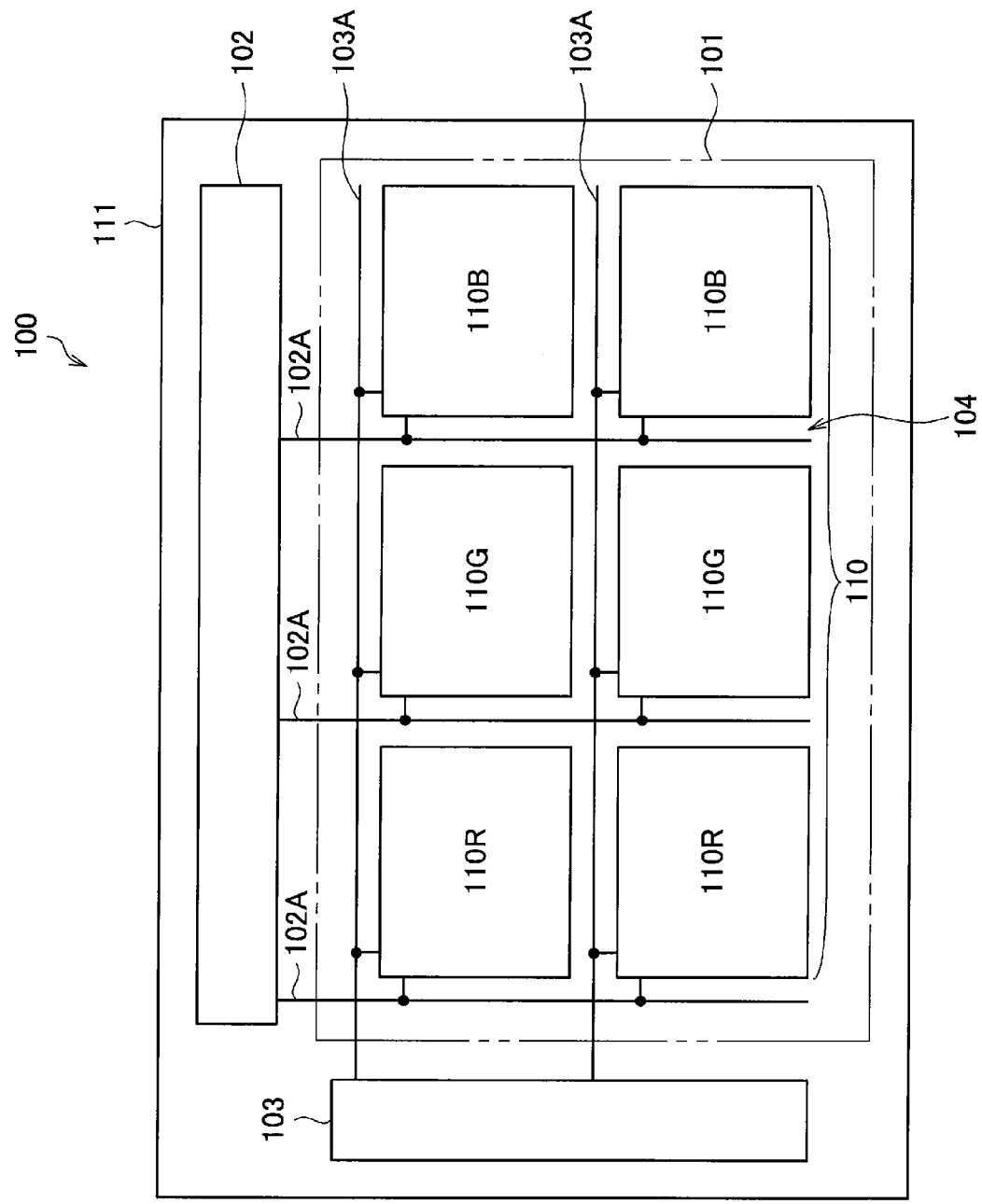
FIG. 3 is a diagram showing the configuration of a display apparatus according to a first embodiment of the present disclosure.

FIG. 3 is a diagram showing an example configuration of a display apparatus according to a first embodiment of the present disclosure. The display apparatus according to the present embodiment is an organic EL display 100.

As shown in FIG. 3, the organic EL display 100 includes a display region 101 where red light emitting elements 110R, green light emitting elements 110G, and blue light emitting elements 110B are arranged in a matrix over a substrate 111. A pixel 110 includes a set of a red light emitting element 110R, a green light emitting element 110G, and a blue light emitting element 110B. A signal line driving circuit 102 and a scan line driving circuit 103 are provided in the periphery of the display region 101 as a video display driver.

Pixel driving circuits 104 which are connected to the respective red light emitting elements 110R, green light emitting elements 110G, and blue light emitting elements 110B are also provided in the display region 101. The configuration of a pixel driving circuit 104 is described in more detail below with reference to FIG. 4.

Configuration of Pixel Driving Circuit

Figure 4:
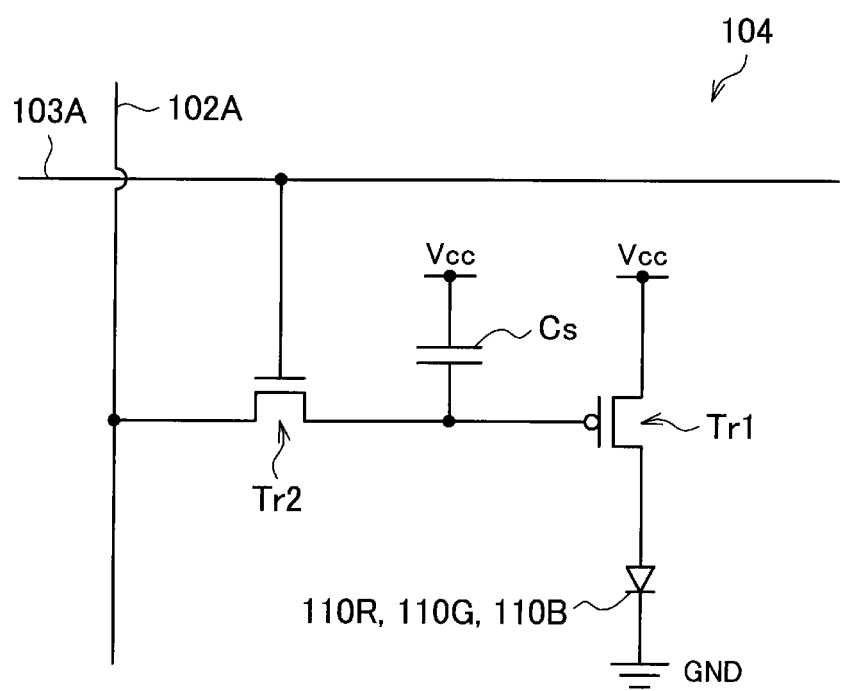
FIG. 4 is a diagram showing an example configuration of a pixel driving circuit provided in the display apparatus according to the first embodiment of the present disclosure.

FIG. 4 is a diagram showing an example configuration of a pixel driving circuit 104 provided in the organic EL display 100. In the present embodiment, the pixel driving circuit 104 is an active-type driving circuit formed below a lower layer of the lower electrode of the light emitting elements, described later.

As shown in FIG. 4, the pixel driving circuit 104 includes a driving transistor Tr1 and a write transistor Tr2, with a capacitor Cs being connected between the driving transistor Tr1 and the write transistor Tr2. A red light emitting element 110R, a green light emitting element 110G, or a blue light emitting element 110B is connected in series to the driving transistor Tr1 between a first power supply line Vcc and a second power supply line GND.

Here, the driving transistor Tr1 and the write transistor Tr2 are typical thin film transistors. Various constructions can be used as the construction of the TFT, such as an inverted staggered construction (bottom gate type) or a staggered construction (top gate type).

A plurality of signal lines 102A in the column direction and a plurality of scan lines 103A in the row direction are also arranged for the pixel driving circuits 104. Each intersection between the signal lines 102A and the scan lines 103A corresponds to one of the red light emitting elements 110R, the green light emitting elements 110E and the blue light emitting elements 110B. The respective signal lines 102A are connected to the signal line driving circuit 102 described above and the signal line driving circuit 102 supplies an image signal to the source electrodes of the write transistors Tr2 via the signal lines 102A. In the same way, the respective scan lines 103A are connected to the scan line driving circuit 103 described above and the scan line driving circuit 103 successively supplies a scan signal to the gate electrodes of the write transistors Tr2 via the scan lines 103A.

Configuration of Display Region

Figure 5:
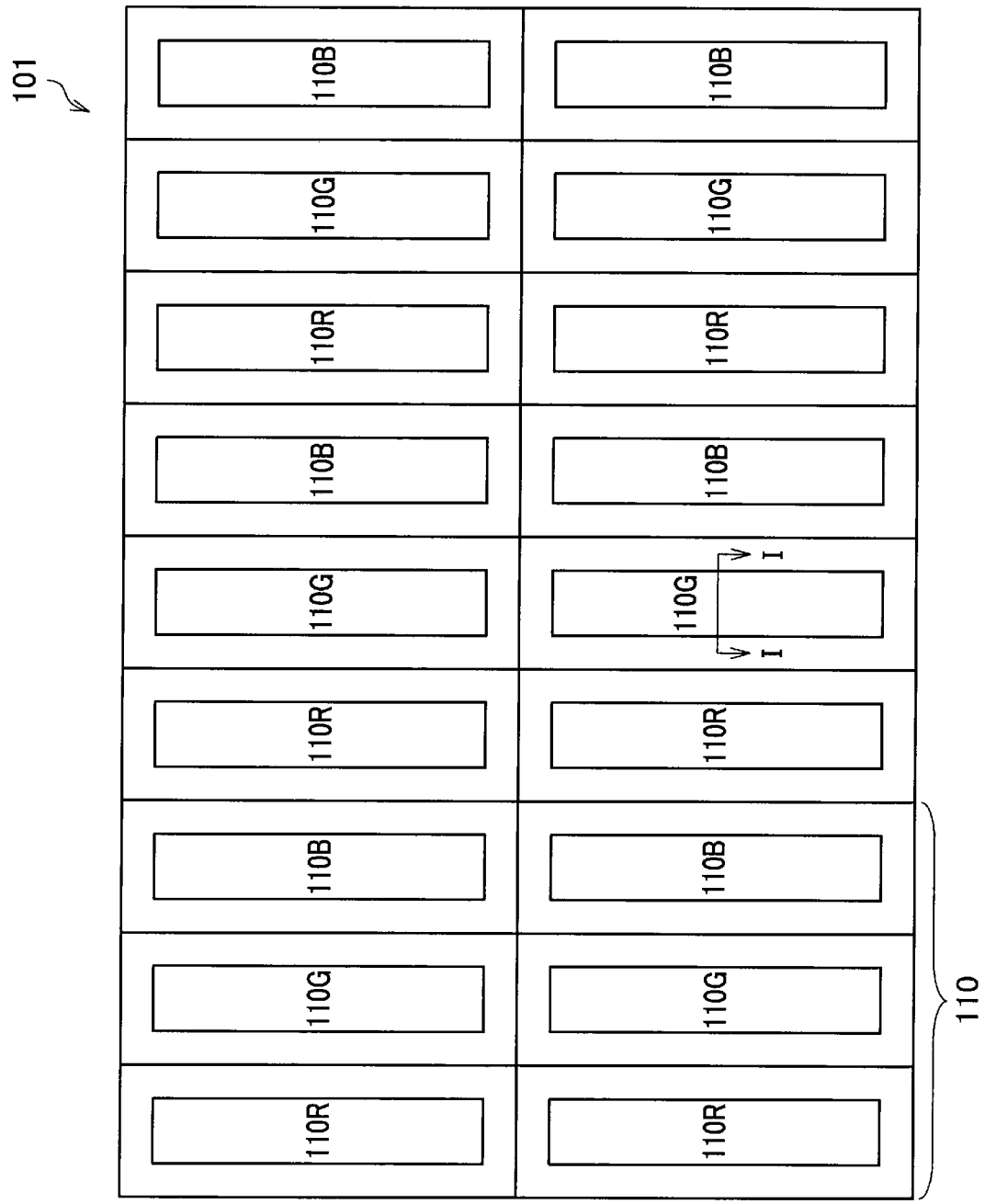
FIG. 5 is a diagram showing an example of the planar configuration of a display region in the display apparatus according to the first embodiment of the present disclosure.

FIG. 5 is a diagram showing an example of the planar configuration of the display region 101 of the organic EL display 100. As shown in FIG. 5, the red light emitting elements 110R, the green light emitting elements 110G, and the blue light emitting elements 110B are arranged in a matrix in the display region 101. A set of a red light emitting element 110R, a green light emitting element 110E and a blue light emitting element 110B construct a pixel.

Figure 6:
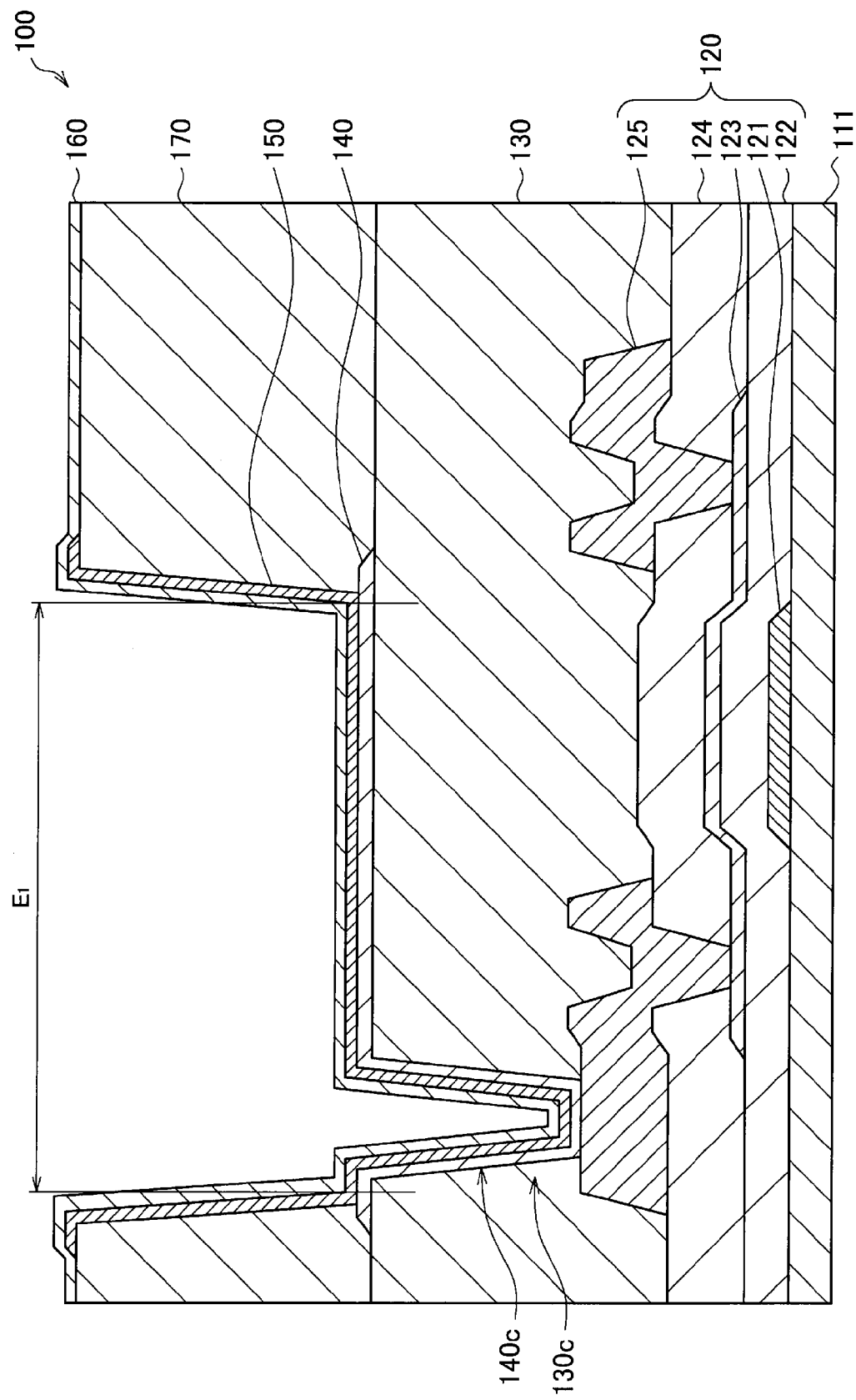
FIG. 6 is a cross-sectional view taken along a line I-I in FIG. 5.

FIG. 6 is a cross-sectional view along a line I-I of a green light emitting element 110G part in FIG. 5. Note that the construction described below is also the same for the red light emitting elements 110R and the blue light emitting elements 110B. As shown in FIG. 6, the TFT layer 120, the smoothing insulating film 130, the lower electrode 140, the light emitting layer 150, the upper electrode 160, and the opening regulating insulating film 170 are formed in that order over the substrate 111. A sealing substrate, not shown, is disposed over the upper electrode 160. Further layers, such as a protective layer, may be formed, between the upper electrode 160 and the sealing substrate. The lower electrode 140, the light emitting layer 150, and the upper electrode 160 construct a light emitting element. Note that the organic EL display 100 is a top-emission type display apparatus where light of the light emitting element is outputted from the upper electrode 160 side.

The substrate 111 is a support with a flat surface. As examples, a film or sheet of quartz, glass, metal foil, or resin can be used as the substrate 111.

The TFT layer 120 includes a gate electrode 121, a gate insulating film 122, a semiconductor layer 123, an interlayer insulating film 124, and a wiring pattern 125. As one example, pixel driving circuits including the driving transistor Tr1, the write transistor Tr2, and the capacitor Cs shown in FIG. 4 are formed in the TFT layer 120. The gate electrode 121 may be formed using Mo, for example. The wiring pattern 125 may be formed using a laminated structure of Ti/Al/Ti, for example.

Here, as described above, it is possible to use various constructions as the TFT construction. Accordingly, the illustrated bottom gate construction TFT layer 120 is merely one example and it is possible for the TFT layer 120 to have a top gate construction. It is also possible to form the TFT layer 120 as various types of TFT, such as an amorphous silicon (a-Si) TFT, a low-temperature poly silicon (LTPS) TFT, an organic TFT, or a transparent oxide semiconductor (TOS) TFT. Note that as examples, an LTPS with high mobility is suited to the high resolution display of a mobile appliance such as a smartphone or a mobile phone, an organic TFT that has a high bending strength is suited to a flexible panel, and a-Si and TOS that are capable of being manufactured in large sizes are suited to large displays.

The smoothing insulating film 130 is provided to smooth the surface of the TFT layer 120. Contact holes 130c are formed in the smoothing insulating film 130. The contact holes 130c are openings formed so as to pass through the smoothing insulating film 130 in the up-down direction and contact portions 140c of the lower electrode 140 are inserted through such contact holes 130c and are electrically connected to the wiring pattern 125. For this reason, the smoothing insulating film 130 should preferably be formed using a material with high patterning precision, such as an organic material like polyimide or an inorganic material such as silicon oxide ($SiO_2$).

The lower electrode 140 is the anode of the light emitting element and is electrically connected to the wiring pattern 125 of the TFT layer 120 by a contact portion 140c that is inserted through the contact hole 130c as described above. The lower electrode 140 is provided separately for each light emitting element and as one example is formed using a metal material such as ITO (Indium Tin Oxide)/Al alloy, or Al alloy. Note that although the organic EL display 100 may be a bottom emission type as described later, in this case the lower electrode 140 is formed using ITO for example as a transparent electrode with a thickness of several tens of nanometers to several hundreds of nanometers.

The light emitting layer 150 is formed so as to include a light emitting material with at least one peak wavelength in a specified range of wavelengths that corresponds to the color of the light emitting element, and is a layer that emits light when a voltage is applied between the lower electrode 140 and the upper electrode 160. As one example, the light emitting layer 150 is formed by a laminated structure composed of a hole injection layer, a hole transport layer, a light emitting material layer, an electron transport layer, and an electron injection layer in that order from the anode side. In the present embodiment, the light emitting layer 150 is also split into colors for each light emitting element. In this case, the colored part may only be the light emitting material, and the other layers such as the hole injection layer may be commonly formed across the entire display region 101. The light emitting layer 150 may be formed by printing or transfer, or may be formed by vapor deposition.

The upper electrode 160 is the cathode of the light emitting element and is commonly provided to be shared in the entire display region 101 to reduce resistance. That is, the upper electrode 160 is an electrode that is shared by the respective light emitting elements. As one example, the upper electrode 160 may be formed using MgAg (an electrode made translucent by reducing the thickness) with a thickness of several nanometers to several tens of nanometers) or IZO (Indium Zinc Oxide; a transparent electrode) with a thickness of several tens of nanometers to several hundreds of nanometers. Note that if the organic EL display 100 is a bottom emission type, the upper electrode 160 may be formed using MgAg with a thickness of several tens of nanometers to several hundreds of nanometers, for example.

The opening regulating insulating film 170 ensures that the lower electrode 140 and the upper electrode 160 are insulated from each other and regulates the light emitting region using the formed opening. As one example, the opening regulating insulating film 170 may be formed using an inorganic insulating material such as silicon oxide. Alternatively, the opening regulating insulating film 170 may be formed by laminating a photosensitive resin, such as photosensitive polyimide, over the inorganic insulating material described above.

With the organic EL display 100 described above, the light emitting region $E_1$ is the region where the light emitting layer 150 is interposed between the lower electrode 140 and the upper electrode 160. Here, the light emitting region $E_1$ is regulated by the opening formed in the opening regulating insulating film 170. Since the opening regulating insulating film 170 is interposed between the lower electrode 140 and the light emitting layer 150 in regions aside from the light emitting region $E_1$, the light emitting layer 150 does not emit light in such regions.

As shown in the drawing, the light emitting region $E_1$ is set so as to include the contact portion 140c of the lower electrode 140. As described earlier, if the contact portion 140c is included in the light emitting region $E_1$ and the light emitting layer 150 is formed over the lower electrode 140 at the contact portion 140c, the thickness of the light emitting layer 150 will differ from thicknesses of other parts due to the formed stepped part (that is, the light emitting layer 150 being depressed toward the wiring pattern 125), resulting in a color shift. For this reason, in the present embodiment, by removing the color shift in the emitted light using a color filter (not shown) provided in the light emitting region $E_1$, it is possible to set the light emitting region $E_1$ so as to include the contact portion 140c.

Figure 7:
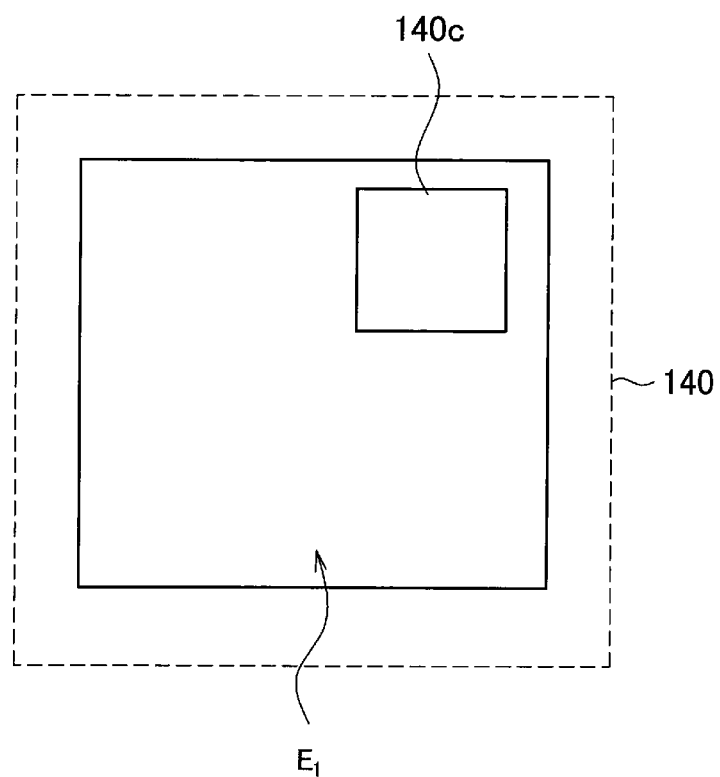
FIG. 7 is a plan view showing a light emitting element of the display apparatus according to the first embodiment of the present disclosure.

FIG. 7 is a plan view showing a light emitting element part of the display apparatus according to the first embodiment of the present disclosure. As described above, in the organic EL display 100, the light emitting region $E_1$ is set so as to include the contact portion 140c of the lower electrode 140. Accordingly, as shown in FIG. 7, it is possible to make the size of the light emitting region $E_1$ approach the size of the lower electrode 140. That is, compared to the light emitting region $E_0$ of the organic EL display 10 in the example shown in FIG. 2, the size of the light emitting region $E_1$ is increased by at least the size of the contact portion 140c.

By doing so, in the organic EL display 100, the proportion of the display region occupied by the light emitting regions is increased compared for example to the organic EL display 10 described above. Accordingly, the organic EL display 100 is capable of emitting light more efficiently than the organic EL display 10.

Since the lower electrode 140 is formed of a metal material that does not transmit light as described above, the light that is incident on the lower electrode 140 is totally reflected. Accordingly, at the part of the light emitting region $E_1$ that corresponds to the contact portion 140c, the light emitted from the light emitting layer 150 is reflected by the lower electrode 140 toward the upper electrode 160, or in other words, toward the side from which light is outputted. That is, at the part of the light emitting region $E_1$ that corresponds to the contact portion 140c, the effect of the reflective surfaces disclosed for example in JP 2008-218296A is achieved by the lower electrode on the side surfaces, which reduces the loss of emitted light in the horizontal direction and improves the output efficiency of light.

In addition, if the pixel driving circuits are formed in the TFT layer 120 so that the light emitting element functions as a capacitive element in a reverse bias as disclosed for example in JP 2007-171828A, JP 2012-088724A, or JP 2012-088725A, the capacity per unit area will increase at the part of the light emitting region $E_1$ that corresponds to the contact portion 140c by an amount corresponding to the formed stepped part. That is, although a plate capacitor is constructed by the light emitting element at other parts of the light emitting region $E_1$, at the contact portion 140c, a trench capacitor is constructed by the light emitting element. Accordingly, by expanding the light emitting region $E_1$ as far as a region including the contact portion 140c, the capacity as a capacitor increases by the increase in simple area or more.

Note that the above advantage regarding the capacitance is not limited to when the organic EL display 100 is a top emission-type device. As one example, the organic EL display 100 may be a bottom emission-type display apparatus where the lower electrode 140 (anode) is a transparent electrode such as ITO and the light of the light emitting element is outputted from the substrate 111-side. In this case, since the wiring pattern 125 (which is formed using a metal material such as Ti/Al/Ti and does not transmit light is present between the contact portion 140c and the substrate 111, even if the light emitting region $E_1$ is expanded as far as a region including the contact portion 140c, there is no change in the light emitting area. However, even in this case, if, as described above, the pixel driving circuit is formed so that the light emitting element functions as a capacitive element in a reverse bias, it is possible to enjoy the advantages of the increase in capacity as a capacitor due to the increase in the light emitting region $E_1$.

1-3. Method of Manufacturing Display Apparatus

Figure 8:
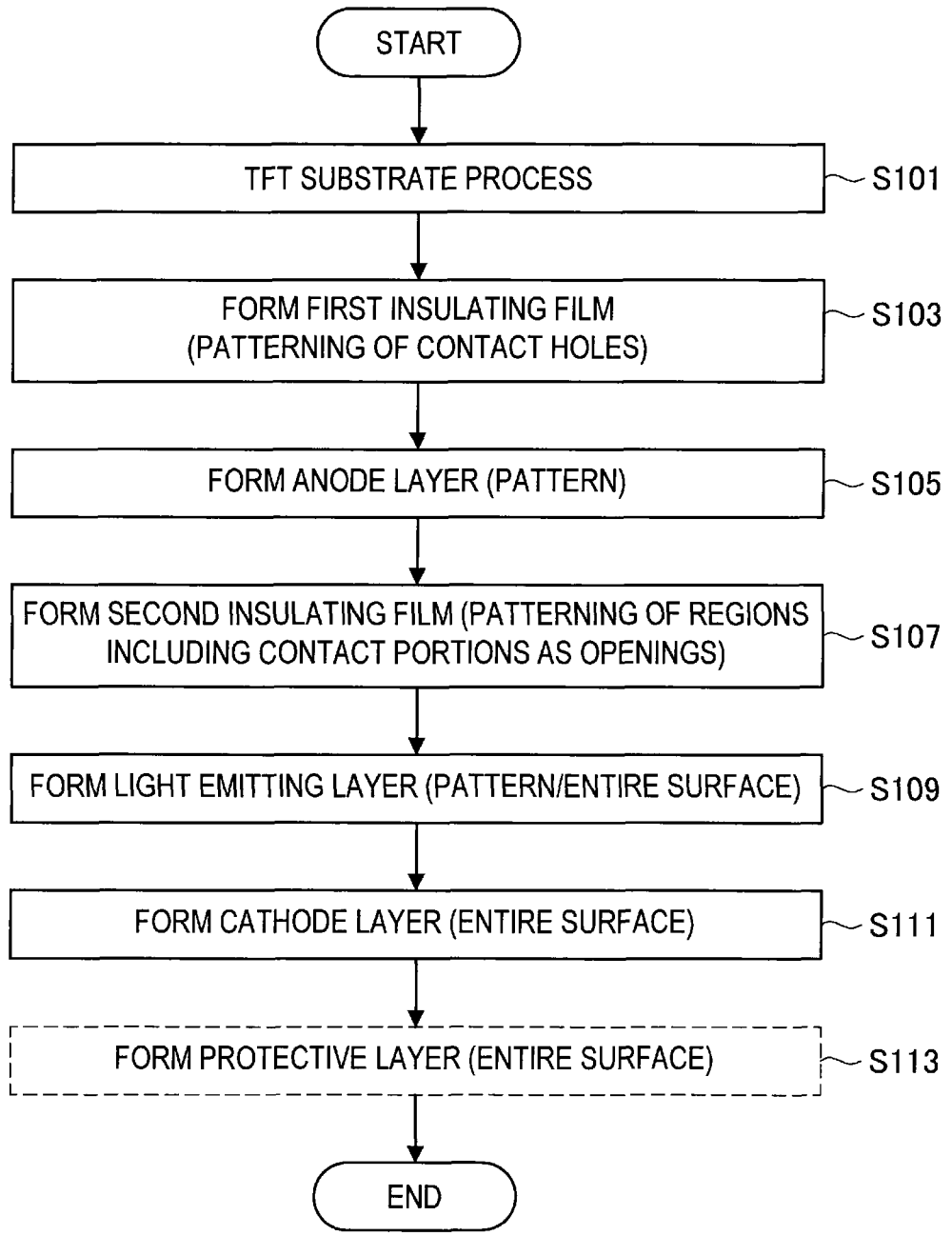
FIG. 8 is a flowchart showing a method of manufacturing the display apparatus according to the first embodiment of the present disclosure.

FIG. 8 is a flowchart showing a method of manufacturing the display apparatus according to the first embodiment of the present disclosure. As shown in FIG. 8, with the method of manufacturing the organic EL display 100 that is a display apparatus according to the present embodiment, first a TFT substrate process is carried out (step S101). The TFT substrate process is a process that forms the TFT layer 120 including the wiring pattern 125 over the substrate 111. As described above, since it is possible to use various TFT constructions for the TFT layer 120, the TFT substrate process will differ according to the TFT construction in use. For the TFT substrate process, since it is possible to use well-known techniques that are suited to the various TFT constructions, detailed description of such is omitted here. Since the process for disposing the color filters can also be carried out by laying out color filters at arbitrary positions in accordance with well-known techniques, illustration thereof is omitted.

Next, the smoothing insulating film 130 (first insulating film) is formed (step S103). As described above, the contact holes 130c are formed in the smoothing insulating film 130. In the illustrated method of manufacturing, the contact holes 130c are formed in the smoothing insulating film 130 by patterning. More specifically, first an insulating film formed of photosensitive polyimide or the like is disposed over the TFT layer 120 and then the contact holes 130c are formed by exposing using a mask with openings at parts corresponding to the contact holes 130c.

Next, the lower electrode 140 (anode layer) is formed (step S105). The lower electrode 140 is patterned into a shape corresponding to the respective light emitting elements.

Next, the opening regulating insulating film 170 (second insulating film) is formed (step S107). As one example, the opening regulating insulating film 170 is formed by depositing an inorganic insulating material such as silicon oxide over the lower electrode 140, laminating a photosensitive resin over such inorganic insulating material, and patterning the photosensitive resin. Here, the opening regulating insulating film 170 is patterned so that regions including the contact portions 140c of the lower electrode 140 become open.

Next, the light emitting layer 150 is formed (step S109). To realize the wide color reproducibility that is characteristic to an OLED (for example 100% or higher of NTSC), the light emitting layers (light emitting material layers) of the respective colors that construct a pixel may be split into colors for each light emitting element. In the present embodiment, the light emitting layer 150 is split into colors for the red light emitting elements 110R, the green light emitting elements 110G, and the blue light emitting elements 110B by printing or by transfer. Meanwhile, in the other embodiments of the present disclosure described later, the light emitting layer 150 is formed by vapor deposition. In such case, the light emitting layer 150 may be formed so as to be shared by light emitting elements of two or more colors or may be formed across the entire surface of the display region 101 (described in detail later).

Next, the upper electrode 160 (cathode layer) is formed (step S111). To achieve low resistance, the upper electrode 160 may be formed across the entire surface of the display region 101.

As an additional process, a protective layer may be formed over the upper electrode 160 (step S113). The protective layer may be formed, for example, using an inorganic amorphous insulating material. Like the upper electrode, the protective layer may also be formed across the entire surface of the display region.

2. Second Embodiment

Figure 9:
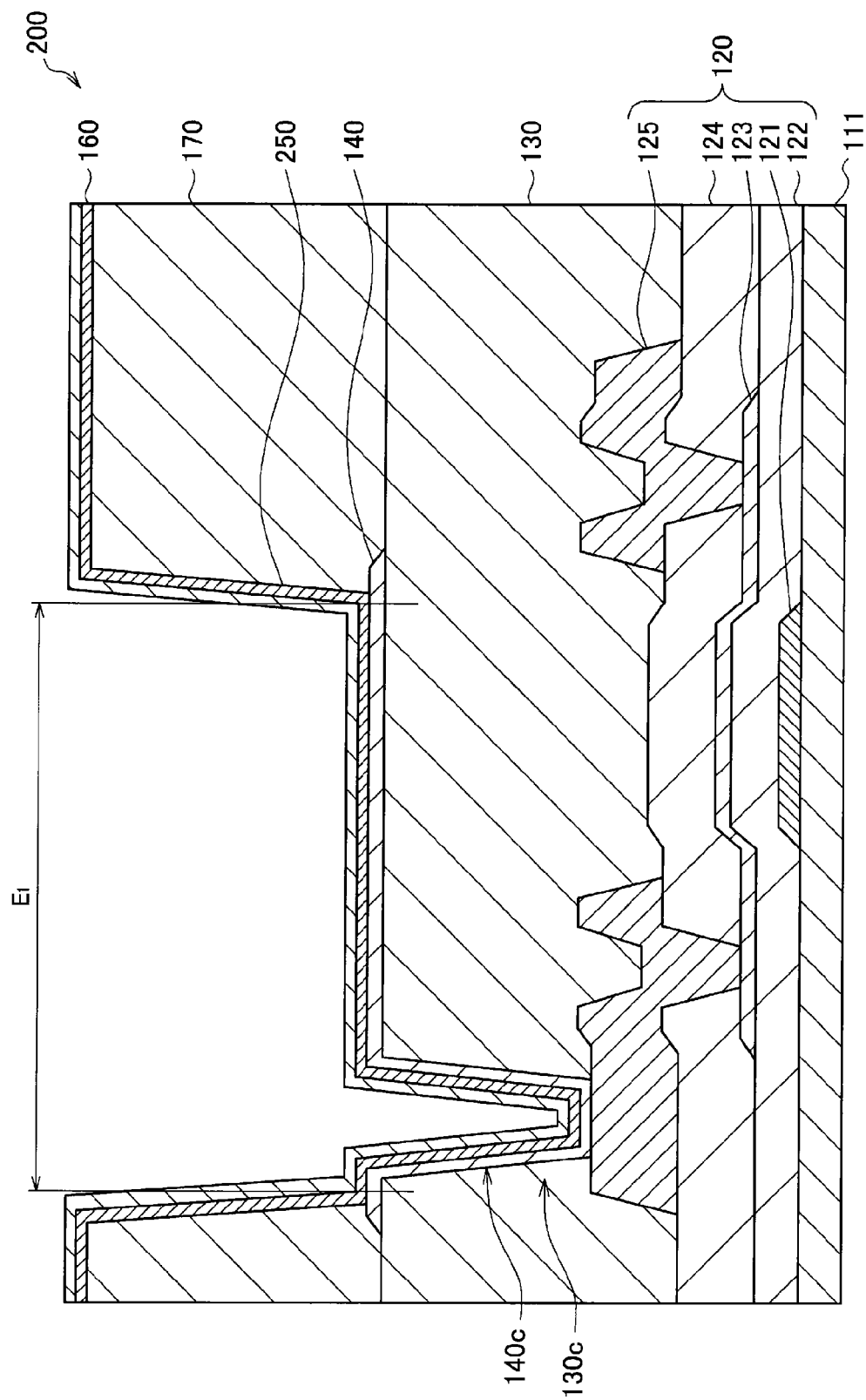
FIG. 9 is a cross-sectional view of a display region of a display apparatus according to a second embodiment of the present disclosure.

Next, a second embodiment of the present disclosure will be described with reference to FIG. 9. FIG. 9 is a cross-sectional view of a display region of a display apparatus according to the second embodiment of the present disclosure. Note that aside from the details described below, the configuration of the present embodiment is the same as the configuration of the first embodiment described above.

As shown in FIG. 9, in an organic EL display 200 that is a display apparatus according to the second embodiment of the present disclosure, a light emitting layer 250 is formed so as to be shared by a plurality of light emitting elements. The respective light emitting elements that share the light emitting layer 250 are provided with color filters (not shown) so that light of the colors corresponding to the respective light emitting elements is outputted out of the light emitted from the light emitting layer 250. Such color filters that are provided here are also used to remove color shifts in the emitted light that are caused by the light emitting layer 250 having a different thickness at the contact portion 140c parts compared to other parts.

Examples of a light emitting layer 250 that is formed so as to be shared include a yellow light emitting layer formed so as to be shared between red (R) and green (G) light emitting elements (yellow (Y) is also possible) and a white light emitting layer formed so as to be shared between red (R), green (G), and blue (B) light emitting elements (white (W) is also possible). In the case of a white light emitting layer, since all of the light emitting elements that construct a pixel use a shared light emitting layer, the light emitting layer 250 is formed across the entire surface of the display region 101.

For example, by forming a shared light emitting layer, it is possible to realize higher resolution than in a case where the light emitting layer is split into colors for each light emitting element. As one example, if the light emitting layer is split into colors for each light emitting element like in the first embodiment, since a resolution of around 200 ppi is the limit for existing metal mask vapor deposition technology, the light emitting layer is formed by printing or transferring when the resolution is 200 ppi or higher.

Meanwhile, if the light emitting layer is split into the two colors blue (B) and yellow (Y), it is possible to manufacture a display apparatus with a resolution of up to around 300 ppi with metal mask vapor deposition technology. Also, if the light emitting layer is formed to have the single color white (W) across the entire surface of the display region 101, it is possible to manufacture a display apparatus with a resolution of up to around 500 ppi with metal mask vapor deposition technology.

Note that variations relating to splitting the light emitting layer into colors and/or the layout of color filters will be described in detail later.

3. Third Embodiment

Figure 10:
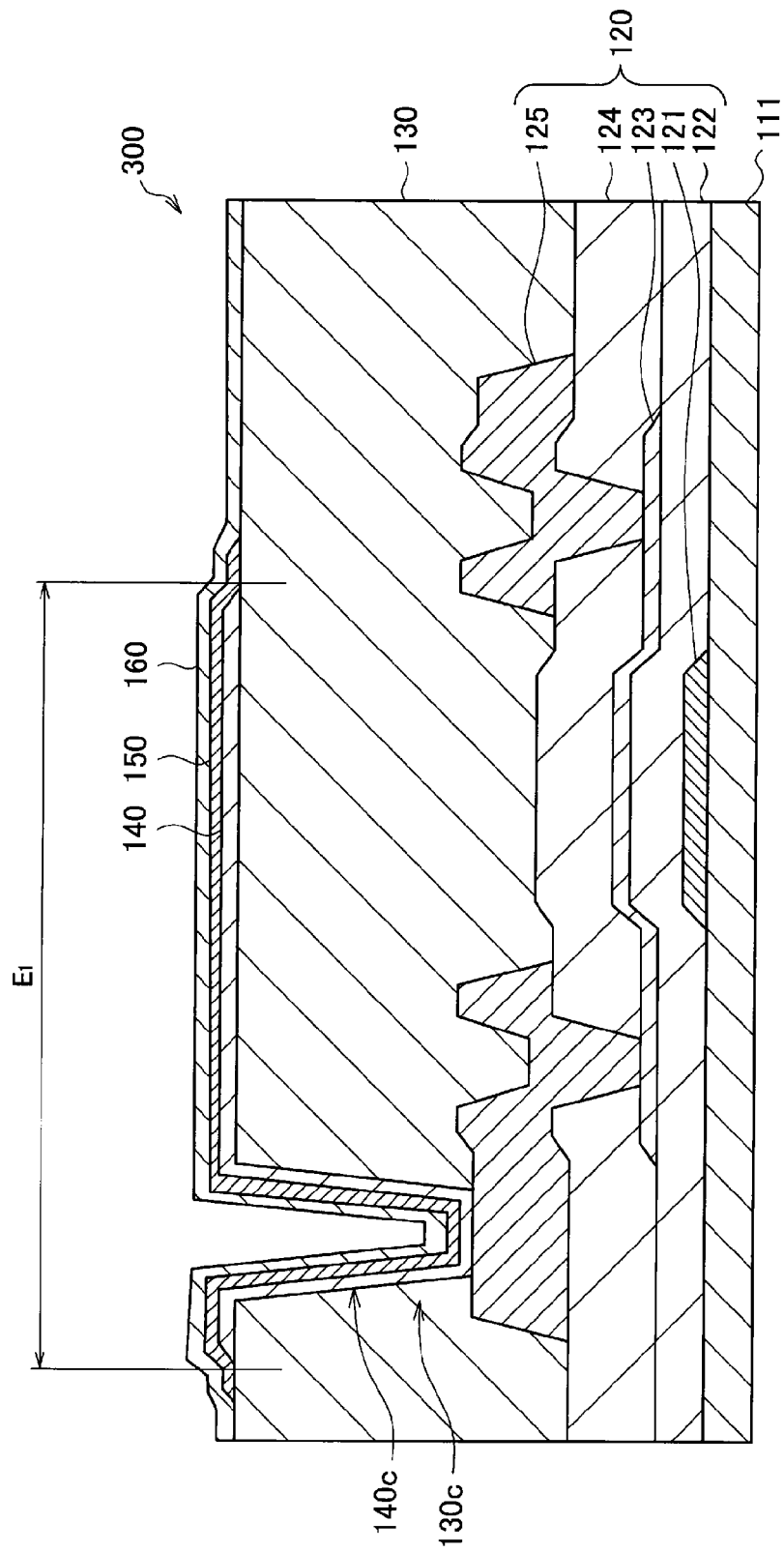
FIG. 10 is a cross-sectional view of a display region of a display apparatus according to a third embodiment of the present disclosure.

Next, a third embodiment of the present disclosure will be described with reference to FIG. 10. FIG. 10 is a cross-sectional view of the display region of a display apparatus according to the third embodiment of the present disclosure. Note that aside from the details described below, the configuration of the present embodiment is the same as the configuration of the first embodiment described above.

As shown in FIG. 10, in an organic EL display 300 that is a display apparatus according to the third embodiment of the present disclosure, the opening regulating insulating film 170 that was provided in the first embodiment is omitted. That is, in the organic EL display 300, the light emitting layer 150 is formed corresponding to the entire lower electrode 140 and the upper electrode 160 is formed over the light emitting layer 150.

Accordingly, in the organic EL display 300, the entire region where the lower electrode 140 is formed is the light emitting region $E_1$ where the light emitting layer 150 is interposed between the lower electrode 140 and the upper electrode 160. That is, in the present embodiment, the light emitting region $E_1$ is regulated by the lower electrode 140.

As one example, if the contact portion 40c is excluded from the light emitting region $E_0$ as in the organic EL display 10 shown in the example in FIG. 1, the opening regulating insulating film 70 is provided since it is necessary to insulate the lower electrode 40 and the upper electrode 60 from each other in the region corresponding to the contact portion 40c. On the other hand, in the organic EL display 300, since the light emitting region $E_1$ includes the contact portion 140c, it is not necessary to insulate the lower electrode 140 and the upper electrode 160 from one another in the entire region where the lower electrode 140 is formed and it is possible to use a simple configuration where the opening regulating insulating film 170 is omitted.

4. Fourth Embodiment

Figure 11:
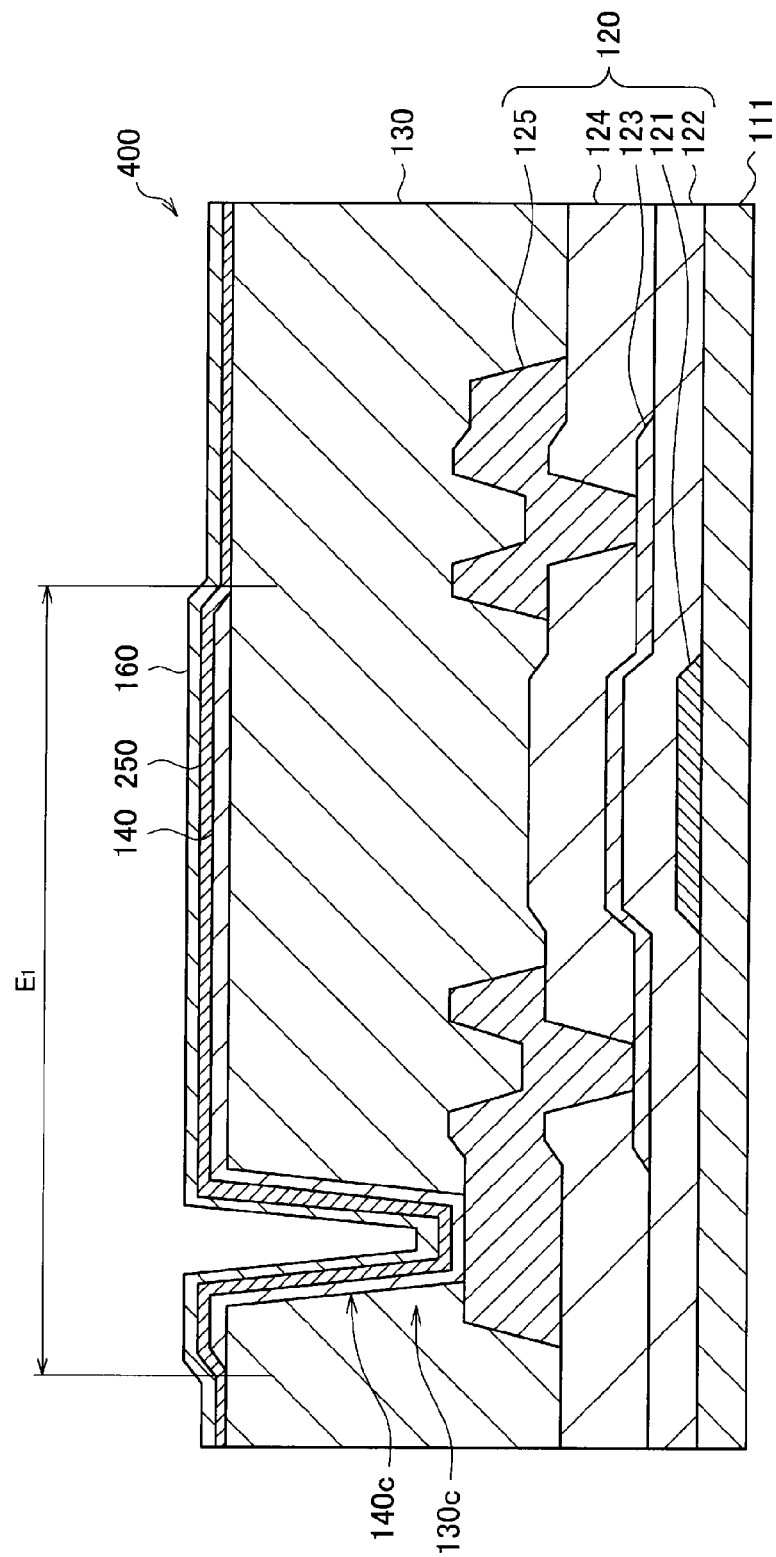
FIG. 11 is a cross-sectional view of a display region of a display apparatus according to a fourth embodiment of the present disclosure.

Next, a fourth embodiment of the present disclosure will be described with reference to FIG. 11. FIG. 11 is a cross-sectional view of the display region of a display apparatus according to the fourth embodiment of the present disclosure. Note that aside from the details described below, the configuration of the present embodiment is the same as the configuration of the first embodiment described above.

As shown in FIG. 11, in an organic EL display 400 that is a display apparatus according to the fourth embodiment of the present disclosure, the light emitting layer 250 is formed so as to be shared between a plurality of light emitting elements. The respective light emitting elements that share the light emitting layer 250 are provided with color filters (not shown) so that light of the colors corresponding to the respective light emitting elements is outputted out of the light emitted from the light emitting layer 250. Such color filters that are provided here are also used to remove color shifts in the emitted light that are caused by the light emitting layer 250 having a different thickness at the contact portion 140c parts compared to other parts.

In addition, the opening regulating insulating film 170 is omitted from the organic EL display 400. That is, in the organic EL display 400, the light emitting layer 150 is formed corresponding to the entire lower electrode 140 and the upper electrode 160 is formed over such light emitting layer 150. Accordingly, in the organic EL display 400, the entire region where the lower electrode 140 is formed is the light emitting region $E_1$ where the light emitting layer 150 is interposed between the lower electrode 140 and the upper electrode 160. That is, in the present embodiment, the light emitting region $E_1$ is regulated by the lower electrode 140.

As should be clear from the above description, the present embodiment is an embodiment in which the shared formation of the light emitting layer in the second embodiment described above and the omission of the opening regulating insulating film in the third embodiment are combined. Accordingly, the respective effects of such embodiments are obtained as the effects of the present embodiment.

5. Variations of Light Emitting Regions-1

Next, variations of the light emitting regions according to the first to fourth embodiments of the present disclosure will be described with reference to FIGS. 12A to 14D as first to third variations. Although the variations of the light emitting region described below are described based on the second embodiment where the light emitting layer 250 is formed so as to be shared and the opening regulating insulating film 170 is provided, such variations can be applied in the same way to the first embodiment. Such variations aside from the second variation can also be applied to the third and fourth embodiments.

Note that in the diagrams referenced by the following description, the configuration of the organic EL display is simplified and only the wiring pattern 125, the smoothing insulating film 130, the lower electrode 140, the light emitting layer 250, the upper electrode 160, and the opening regulating insulating film 170 are shown.

Figure 12A:
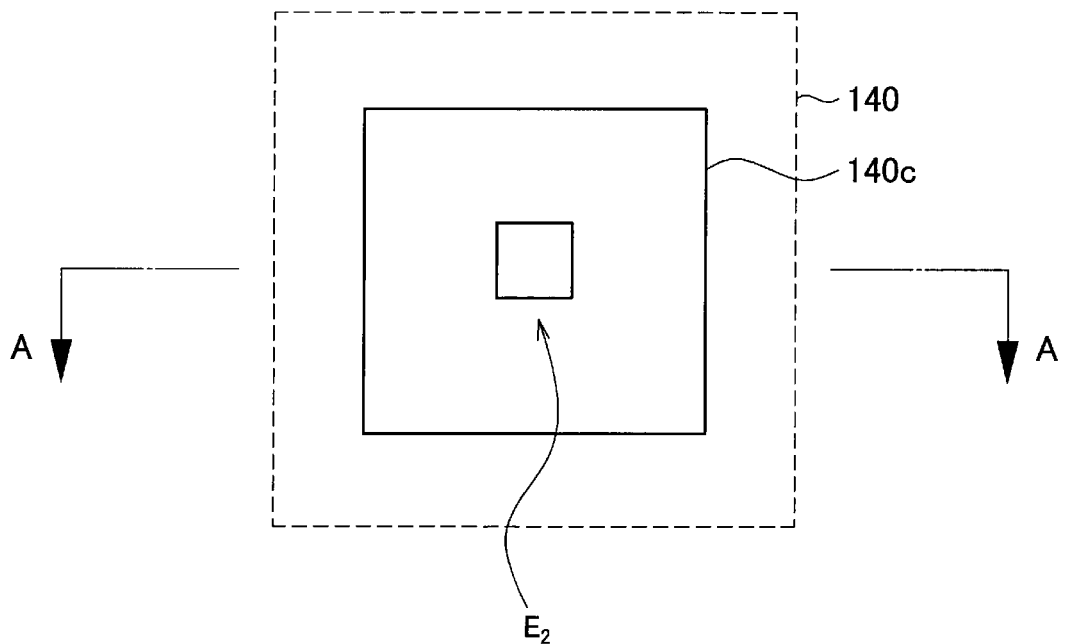
FIG. 12A is a plan view showing a first variation of a light emitting region.
Figure 12B:
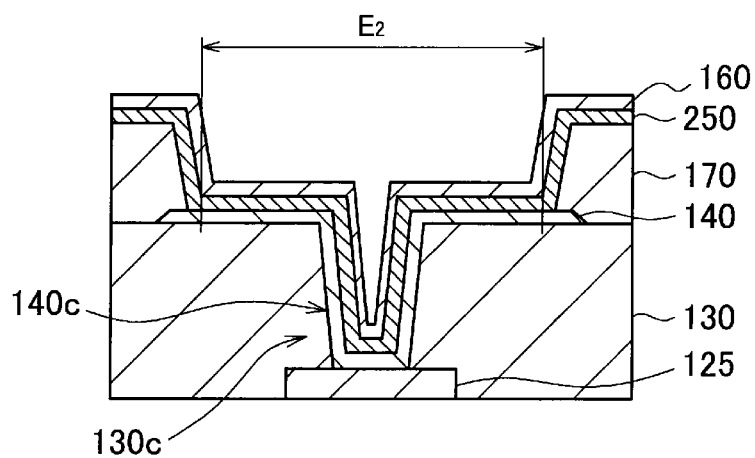
FIG. 12B is a cross-sectional view taken along a line A-A in FIG. 12A.

FIG. 12A is a plan view showing the first variation of the light emitting region. FIG. 12B is a cross-sectional view taken along the line A-A in FIG. 12A. In this example variation, a light emitting region $E_2$ is integrally formed for one light emitting element. One contact hole 130c is formed in the smoothing insulating film 130 and the lower electrode 140 has one contact portion 140c that is inserted through such contact hole 130c. The contact portion 140c may be positioned at or near the center of the light emitting region $E_2$ as shown in FIG. 12, or may be positioned in a peripheral part of the light emitting region as shown in FIG. 7.

Figure 13A:
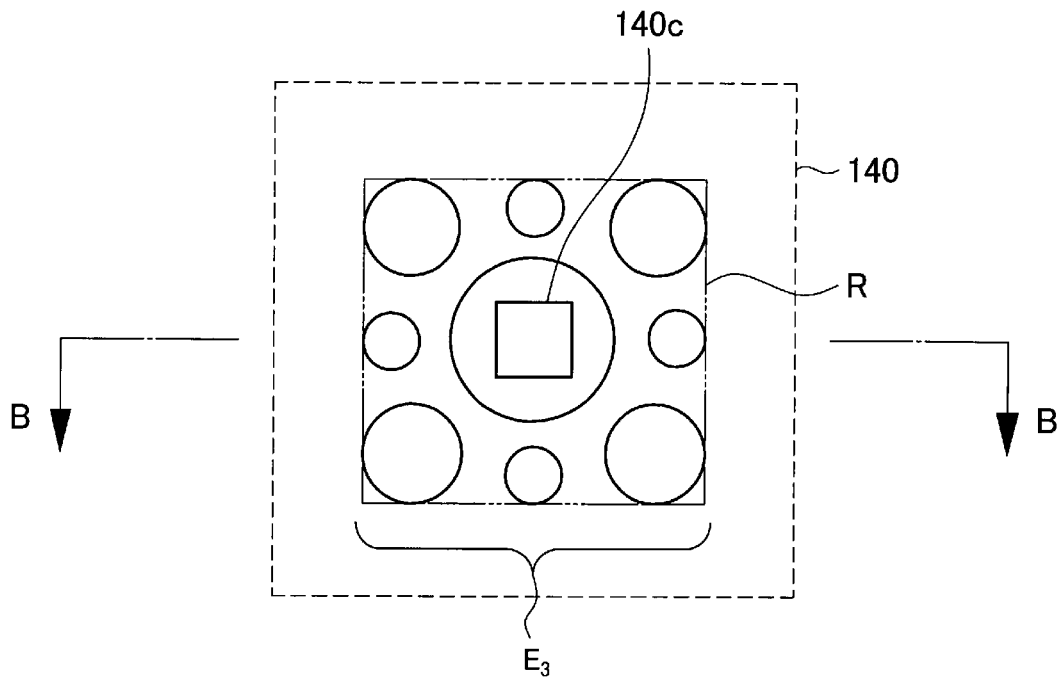
FIG. 13A is a plan view showing a second variation of the light emitting region.
Figure 13B:
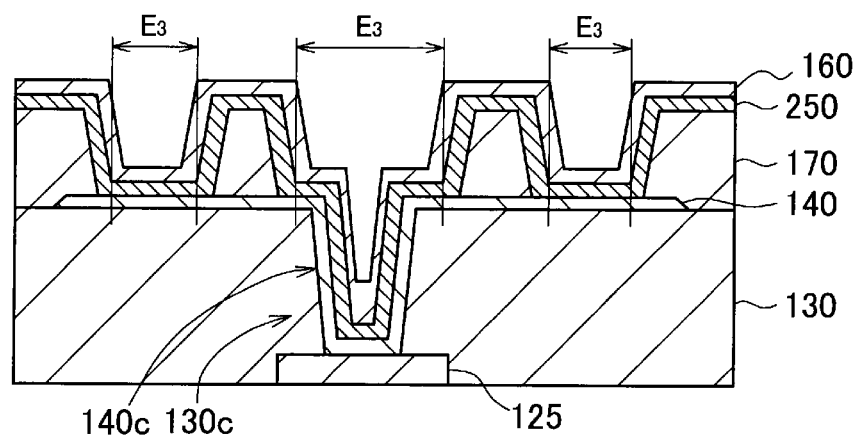
FIG. 13B is a cross-sectional view taken along a line B-B in FIG. 13A.

FIG. 13A is a plan view showing the second variation of the light emitting region. FIG. 13B is a cross-sectional view taken along the line B-B in FIG. 13A. In this example, a light emitting region $E_3$ that is split into a plurality of parts is formed for one light emitting element. The light emitting regions $E_3$ can use a technology such as that disclosed in JP 2008-218296A for example, and be regions that are designed to maximize the effect of total reflection by the lower electrode 140 formed on side surfaces of the openings in the opening regulating insulating film 170.

With the technology described above, to maximize the effect of total reflection, it is desirable for the openings that form the light emitting regions to be a certain size or smaller. As one example, it is desirable for the size of the openings, that is, the cross-sectional area of the respective light emitting regions, to be around 5 micrometers. Also, since it is desirable for the side surfaces of the openings to be a paraboloid of revolution, the cross-sectional form of the respective light emitting regions is circular. Accordingly, the light emitting region $E_3$ is a group of circular light emitting regions with a specified cross-sectional area or smaller.

Here also, since it is preferable for the light emitting area to be large, as one example it is desirable for the respective light emitting regions that construct the light emitting region $E_3$ to fill a predetermined region R corresponding to a light emitting element with the highest possible density. In the embodiments of the present disclosure, since it is possible to include a region corresponding to the contact portion 140c of the lower electrode 140 in the light emitting region $E_3$, it is possible to lay out the respective light emitting regions with an arbitrary filling pattern, making it possible to obtain the effect due to the reflective surface and also to increase the proportion of the display region occupied by the light emitting regions.

Figure 14A:
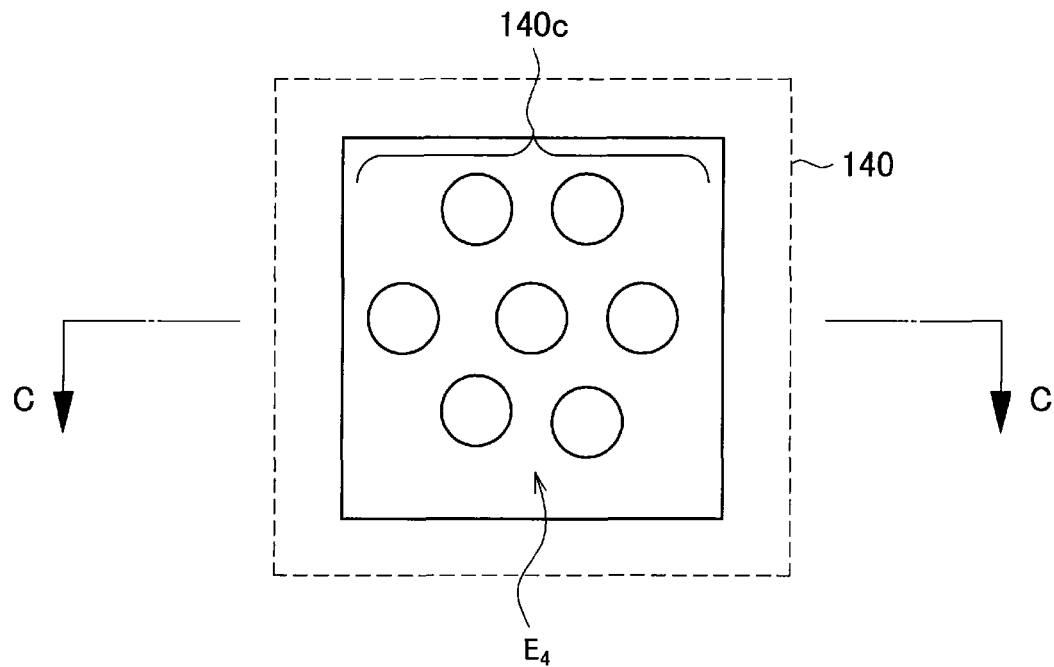
FIG. 14A is a plan view showing a third variation of the light emitting region.
Figure 14B:
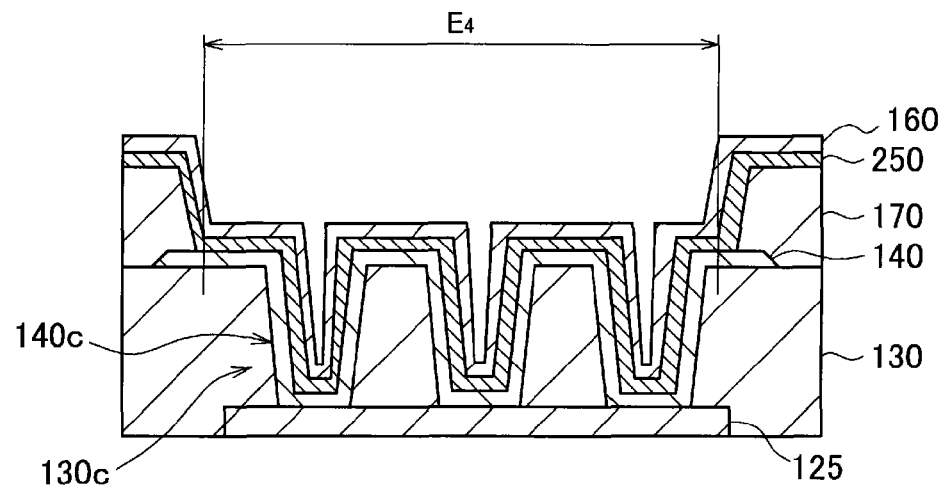
FIG. 14B is a first example of a cross-sectional view taken along a line C-C in FIG. 14A.

FIG. 14A is a plan view showing the third variation of the light emitting region. FIG. 14B is a first example of a cross-sectional view taken along the line C-C in FIG. 14A. In this example, a light emitting region $E_4$ is integrally formed for one light emitting element. As a difference to the first variation, a plurality of contact holes 130c (in the illustrated example, seven) are formed in the smoothing insulating film 130 and the lower electrode 140 has the same number (in the illustrated example, seven) of contact portions 140c that are inserted through such contact holes 130c. Note that the positions of the contact portions 140c are not limited to the illustrated example and may be set arbitrarily.

In this example, the respective contact portions 140c are designed so as to achieve a reflective effect at the side surfaces formed by the lower electrode 140. That is, parts corresponding to the concave mirror portions in JP 2008-218296A are formed by the lower electrode 140 on the side surfaces of the contact portions 140c. For this reason, a plurality of contact portions 140c whose cross-sectional form is circular are laid out in the light emitting region $E_4$. Note that the cross-sectional form of the light emitting region $E_4$ is not limited to rectangular as in the illustrated example and may be another shape, such as hexagonal, that facilitates filling with circular contact portions 140c.

Figure 14C:
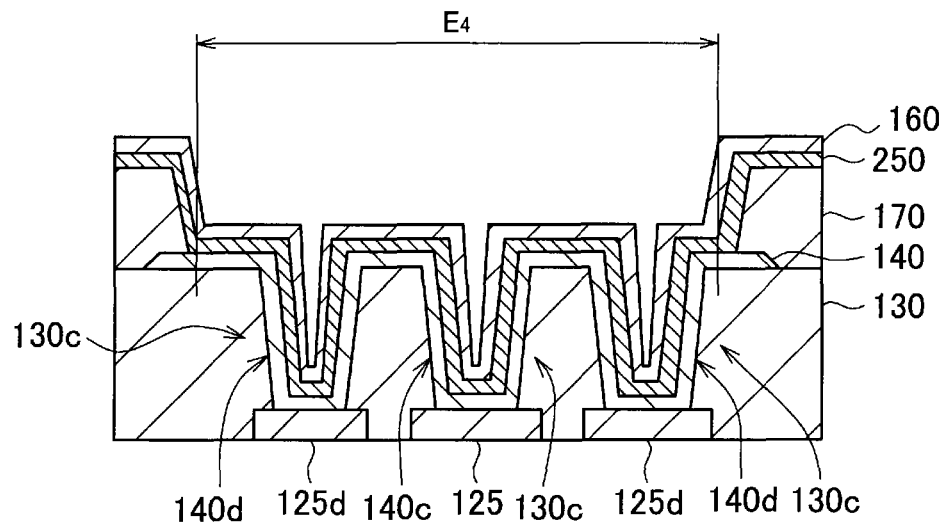
FIG. 14C is a second example of a cross-sectional view taken along the line C-C in FIG. 14A.

FIG. 14C is a second example of a cross-sectional view taken along the line C-C in FIG. 14A. The difference with the first example is that the wiring pattern 125 to which the respective contact portions 140c are connected is split into a plurality of parts for each contact portion 140c. Such wiring patterns 125 may all be connected to the pixel driving circuit of the TFT layer 120 or may include patterns that are not connected to the pixel driving circuit. A wiring pattern that is not connected to the pixel driving circuit is hereinafter referred to as a "dummy wiring pattern 125d". Note that in the case where the dummy wiring patterns 125d are formed of a conductive material, since the dummy wiring patterns 125d are connected to the lower electrode 140, the wiring pattern 125, the lower electrode 140, and the dummy wiring patterns 125d will all be at the same potential. As one example, the dummy wiring patterns 125d may be formed in the same way as the wiring pattern 125 using a metal material such as Ti/Al/Ti.

Meanwhile, although a part of the lower electrode 140 connected to a dummy wiring pattern 125d has the same shape as a contact portion 140c, the function differs in that such part is not electrically connected to the pixel driving circuit. Such parts are hereinafter referred to as "dummy contact portions 140d". Regarding the electrical connection to the pixel driving circuit, it is sufficient for the lower electrode 140 to include one contact portion 140c. Accordingly, it is possible to set other parts that are provided to achieve a reflective effect as dummy contact portions 140d.

If the dummy contact portions 140d are provided, a larger number of contact holes 130c than the number of contact portions 140c are formed in the smoothing insulating film 130. The contact portions 140c are inserted through some of the contact holes 130c and the dummy contact portions 140d are inserted through the remaining contact holes 130c.

Figure 14D:
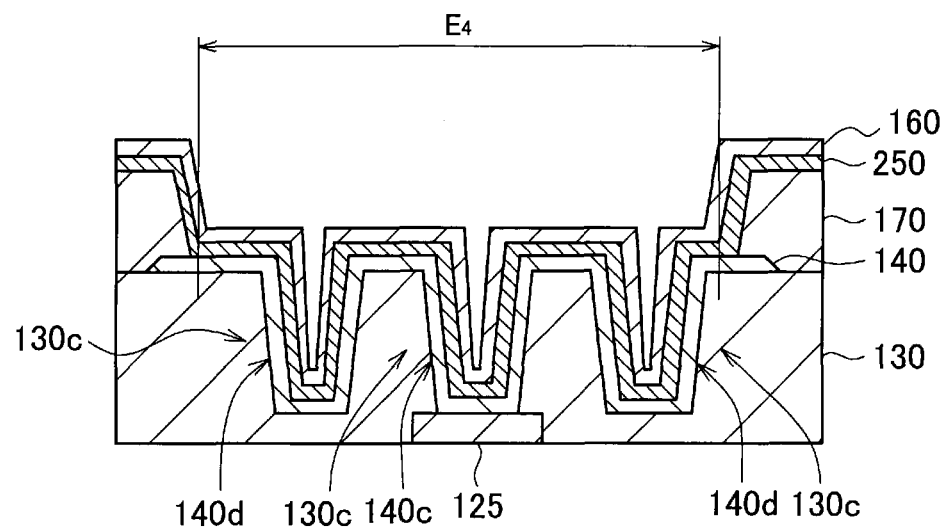
FIG. 14D is a third example of a cross-sectional view taken along the line C-C in FIG. 14A.

FIG. 14D is a third example of a cross-sectional view taken along the line C-C in FIG. 14A. Here, dummy wiring patterns 125d are not provided at parts corresponding to dummy contact portions 140d. Since the dummy contact portions 140d are not electrically connected to the pixel driving circuit, the dummy wiring patterns 125d corresponding to the dummy contact portions 140d are not necessarily provided. However, providing the dummy wiring patterns 125d in the smoothing insulating film 130 makes it easier to process the contact holes 130c by patterning.

6. Fifth Embodiment

Figure 15:
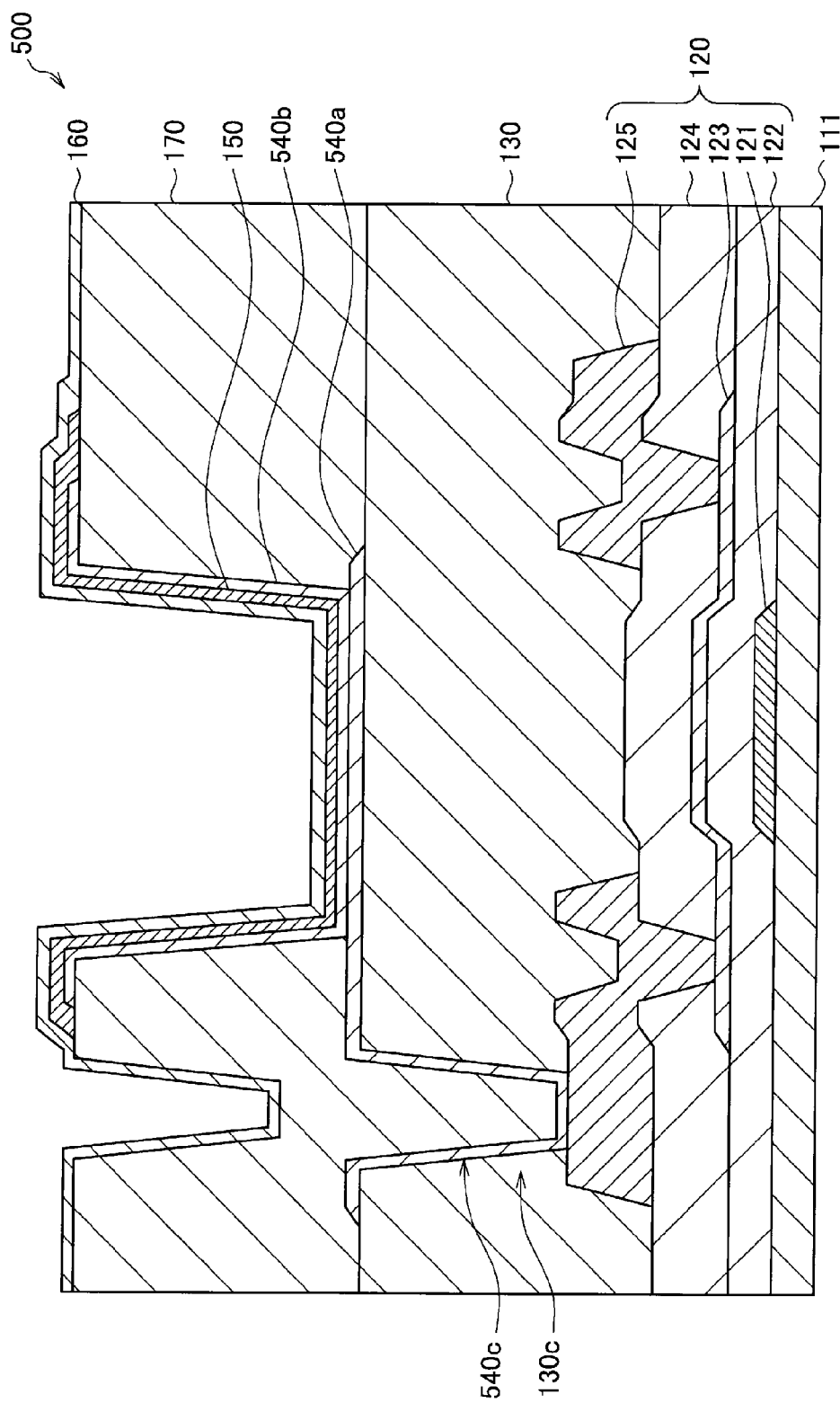
FIG. 15 is a cross-sectional view of a display region of a display apparatus according to a fifth embodiment of the present disclosure.

Next, a fifth embodiment of the present disclosure will be described with reference to FIG. 15. FIG. 15 is a cross-sectional view of the display region of a display apparatus according to the fifth embodiment of the present disclosure. Note that aside from the details described below, the configuration of the present embodiment is the same as the configuration of the first embodiment described above.

As shown in FIG. 15, in the organic EL display 500 that is a display apparatus according to the fifth embodiment of the present disclosure, a lower electrode 540 is erected along a side surface of an opening in the opening regulating insulating film 170 and reaches the upper surface of the opening regulating insulating film 170. In the illustrated example, a first lower electrode 540a has a contact portion 540c that is the same shape as the lower electrode 140 of the first embodiment and is electrically connected to the wiring pattern 125 of the TFT layer 120 and a second lower electrode 540b that is electrically connected to the first lower electrode 540a and is erected along the side surfaces of the opening regulating insulating film 170.

In this case, since the first lower electrode 540a has a function for electrically connecting the wiring pattern 125 and the second lower electrode 540b, the first lower electrode 540a can be formed in the same way as the wiring pattern 125 of various metals such as Al, Mo, and Cu. Meanwhile, since the second lower electrode 540b faces the light emitting layer 150, it is desirable for the second lower electrode 540b to be formed of a highly reflective metal material. The second lower electrode 540b should preferably be formed of Ag, Al alloy, Ag alloy, or the like.

In the organic EL display 500 according to the present embodiment, as disclosed for example in Japanese Laid-Open Patent Publication Nos. 2007-171828, 2012-088724, and 2012-088725, if a pixel driving circuit is formed in the TFT layer 120 so that the light emitting element functions as a capacitive element in a reverse bias, the capacity of the capacitive element can be increased by increasing the area where the light emitting layer 150 is interposed between the lower electrode 540 and the upper electrode 160. Also, since a trench capacitor is constructed on the side surfaces of the opening in the opening regulating insulating film 170, the capacity as a capacitor is increased by the increase in simple area or more. If the capacity when the light emitting element functions as a capacitive element increases, it is possible to increase the driving margin as a DOC circuit (Drop Out Compensation circuit) for example.

Such advantage regarding the capacity as a capacitor is not limited to when the organic EL display 500 is a top-emission type display. As one example, the organic EL display 500 may be a bottom-emission type display where the lower electrode 540 (anode) is a transparent electrode made using ITO or the like and the light from the light emitting element is outputted from the substrate 111 side.

Also, in the organic EL display 500, by increasing the area where the light emitting layer 150 is interposed between the lower electrode 540 and the upper electrode 160, the light emission aperture ratio of a light emitting element also increases. If the light emission aperture ratio increases, as one example since the current density of the light emitting element falls, improvements in working life and resistance to burn can be expected.

Note that in the present embodiment, the decision whether to include the contact portion 540c of the lower electrode 540 in the light emitting region regulated by the opening formed in the opening regulating insulating film 170 is arbitrary. Like the example shown in FIG. 15, the light emitting region does not necessarily include the contact portion 540c.

7. Sixth Embodiment

Figure 16:
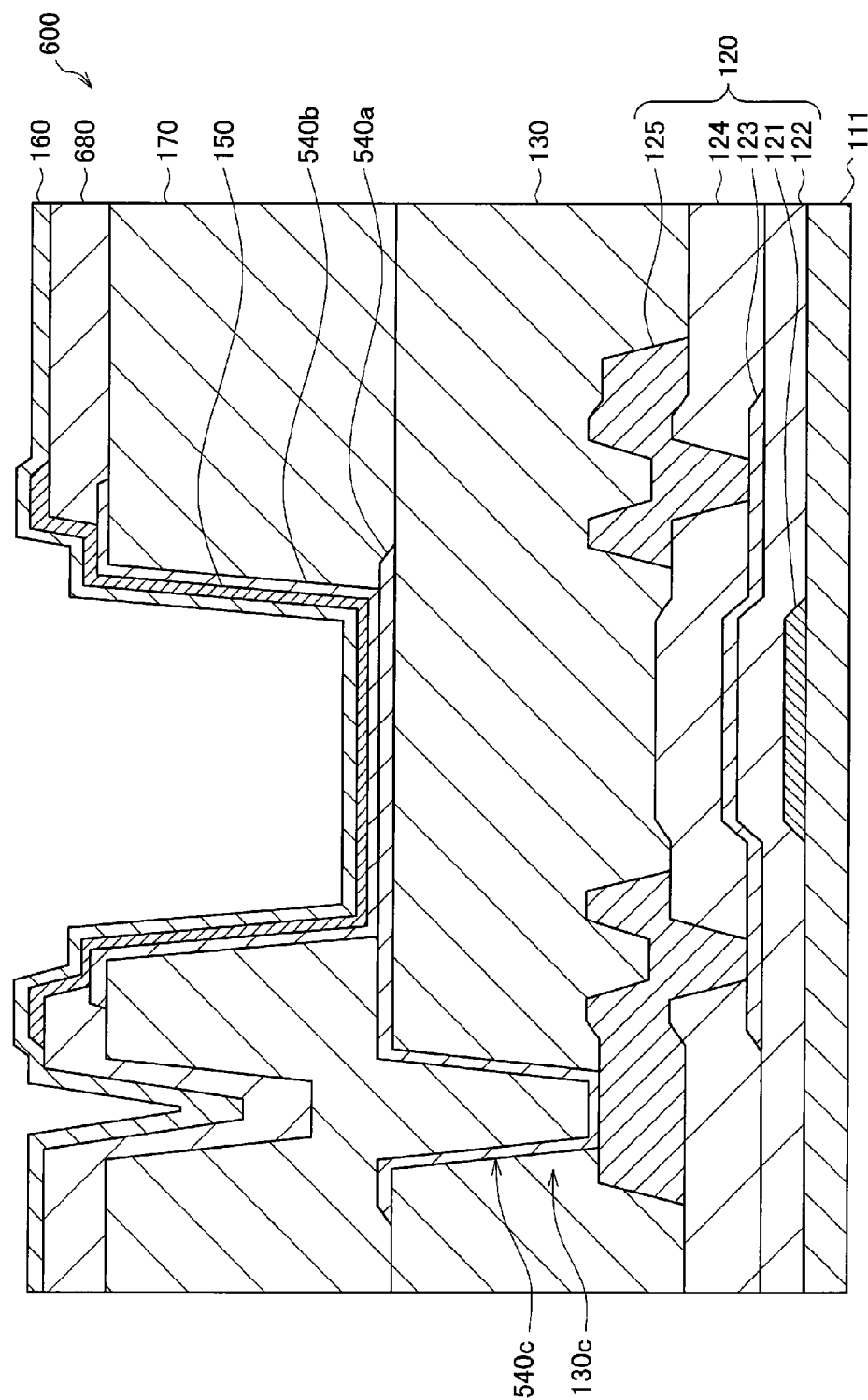
FIG. 16 is a cross-sectional view of a display region of a display apparatus according to a sixth embodiment of the present disclosure.

Next, a sixth embodiment of the present disclosure will be described with reference to FIGS. 16 and 17. FIG. 16 is a cross-sectional view of a display region of a display apparatus according to the sixth embodiment of the present disclosure. Note that aside from the details described below, the configuration of the present embodiment is the same as the configuration of the first embodiment described above.

As shown in FIG. 16, in an organic EL display 600 that is a display apparatus according to the sixth embodiment of the present disclosure, an additional insulating film 680 is provided over the opening regulating insulating film 170. The additional insulating film 680 is provided so as to cover the lower electrode 540 (in the illustrated example, the second lower electrode 540b) over the opening regulating insulating film 170 and has an opening formed so as to include the opening in the opening regulating insulating film 170. However, the opening in the additional insulating film 680 does not include end portions of the lower electrode 540 over the opening regulating insulating film 170. That is, the additional insulating film 680 ensures that a region corresponding to at least the opening in the opening regulating insulating film 170 is open and covers the end portions of the lower electrode 540 over the opening regulating insulating film 170.

Although the lower electrode 540 may be formed by patterning in the same way as the lower electrode 140 of the first embodiment described above, in such case the form of the end portions will often be irregular. As one example, if sharp protrusions have been formed in the end portions of the lower electrode 540, the light emitting layer 150 is formed over the lower electrode 540 in such state, and then the upper electrode 160 is also formed over the light emitting layer 150, there is the risk of the protrusions passing through the light emitting layer 150 and contacting the upper electrode 160 which can cause a short circuit. For this reason, in the present embodiment, the additional insulating film 680 is formed so as to cover the end portions of the lower electrode 540 and by separating the light emitting layer 150 and the upper electrode 160 from the end portions of the lower electrode 540, the occurrence of short circuits is prevented.

Figure 17:
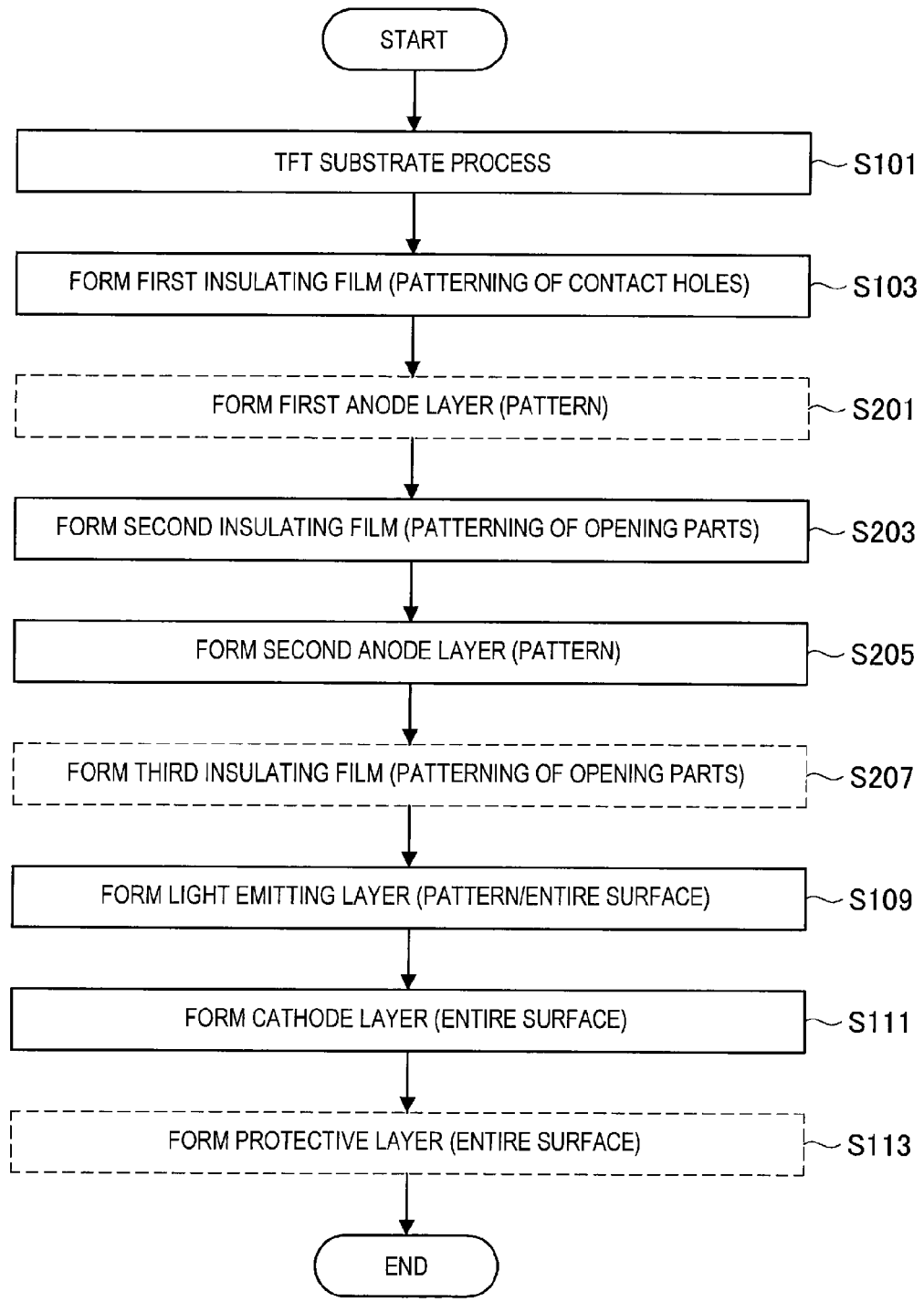
FIG. 17 is a flowchart showing a method of manufacturing the display apparatus according to the fifth or sixth embodiment of the present disclosure.

FIG. 17 is a flowchart showing the method of manufacturing the display apparatus according to the fifth or sixth embodiment of the present disclosure. Note that processes that are the same as in the method of manufacturing shown in FIG. 8 have been assigned the same reference numerals and detailed description thereof is omitted. As shown in FIG. 17, in this method of manufacturing an organic EL display, first a TFT substrate process is carried out (step S101). Next, the smoothing insulating film 130 (first insulating film) is formed (step S103). The contact holes 130c are formed in the smoothing insulating film 130 by patterning.

Next, the first lower electrode 540a (first anode layer) is formed (step S201). The first lower electrode 540a may be patterned into a shape corresponding to the respective light emitting elements. Note that as described later, if the regions of the openings in the opening regulating insulating film 170 include the contact portions 540c of the lower electrode 540, the lower electrode 540 may be integrally formed. In such case, the formation process in step S201 is omitted.

Next, the opening regulating insulating film 170 (second insulating film) is formed (step S203). As one example, the opening regulating insulating film 170 is formed by depositing an inorganic insulating material such as silicon oxide over the lower electrode 540, laminating a photosensitive resin on such inorganic insulating material, and patterning the photosensitive resin. Here, the decision whether to pattern the regions including the contact portions 540c of the lower electrode 540 as openings or whether to pattern regions not including the contact portions 540c as openings when patterning the opening regulating insulating film 170 is arbitrary.

Next, the second lower electrode 540b (second anode layer) is formed (step S205). The second lower electrode 540b may be patterned into a shape corresponding to the respective light emitting elements. As described above, if the regions of the openings in the opening regulating insulating film 170 include the contact portions 540c, the lower electrode 540 may be integrally formed in the formation process in step S205.

Next, in the sixth embodiment, the additional insulating film 680 (third insulating film) is formed (step S207). The additional insulating film 680 may be formed using the same material as the opening regulating insulating film 170, for example. As one example, the additional insulating film 680 is formed by depositing an inorganic insulating material such as silicon oxide over the opening regulating insulating film 170 and the lower electrode 540, laminating a photosensitive resin over the inorganic insulating material, and patterning the photosensitive resin. Here, the additional insulating film 680 is patterned so that regions including the openings provided in the opening regulating insulating film 170 become openings. Note that in the fifth embodiment, this formation process in step S207 is omitted.

Next, the light emitting layer 150 is formed (step S109) and the upper electrode 160 (cathode layer) is further formed (step S111). As an additional process, a protective layer may be formed over the upper electrode 160 (step S113).

8. Variations of Light Emitting Regions-2

Next, variations to the light emitting regions according to the fifth and sixth embodiments of the present disclosure will be described above with reference to FIGS. 18A to 26B as fourth to eighth variations. Although the variations to the light emitting region described below are described based on a modification to the fifth embodiment described above where the light emitting layer 250 is formed so as to be shared, such variations can be applied in the same way to the fifth and sixth embodiments that have not been modified.

Note that in the diagrams referenced by the following description, the configuration of the organic EL display is simplified and only the wiring pattern 125, the smoothing insulating film 130, the lower electrode 540, the light emitting layer 250, the upper electrode 160, the opening regulating insulating film 170, and the additional insulating film 680 are shown.

Figure 18A:
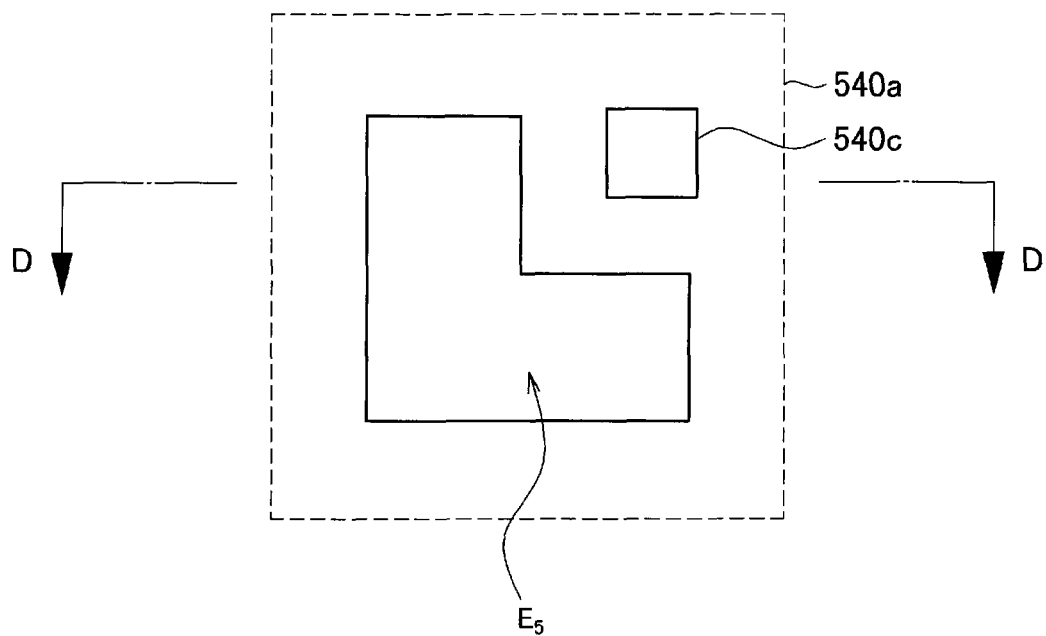
FIG. 18A is a plan view showing a fourth variation of the light emitting region.
Figure 18B:
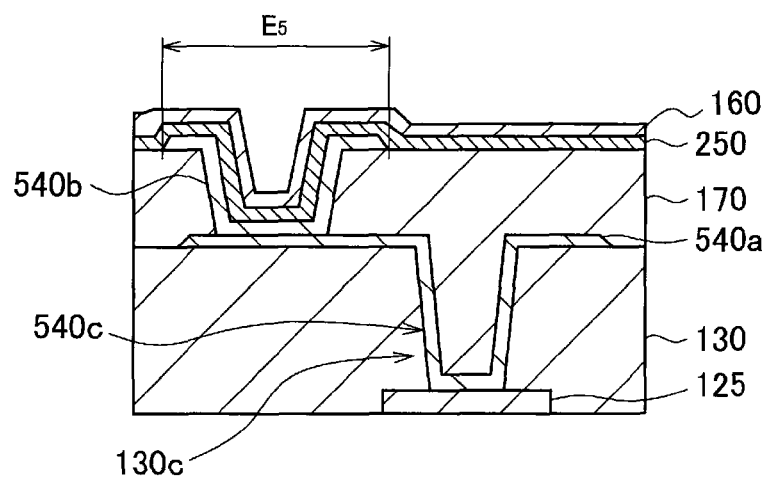
FIG. 18B is a cross-sectional view taken along a line D-D in FIG. 18A.

FIG. 18A is a plan view showing the fourth variation of the light emitting region. FIG. 18B is a cross-sectional view taken along the line D-D in FIG. 18A. The configuration of the illustrated example variation is the same as the configuration of the fifth embodiment described above with reference to FIG. 15, and the light emitting region $E_5$ is formed so as to not include the contact portion 540c of the first lower electrode 540a.

Figure 19:
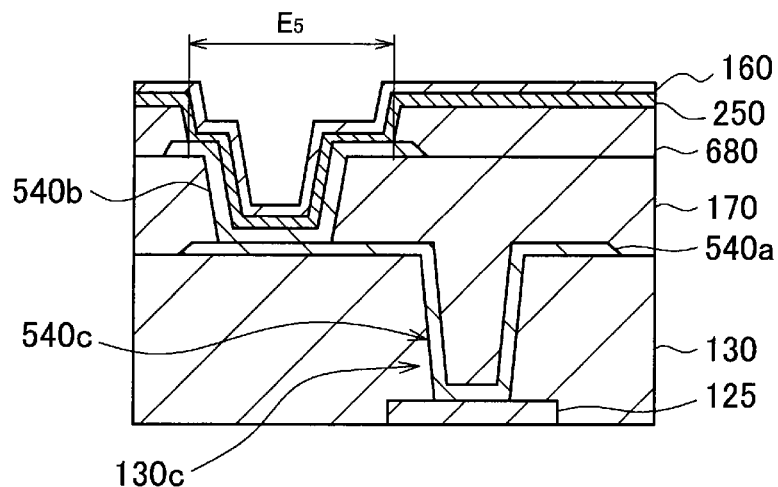
FIG. 19 is a cross-sectional view showing a case where an additional insulating film is provided in the fourth variation of the light emitting region.

FIG. 19 is a cross-sectional view showing a case where an additional insulating film is provided in the fourth variation of the light emitting region. The configuration of the illustrated example is the same configuration as the sixth embodiment described above with reference to FIG. 16 and the light emitting region $E_5$ is formed so as to not include the contact portion 540c of the first lower electrode 540a. The additional insulating film 680 is formed between the end portions of the second lower electrode 540b and the light emitting layer 150.

Figure 20A:
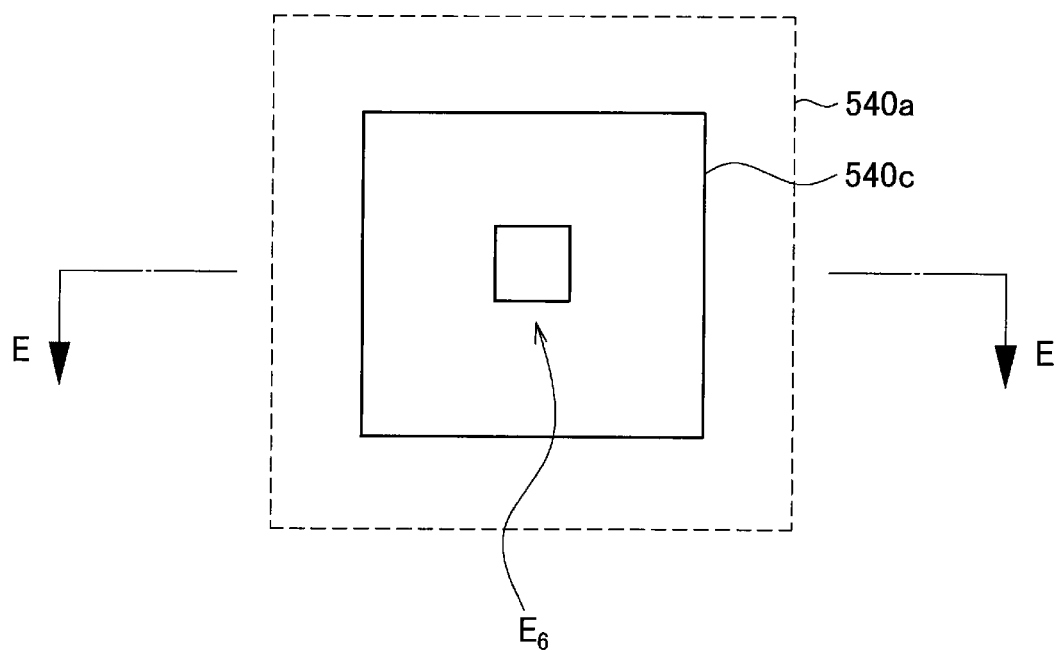
FIG. 20A is a plan view showing a fifth variation of the light emitting region.
Figure 20B:
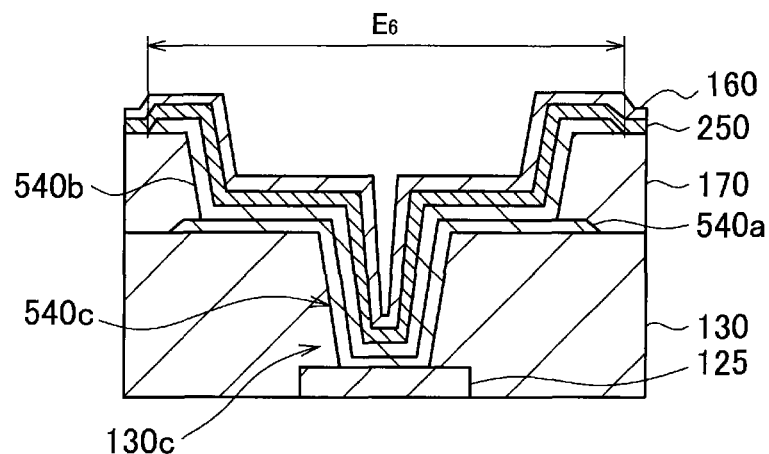
FIG. 20B is a cross-sectional view taken along a line E-E in FIG. 20A.

FIG. 20A is a plan view showing the fifth variation of the light emitting region. FIG. 20B is a cross-sectional view taken along the line E-E in FIG. 20A. In this example, the light emitting region $E_6$ is integrally formed for one light emitting element. One contact hole 130c is formed in the smoothing insulating film 130 and the first lower electrode 540a has one contact portion 540c inserted through such contact hole 130c. The contact portion 540c is included in the light emitting region $E_6$. The contact portion 540c may be positioned at or near the center of the light emitting region $E_6$ as shown in the drawing or may be positioned in a peripheral part of the light emitting region $E_6$.

Figure 21:
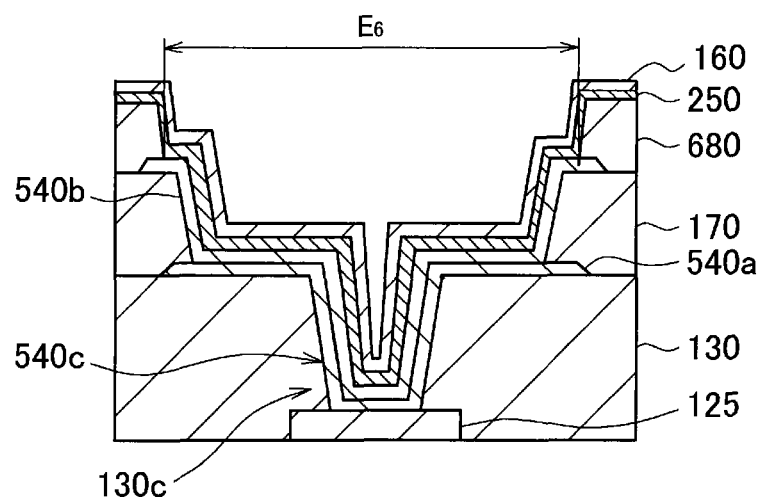
FIG. 21 is a cross-sectional view showing a case where an additional insulating film is provided in the fifth variation of the light emitting region.

FIG. 21 is a cross-sectional view showing a case where an additional insulating film is provided for the fifth variation of the light emitting region. In the configuration of the illustrated example, the contact portion 540c of the first lower electrode 540a is included in the light emitting region $E_6$ and the additional insulating film 680 is formed between the end portions of the second lower electrode 540b and the light emitting layer 150.

Figure 22A:
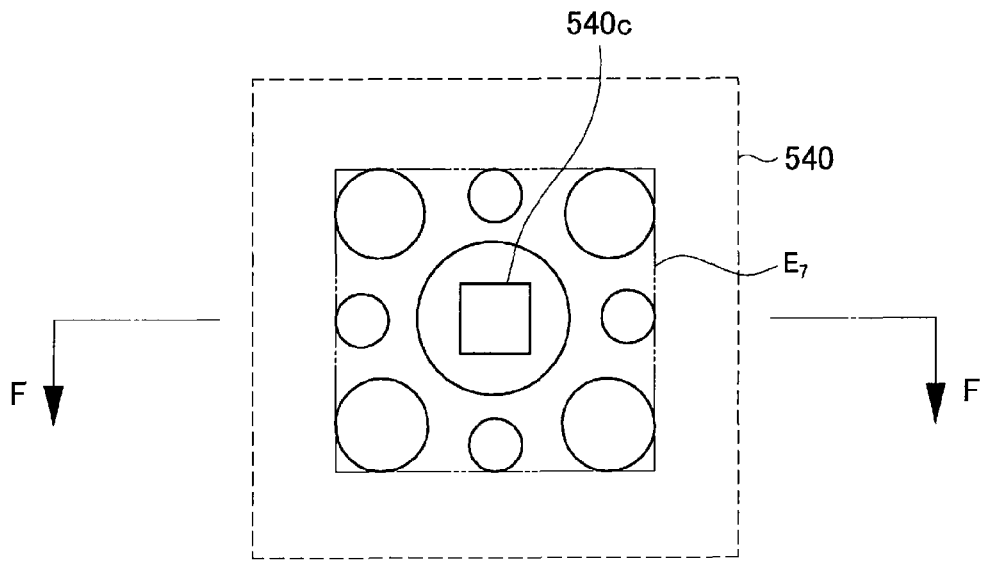
FIG. 22A is a plan view showing a sixth variation of the light emitting region.
Figure 22B:
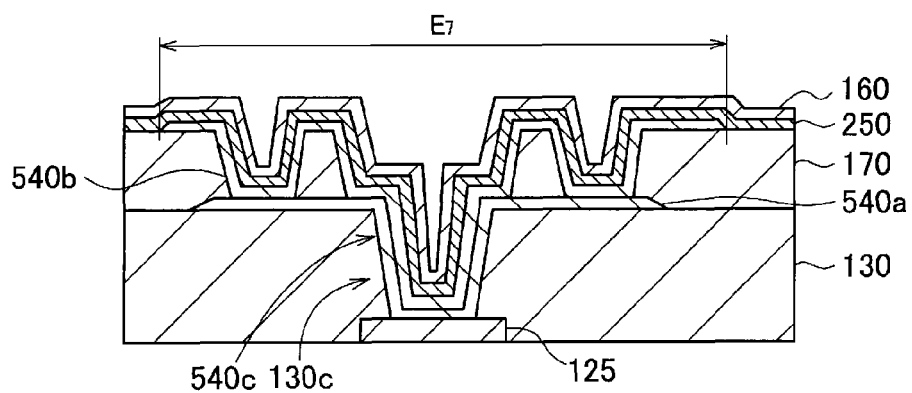
FIG. 22B is a cross-sectional view taken along a line F-F in FIG. 22A.

FIG. 22A is a plan view showing the sixth variation of the light emitting region. FIG. 22B is a cross-sectional view taken along the line F-F in FIG. 22A. In this example, a light emitting region $E_7$ including a cavity part divided into a plurality of parts is formed for one light emitting element. The light emitting region $E_7$ may be a region designed to maximize the effect of total reflection by the second lower electrode 540b formed on the side surfaces of the openings in the opening regulating insulating film 170 using the technology disclosed in JP 2008-218296A, for example. Since the difference with the second variation described above is that the second lower electrode 540b is also formed over the opening regulating insulating film 170, an integral light emitting region is formed instead of light emitting regions where the respective cavity parts are separated.

With the technology described above, to maximize the effect of total reflection, it is desirable for the openings that form the light emitting regions to be a certain size or smaller. As one example, it is desirable for the size of the openings, that is, the cross-sectional area of the respective cavity parts, to be around 5 micrometers. Also, since it is desirable for the side surfaces of the openings to be a paraboloid of revolution, the cross-sectional form of the respective cavity parts is circular. Accordingly, the light emitting region $E_7$ is a group of circular light emitting regions with a specified cross-sectional area or smaller.

Here, since it is also preferable for the light emission area to be large, as one example it is desirable for the respective cavity parts included in a light emitting region $E_7$ to fill the region with the highest possible density. In the embodiments of the present disclosure, since it is possible to include a region corresponding to the contact portion 540c of the lower electrode 540 in the light emitting region $E_7$, it is possible to lay out the respective cavity parts with an arbitrary filling pattern, making it possible to maximize the effect due to the reflective surface.

Figure 23:
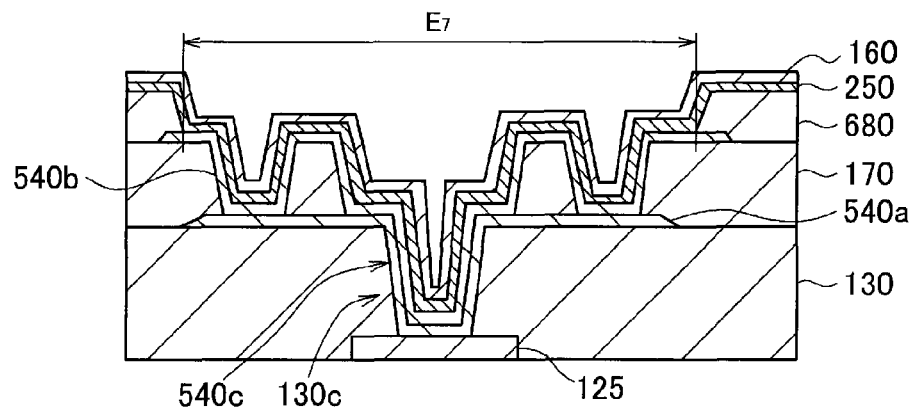
FIG. 23 is a cross-sectional view showing a case where an additional insulating film is provided in the sixth variation of the light emitting region.

FIG. 23 is a cross-sectional view showing a case where an additional insulating film is provided in the sixth variation of the light emitting region. In the configuration of the illustrated example, the light emitting region $E_7$ includes the cavity part split into a plurality of parts and the additional insulating film 680 is formed between the end portions of the second lower electrode 540b and the light emitting layer 150.

Figure 24A:
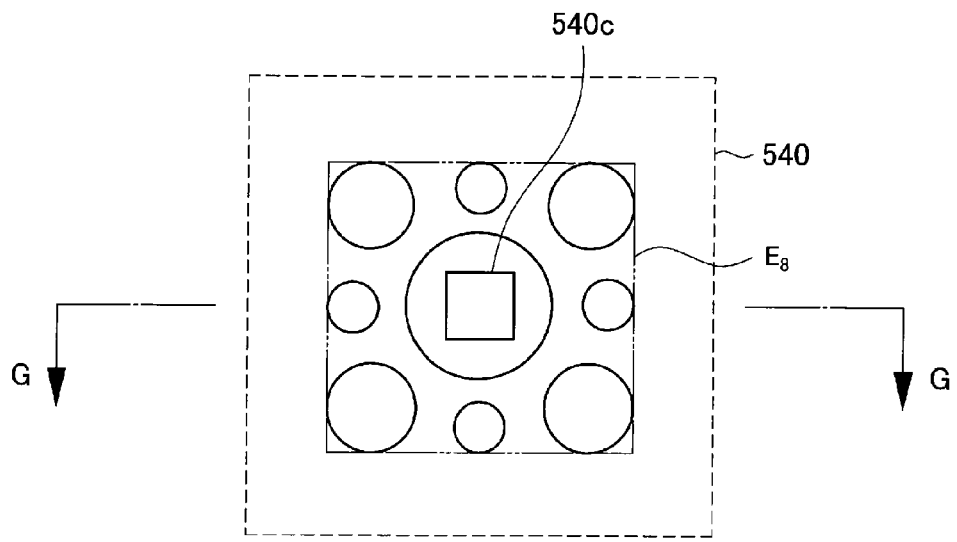
FIG. 24A is a plan view showing a seventh variation of the light emitting region.
Figure 24B:
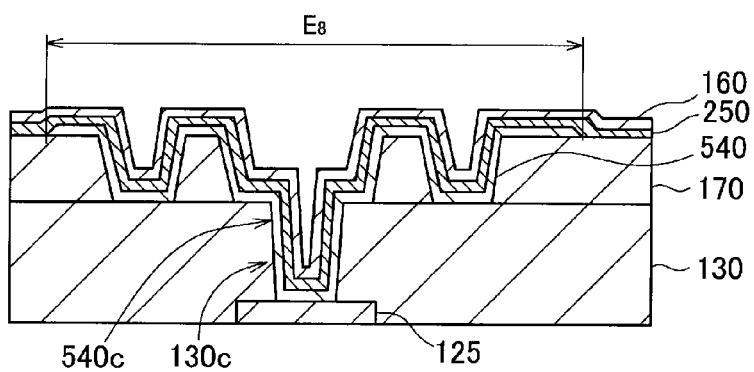
FIG. 24B is a cross-sectional view taken along a line G-G in FIG. 24A.

FIG. 24A is a plan view showing the seventh variation of the light emitting region. FIG. 24B is a cross-sectional view taken along the line G-G in FIG. 24A. In this example also, the light emitting region $E_8$ including a cavity part divided into a plurality of parts is formed for one light emitting element. As the difference with the sixth variation described above, the lower electrode 540 is integrally formed. In this way, if the contact portion 540c of the lower electrode 540 is included in the light emitting region, it is possible to integrally form the lower electrode 540.

Figure 25:
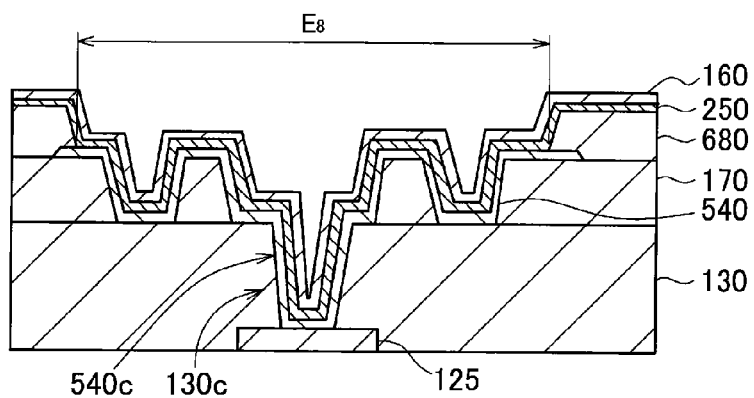
FIG. 25 is a cross-sectional view showing a case where an additional insulating film is provided in the seventh variation of the light emitting region.

FIG. 25 is a cross-sectional view showing a case where an additional insulating film is provided in the seventh variation of the light emitting region. In the configuration of the illustrated example, the light emitting region $E_8$ that includes the cavity part divided into a plurality of parts is formed and the lower electrode 540 is integrally formed. In addition, the additional insulating film 680 is formed between the end portions of the second lower electrode 540b and the light emitting layer 150.

Here, the difference between when the lower electrode 540 is integrally formed and not integrally formed will be described. As one example, if the lower electrode 540 is formed so as to be split into the first lower electrode 540a and the second lower electrode 540b as in the examples shown in FIGS. 22A and 22B, the first lower electrode 540a is formed before the opening regulating insulating film 170. Accordingly, when the cavity part is formed by patterning the opening regulating insulating film 170, the first lower electrode 540a can be used as an etching stopper so that overetching is tolerated.

Meanwhile, if the lower electrode 540 is integrally formed as in the examples shown in FIGS. 24A and 24B, the process forming the lower electrode 540 is completed in a single step. However, the lower electrode 540 will not have formed when the opening regulating insulating film 170 is formed. Accordingly, when the opening regulating insulating film 170 is patterned to form the cavity parts, it is necessary to stop the etching at a specified depth without using an etching stopper and overetching is not tolerated.

Figure 26A:
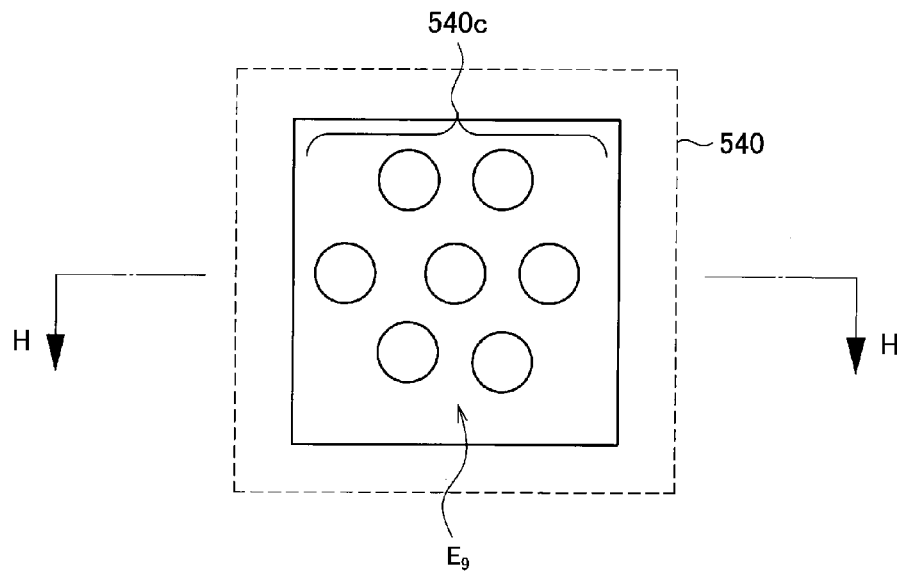
FIG. 26A is a plan view showing an eighth variation of the light emitting region.
Figure 26B:
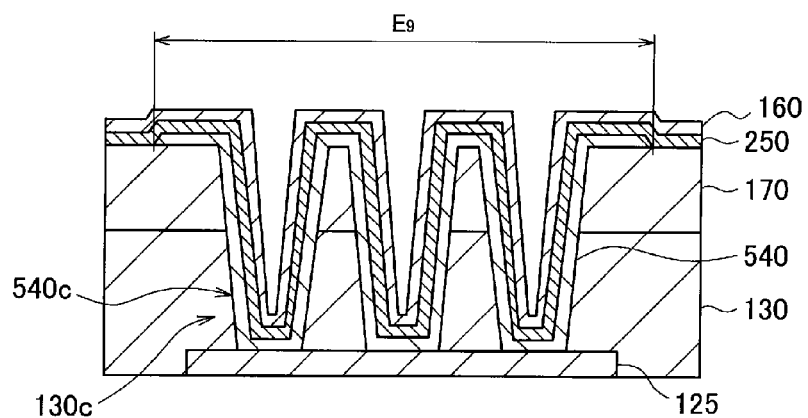
FIG. 26B is a cross-sectional view taken along a line H-H in FIG. 26A.

FIG. 26A is a plan view showing the eighth variation of the light emitting region. FIG. 26B is a cross-sectional view taken along the line H-H in FIG. 26A. In this example, the light emitting region $E_9$ is integrally formed for one light emitting element. As the difference with the fifth variation, a plurality of contact holes 130c (in the illustrated example, seven) are formed in the smoothing insulating film 130 and the lower electrode 540 has the same number (in the illustrated example, seven) of contact portions 540c that are inserted through such contact holes 130c. Note that the positions of the contact portions 540c are not limited to the illustrated example and may be set arbitrarily.

In this example, the respective contact portions 540c are intended to achieve a reflective effect at the side surfaces formed by the lower electrode 540. That is, parts corresponding to the concave mirror portions in JP 2008-218296A are formed by the lower electrode 540 on the side surfaces of the contact portions 540c. For this reason, a plurality of contact portions 540c whose cross-sectional form is circular are laid out in the light emitting region $E_9$. Note that the cross-sectional form of the light emitting region $E_9$ is not limited to rectangular as in the illustrated example and may be another shape, such as hexagonal, that facilitates filling with circular contact portions 540c.

9. Light Emitting Layer Variations

Next, variations of the light emitting layer of the embodiments of the present disclosure will be described with reference to FIGS. 27 to 31. As described above, the embodiments of the present disclosure include a case where the light emitting layer is split into different colors for the light emitting elements (for example, the first and third embodiments) and a case where the light emitting layer is formed so as to be shared between light emitting elements (for example, the second and fourth embodiments). By realizing such embodiments in isolation or as a combination, it is possible to realize a layout of the light emitting layer in an arbitrary pattern.

Note that in the drawings described below, the layout of the color filters is indicated as "CF", the layout (coloring) of the light emitting elements as "OLED", and the layout of the light emitting regions as "WIN". By using different combinations of such layouts, various pixel layouts indicated as "Pixel" are realized. Also, in the drawings described below, light emitting layers of respective colors are distinguished using letters indicating the colors, such as the yellow light emitting layer being indicated as the "light emitting layer Y" and the blue light emitting layer being indicated as the "blue emitting layer B".

FIG. 27 is a plan view showing a first variation of the light emitting layer. In this example, the light emitting layer is formed so as to be split into the two colors yellow (Y) and blue (B). Color filters for red (R), yellow (Y), and green (G) are disposed over the light emitting layer Y and color filters for blue (B) are disposed over the light emitting layer B. By doing so, a pixel layout composed of light emitting elements of the four colors R, Y, G, and B is realized.

Note that in this case, for the light emitting elements Y, B, since the emitted color is the same as the color of the light emitting layers, the color filters are not necessarily provided. However, as described earlier, when setting light emitting regions that include the contact portions 140c in the light emitting elements, color filters are used to remove color shifts in the emitted light produced by the thickness of the light emitting layer 250 differing at the contact portion 140c parts compared to other parts. Accordingly, if the contact portions 140c are included in the light emitting regions, color filters are also provided for the light emitting elements Y and B.

Figure 28:
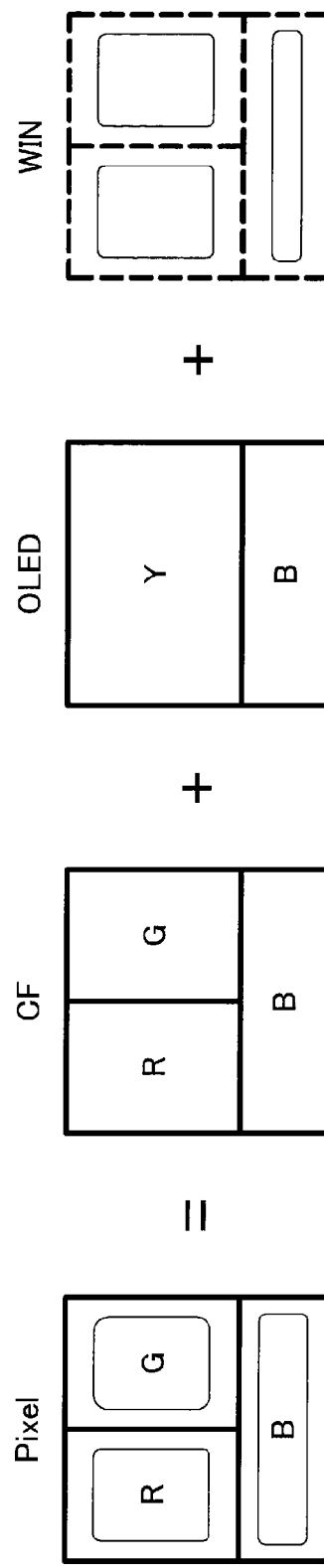
FIG. 28 is a plan view showing a second variation of the light emitting layer.

FIG. 28 is a plan view showing a second variation of the light emitting layer. In this example, in the same way as in the first variation described above, the light emitting layer is formed so as to be split into the two colors yellow (Y) and blue (B). Meanwhile, color filters for red (R) and green (G) are disposed over the light emitting layer Y and color filters for blue (B) are disposed over the light emitting layer B. By doing so, a pixel layout composed of light emitting elements of the three colors R, G, and B is realized. In this case also, if the contact portions 140c are included in the light emitting regions, color filters are also provided for the light emitting elements B.

Figure 29:
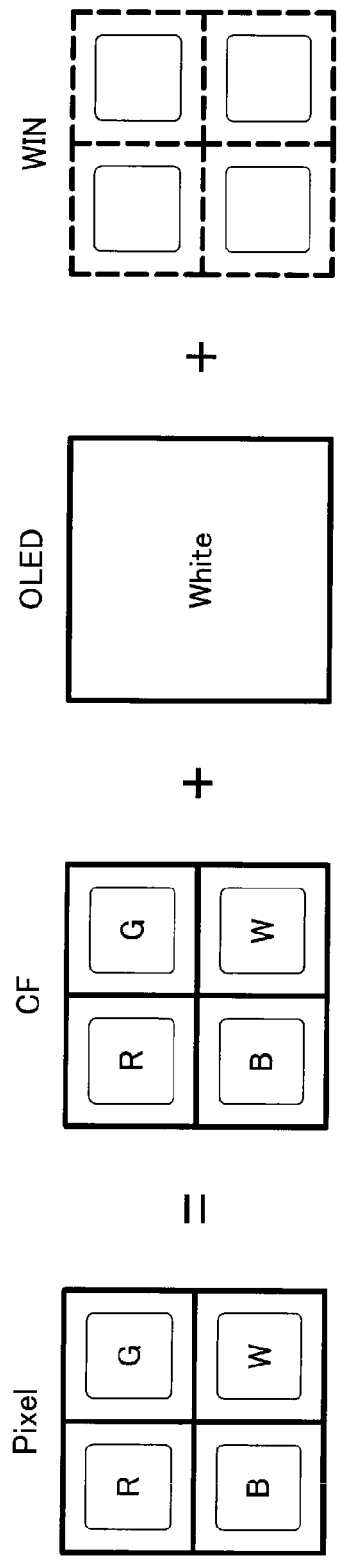
FIG. 29 is a plan view showing a third variation of the light emitting layer.

FIG. 29 is a plan view showing a third variation of the light emitting layer. In this example, the light emitting layer is formed to have the single color white (W). Accordingly, the light emitting layer may be formed across the entire surface of the display region 101. Red (R), green (G), blue (B), and white (W) color filters are disposed. By doing so, a pixel layout made up of the four colors R, G, B, and W is realized.

Note that in this case, for the light emitting elements W, since the emitted color is the same as the color of the light emitting layer, the color filters are not necessarily provided. However, in the same way as in the other variations described above, if the contact portions 140c are included in the light emitting regions, color filters are also provided for the light emitting elements W. The color filters for the light emitting elements W may be filters for producing a desired white temperature for the emitted light, such as pale blue color filters.

Figure 30:
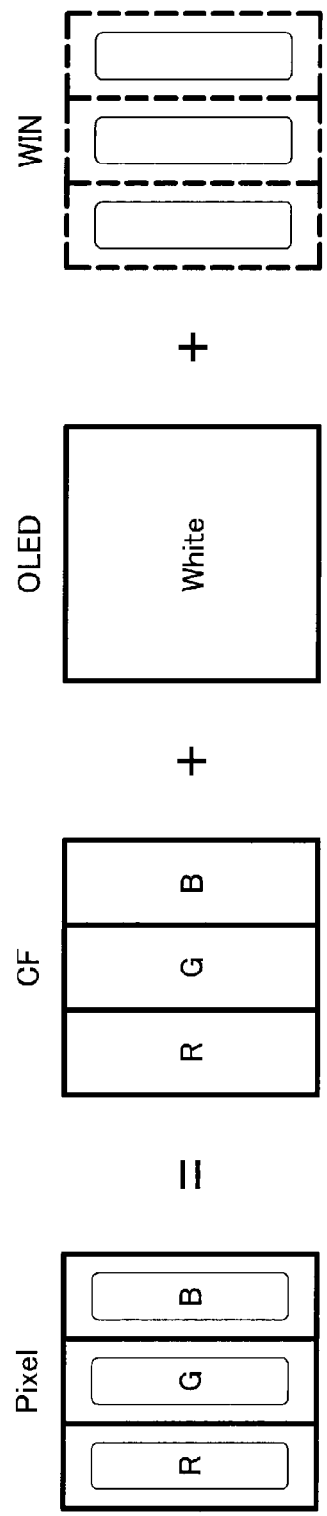
FIG. 30 is a plan view showing a fourth variation of the light emitting layer.

FIG. 30 is a plan view showing the fourth variation of the light emitting layer. In this example, in the same way as in the third variation described above, the light emitting layer is formed of only the single color white (W). Meanwhile, red (R), green (G), and blue (B) color filters are disposed. By doing so, a pixel layout composed of light emitting elements of the three colors R, G, and B is realized. In this case, since a color filter of one of R, G, and B is provided for each light emitting element to have light of the respective colors emitted, it is possible to include the contact portions 140c in the light emitting regions of all of the light emitting elements.

Figure 31:
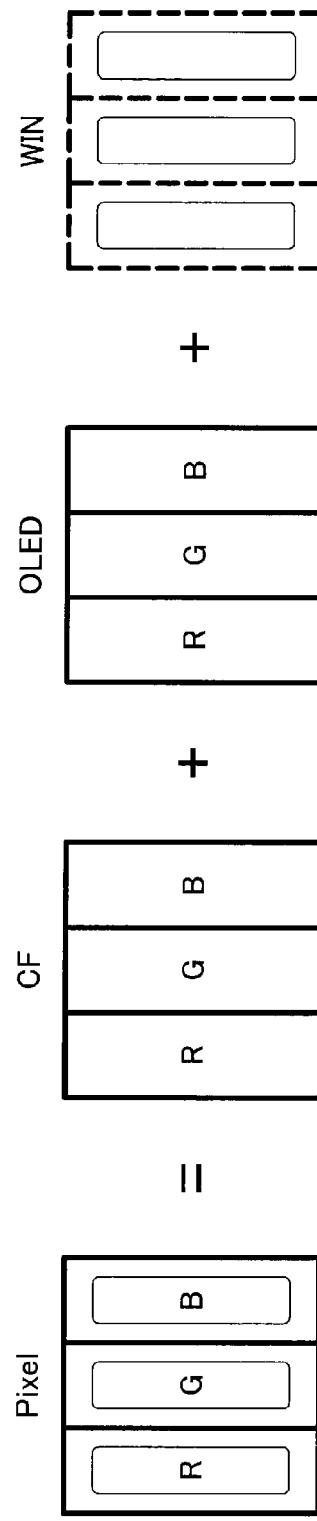
FIG. 31 is a plan view showing a fifth variation of the light emitting layer.

FIG. 31 is a plan view showing a fifth variation of the light emitting layer. In this example, the light emitting layer is formed so as to be split into the three colors red (R), green (G), and blue (B). Accordingly, for the light emitting elements R, G, and B, since the emitted colors are the same as the colors of the light emitting layers, the color filters are not necessarily provided. However, in the same way as in the other variations described above, if the contact portions 140c are included in the light emitting regions, color filters are also provided for the respective light emitting elements.

10. Pixel Pattern Layouts

Next, layouts of pixel patterns that can be used as an additional configuration of the embodiments of the present disclosure will be described with reference to FIGS. 32A to 42.

First, the method of forming the light emitting layer by metal mask vapor deposition will be described with reference to FIGS. 32A to 35. As described above, methods of forming the light emitting layer in an organic EL display include metal mask vapor deposition, transfer using a laser or the like, and printing using an ink jet or the like. Out of such methods, metal mask vapor deposition is advantageous from the viewpoint of mass production.

Figure 32A:
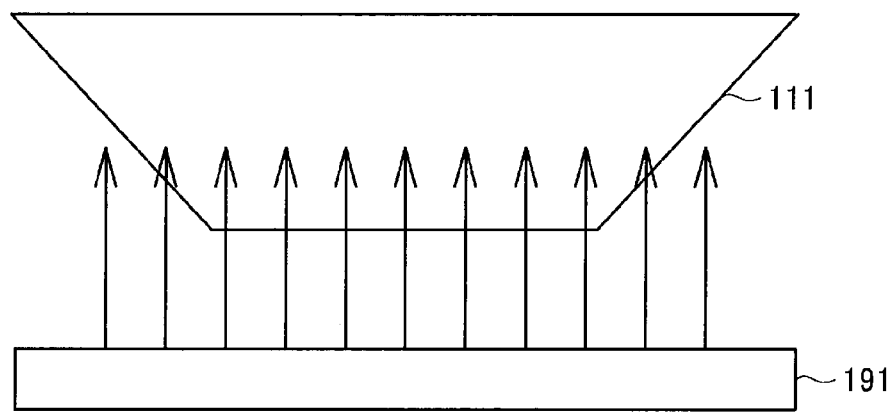
FIG. 32A is a diagram showing an example of a beam deposition source used in metal mask vapor deposition.
Figure 32B:
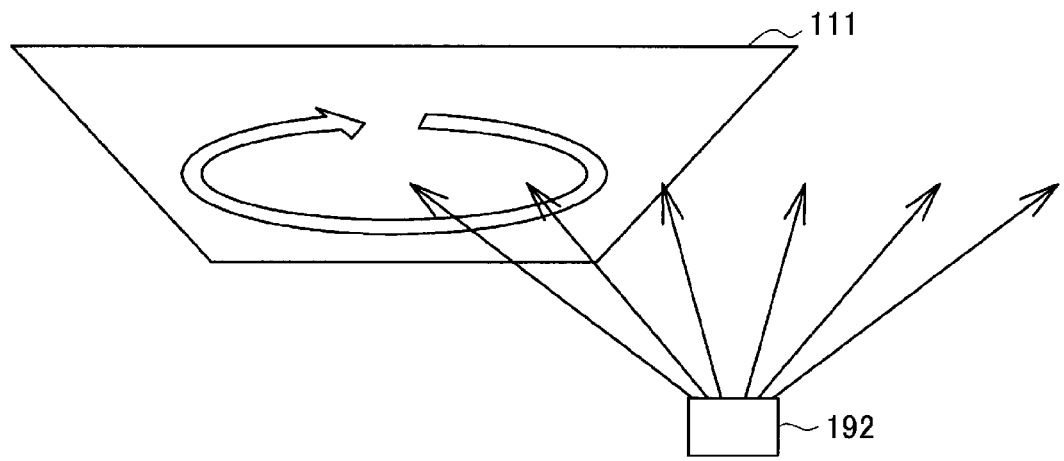
FIG. 32B is a diagram showing an example of a point deposition source used in metal mask vapor deposition.

FIGS. 32A and 32B are diagrams showing examples of the form of a vapor deposition source used in metal mask vapor deposition. The source shown in FIG. 32A is a beam deposition source 191. The beam deposition source 191 has a length that is substantially equal to the width of the substrate 111 and causes material to be vaporized in a region in the form of a line in the width direction of the substrate 111 toward the substrate 111 that passes above the beam deposition source 191. Since it is possible to have the material adhere at the same time in a line-shaped region and deposition is complete once the substrate 111 has passed above the beam deposition source 191, it is possible to carry out the process at high speed.

The source shown in FIG. 32B is a point deposition source 192. The point deposition source 192 has an arbitrary size and causes material to be vaporized toward the substrate 111 that rotates on a plane above the point deposition source 192. Since the region where the material is vaporized is small compared to the beam deposition source 191, it is easy to control the deposited amount so that the material uniformly adheres on the substrate 111.

Figure 33:
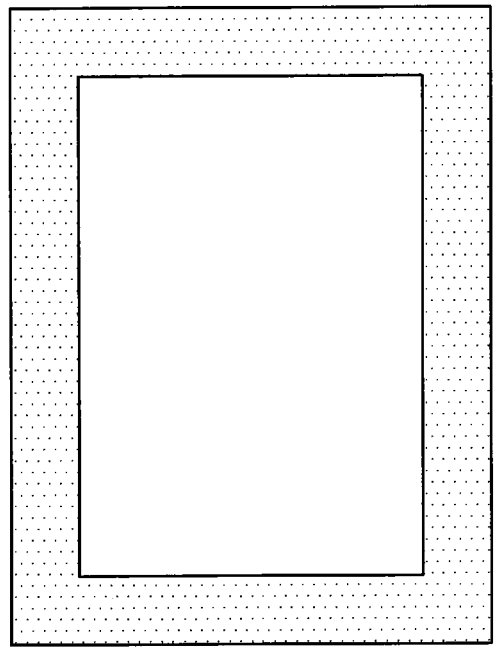
FIG. 33 is a diagram showing an example of an area mask used in metal mask vapor deposition.

FIG. 33 is a diagram showing an example of an area mask used in metal mask vapor deposition. An area mask is a mask where all of a specified region is open and is used for example to deposit the white (W) light emitting layer formed in the entire display region 101 in the third and fourth variations of the light emitting layer.

Figure 34A:
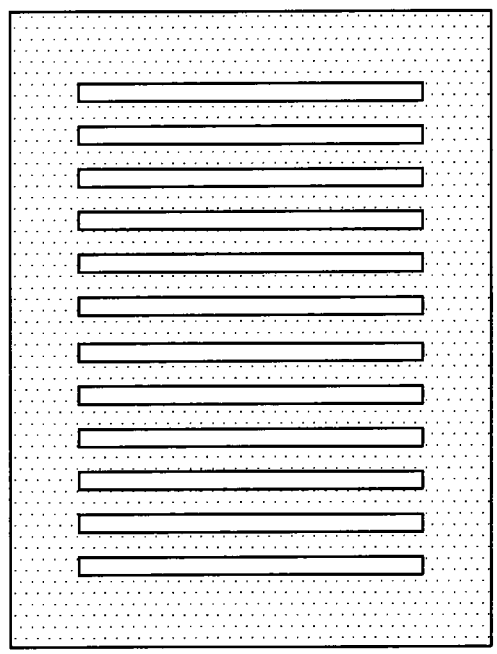
FIG. 34A is a diagram showing an example of a slit mask used in metal mask vapor deposition.
Figure 34B:
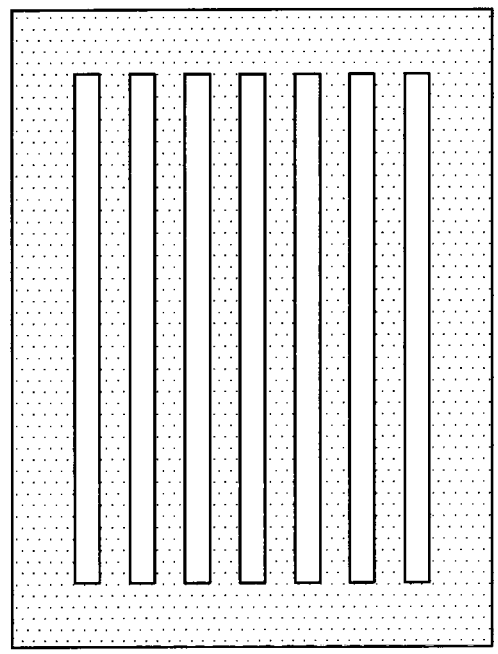
FIG. 34B is a diagram showing an example of a slit mask used in metal mask vapor deposition.

FIGS. 34A and 34B are diagrams showing examples of slit masks used in metal mask vapor deposition. A slit mask is a mask where a slit-shaped part is open in a specified region and is used for example to deposit the yellow light emitting layer arranged in strips in the first and second variations of the light emitting layer.

Figure 35:
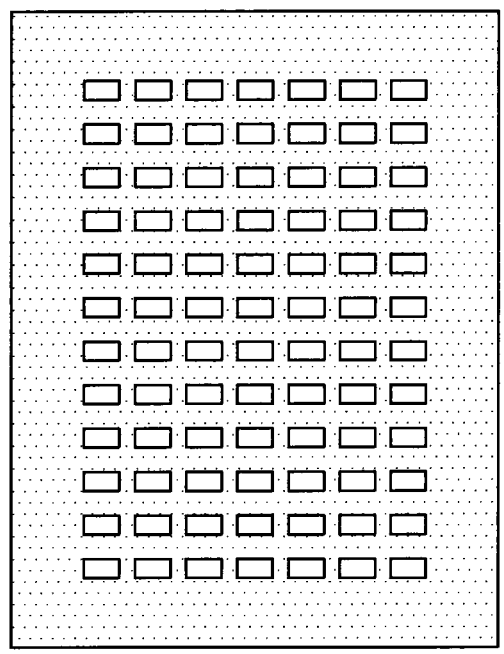
FIG. 35 is a diagram showing an example of a slot mask used in metal mask vapor deposition.

FIG. 35 is a diagram showing an example of a slot mask used in metal mask vapor deposition. A slot mask is a mask where slots disposed in an arbitrary pattern in a specified region are open and is used for example to deposit the red (R), green (G), and blue (B) light emitting layers disposed in a distributed manner in the fifth variation of the light emitting layer.

As one example, if a plurality of light emitting layers split into different colors are formed by vapor deposition using the slit mask or the slot mask described above, a certain degree of error is produced in the formation positions of the light emitting layers. As one example, if the light emitting layer is split into colors for each light emitting element as in the fifth variation of the light emitting layer and the light emitting layers are formed by vapor deposition using a slot mask, the effect of the error described above will increase due to the large number of boundaries between the light emitting layers. Meanwhile, if for example the light emitting layer is split into colors in strips in a certain direction as in the first and second variations of the light emitting layer, although the light emitting layers are formed by vapor deposition using a slit mask, since there are few boundaries in the light emitting layers, the effect of errors is comparatively small.

Figure 36A:
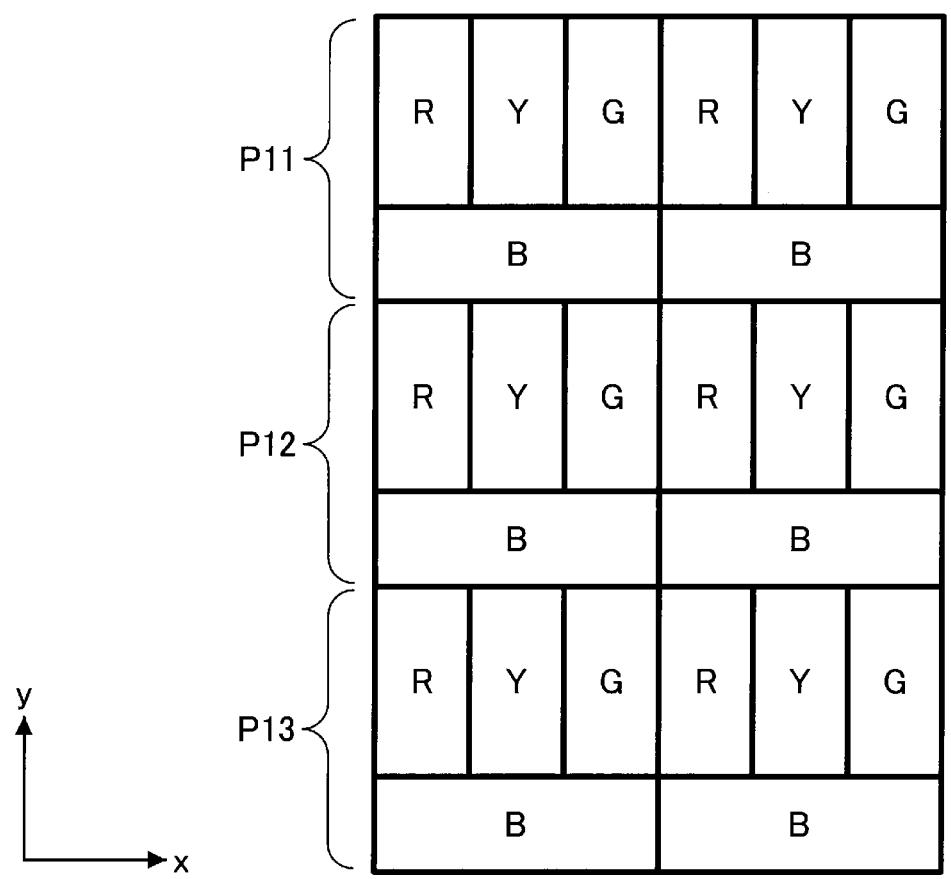
FIG. 36A is a diagram showing an example layout in which pixel patterns are not reversed.
Figure 36B:
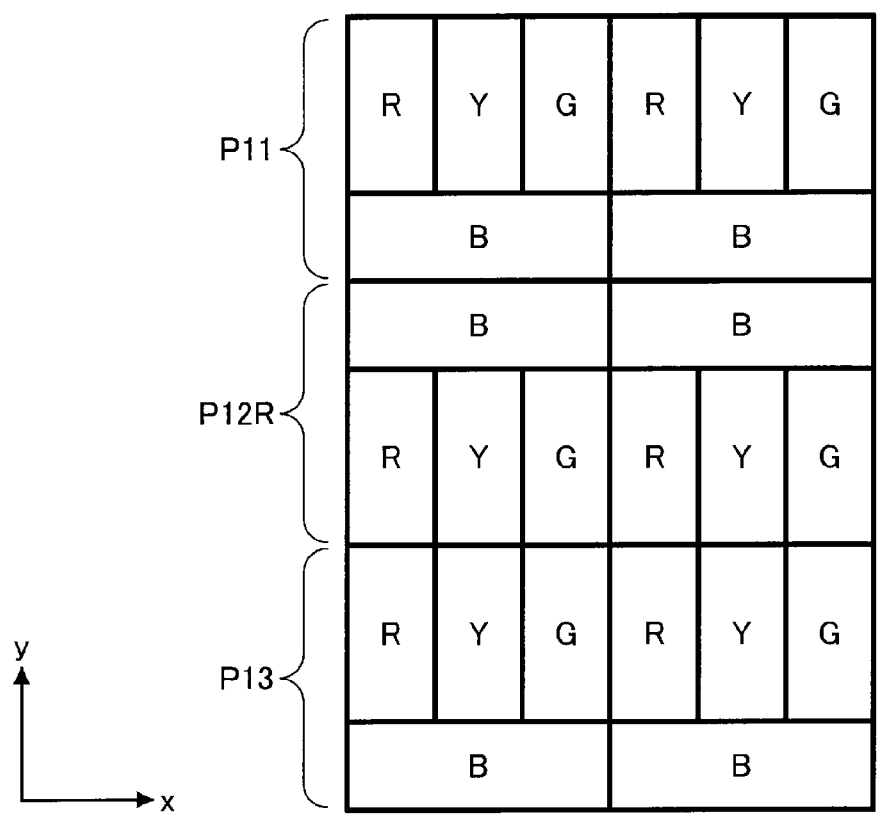
FIG. 36B is a diagram showing a first example layout where pixel patterns are reversed.

FIGS. 36A and 36B are diagrams showing a first example of a reversed layout of a pixel pattern. In this example, in the same way as the first variation of the light emitting layer described with reference to FIG. 27, the light emitting layer is formed so as to be split into the two colors yellow (Y) and red (R), yellow (Y), and green (G) color filters are disposed on the light emitting layer Y and blue (B) color filters are disposed on the blue light emitting layer B.

FIG. 36A shows a state where a pixel layout pattern composed of light emitting elements of the four colors R, Y, G and B is arranged in a direction (the y axis direction in the drawing) perpendicular to the direction in which the light emitting layer Y and the light emitting layer B are alternately formed in lines. In this example, the patterns P11, P12, and P13 are not reversed. Meanwhile, FIG. 36B shows a state where the pattern of the pixel layout shown in FIG. 36A is reversed every other pattern. In the illustrated example, the pattern shown as P12 in FIG. 36A is reversed in the y axis direction to become the pattern P12R.

Figure 37A:
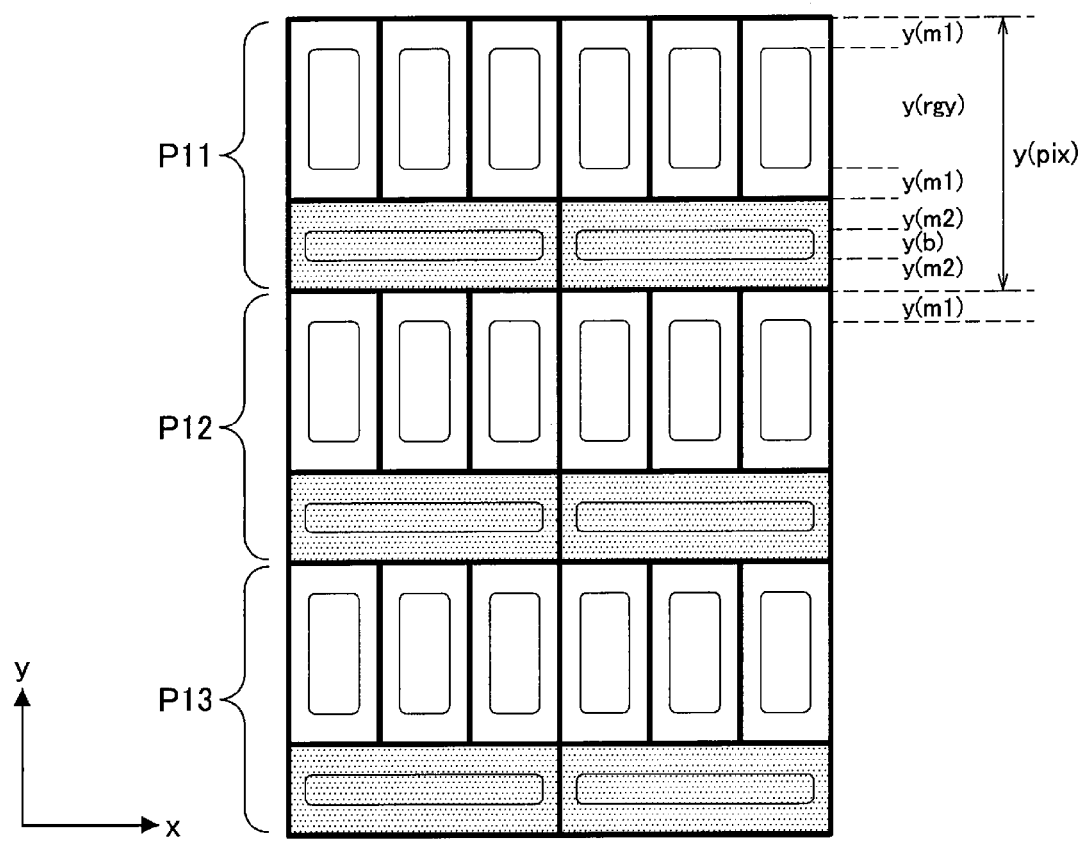
FIG. 37A is a diagram showing the layout of light emitting layers for the example in FIG. 36A.
Figure 37B:
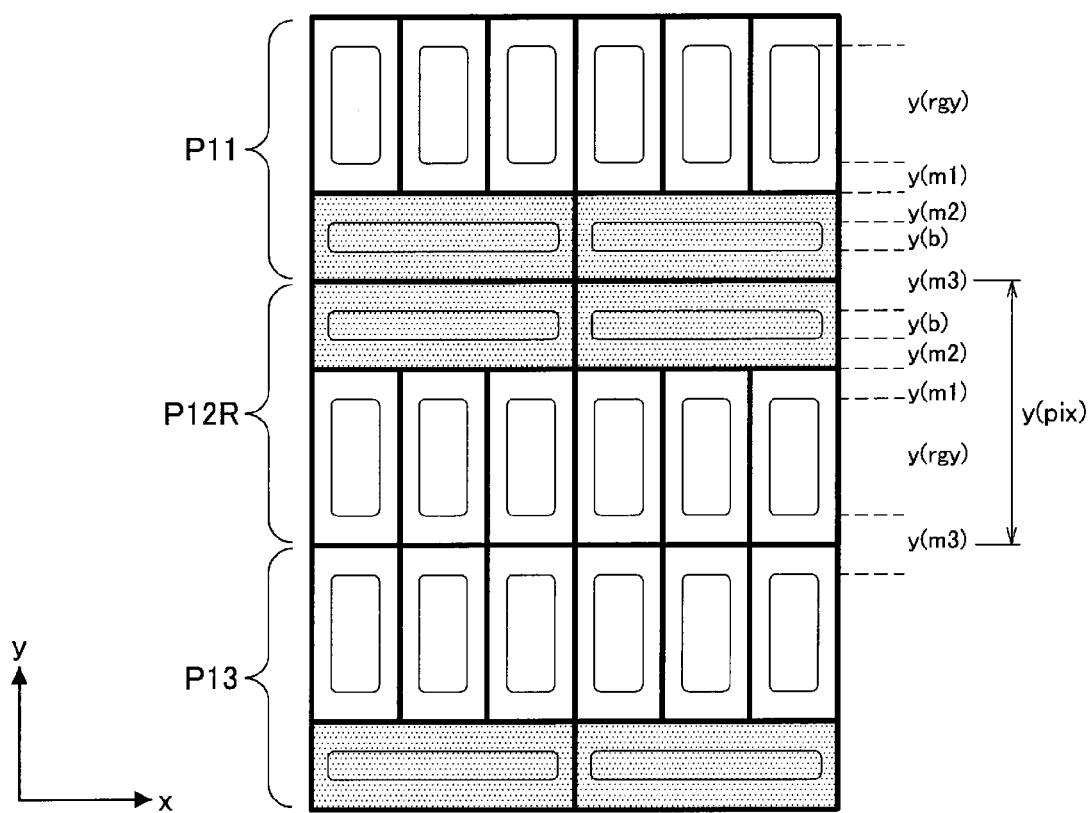
FIG. 37B is a diagram showing the layout of light emitting layers for the example in FIG. 36B.

FIGS. 37A and 37B are diagrams showing layouts of the light emitting layers in the examples in FIGS. 36A and 36B, respectively. In the illustrated examples, the yellow (Y) light emitting layer is formed in regions corresponding to the light emitting elements R, Y, and G and the blue (B) light emitting layer is formed in regions corresponding to the light emitting elements B. Such light emitting layers are formed for example by vapor deposition of the light emitting layer B across the entire surface of the display region using an area mask and by vapor deposition of the light emitting layer Y in specified regions using a slit mask. Note that the light emitting layer Y may also be formed by transfer or by printing.

When doing so, in view of errors in the vapor deposition at boundary parts between different colors, margins are provided between the light emitting regions of the light emitting elements. In the example shown in FIG. 37A where the pixel layout pattern is not reversed, at the boundary parts between the light emitting layer Y and the light emitting layer B, the margin y(m1) is provided on the light emitting layer Y side and the margin y(m2) is provided on the light emitting layer B side. As a result, in the y axis direction, the light emitting region (rgy) of the light emitting layer Y and the light emitting region y(b) of the light emitting layer B are set so as to satisfy Equation 1 with respect to the size y(pix) of an entire pixel.

[Math. 1]

$$y(rgy)+y(b)=y(\text{pix})-2(y(m1)+y(m2)) \quad \text{Equation 1}$$

Meanwhile in the example shown in FIG. 37B where the pixel layout pattern is reversed, the provision of the margins y(m1), y(m2) at the boundary parts between the light emitting layer Y and the light emitting layer B is the same as the non-reversed example. However, since the light emitting layer B or the light emitting layer Y is continuous at the boundary part between the reversed pattern and the non-reversed pattern, that is, the boundary part between the pattern P11 and the pattern P12R and the boundary part between the pattern P12R and the pattern P13, and it is not necessary to consider errors in vapor deposition at such parts, the margins y(m1), y(m2) are not necessarily provided. The interval between adjacent light emitting regions in such case is set as y(m3). Here, y(m3)<y(m1)+y(m2). As a result, the light emitting region y(rgy) of the light emitting layer Y and the light emitting region y(b) of the light emitting layer B are set so as to satisfy Equation 2 below with respect to the size y(pix) of an entire pixel.

[Math. 2]

$$y(rgy)+y(b)=y(\text{pix})-(y(m1)+y(m2))-y(m3) \quad \text{Equation 2}$$

Here, since y(m3)<y(m1)+y(m2), in this case the region that can be used as the light emitting region y(rgy) and the light emitting region y(b) is increased by (y(m1)+y(m2))-y(m3). Accordingly, the case where the patterns are laid out so as to be reversed every other pattern as shown in FIGS. 36B and 37B has a larger aperture ratio, that is, the proportion of the display region occupied by the light emitting regions increases compared to the case where the patterns are laid out without reversing as shown in FIGS. 36A and 37A.

Figure 38:
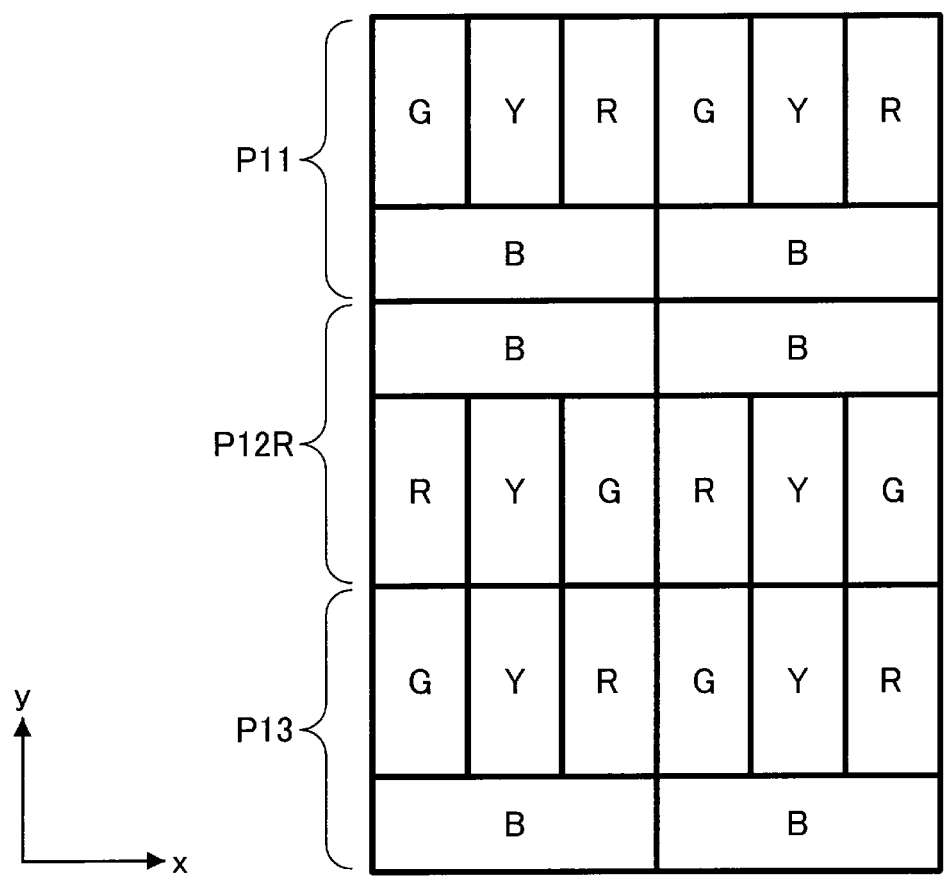
FIG. 38 is a diagram showing a second example layout where pixel patterns are reversed.

FIG. 38 is a diagram showing a second example of a layout where pixel patterns are reversed. In this example, in the first example described above with reference to FIGS. 36A to 37B, the positions of red (R) and green (G) are reversed and in the reversed pattern P12R, the pattern is also reversed in the x axis direction.

Figure 39A:
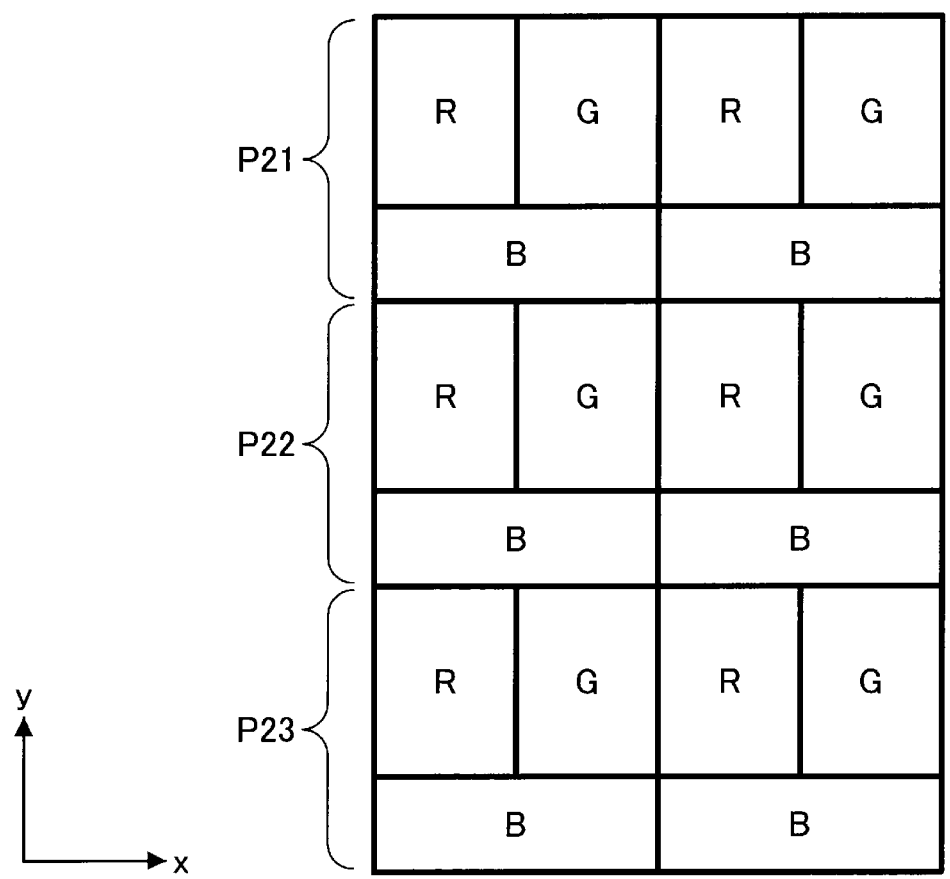
FIG. 39A is a diagram showing an example layout in which pixel patterns are not reversed.
Figure 39B:
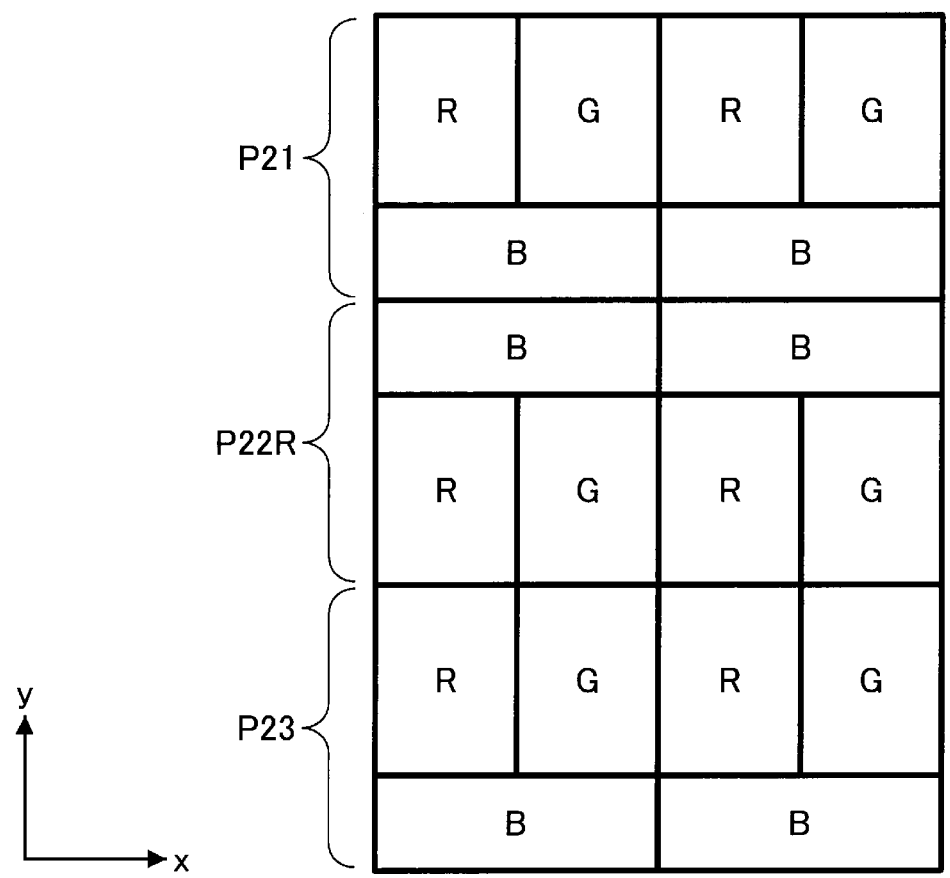
FIG. 39B is a diagram showing a third example layout where pixel patterns are reversed.

FIGS. 39A and 39B are diagrams showing a third example of a layout where pixel patterns are reversed. In this example, in the same way as the second variation of the light emitting layer described with reference to FIG. 28, the light emitting layer is formed so as to be split into the two colors yellow (Y) and blue (B), red (R) and green (G) color filters are disposed over the light emitting layer Y, and blue (B) color filters are disposed over the light emitting layer B.

FIG. 39A shows a state where the pattern of the pixel layout composed of the three colors R, G, and B are aligned in the direction (the y axis direction in the drawing) in which the light emitting layer Y and the light emitting layer B are alternately formed in lines. In this example, the patterns P21, P22, and P23 are not reversed. Meanwhile, FIG. 39B shows a state where the pattern of the pixel layout shown in FIG. 39A is reversed for every other pattern. In the illustrated example, the pattern shown as P22 in FIG. 39A is reversed in the y axis direction to become the pattern P22R.

Figure 40A:
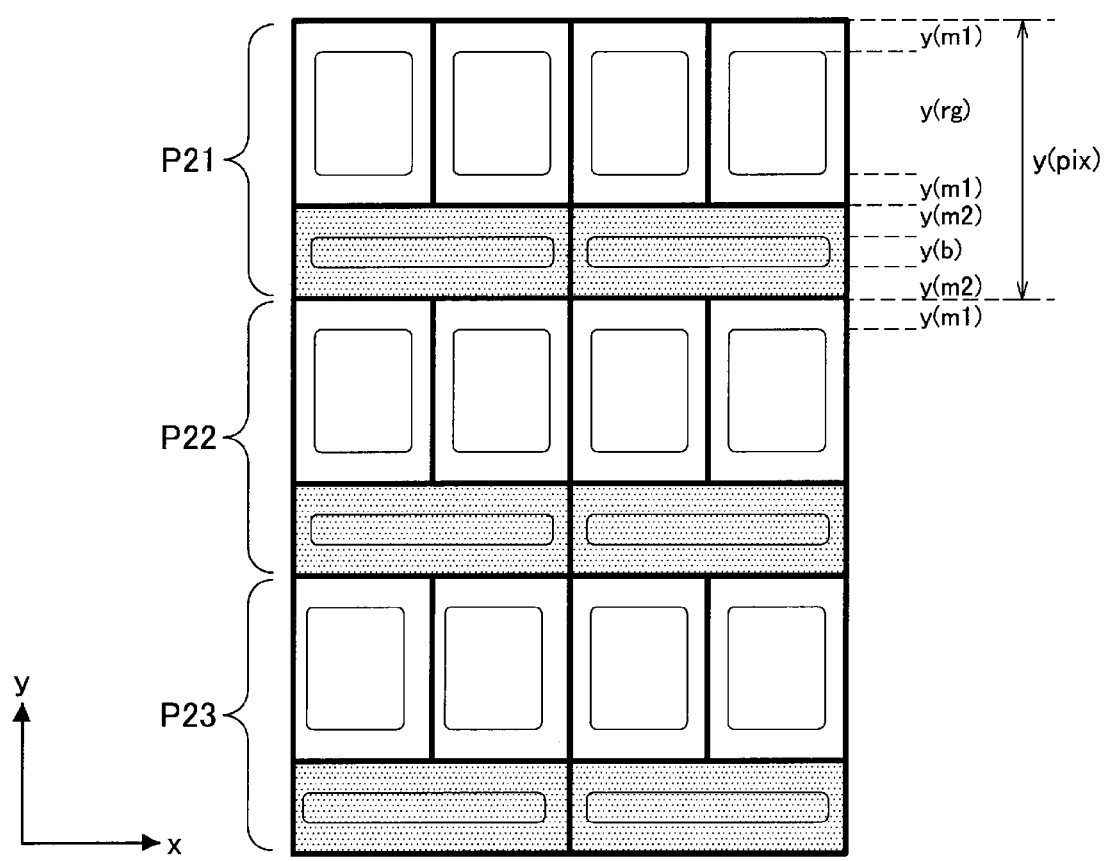
FIG. 40A is a diagram showing the layout of light emitting layers for the example in FIG. 39A.
Figure 40B:
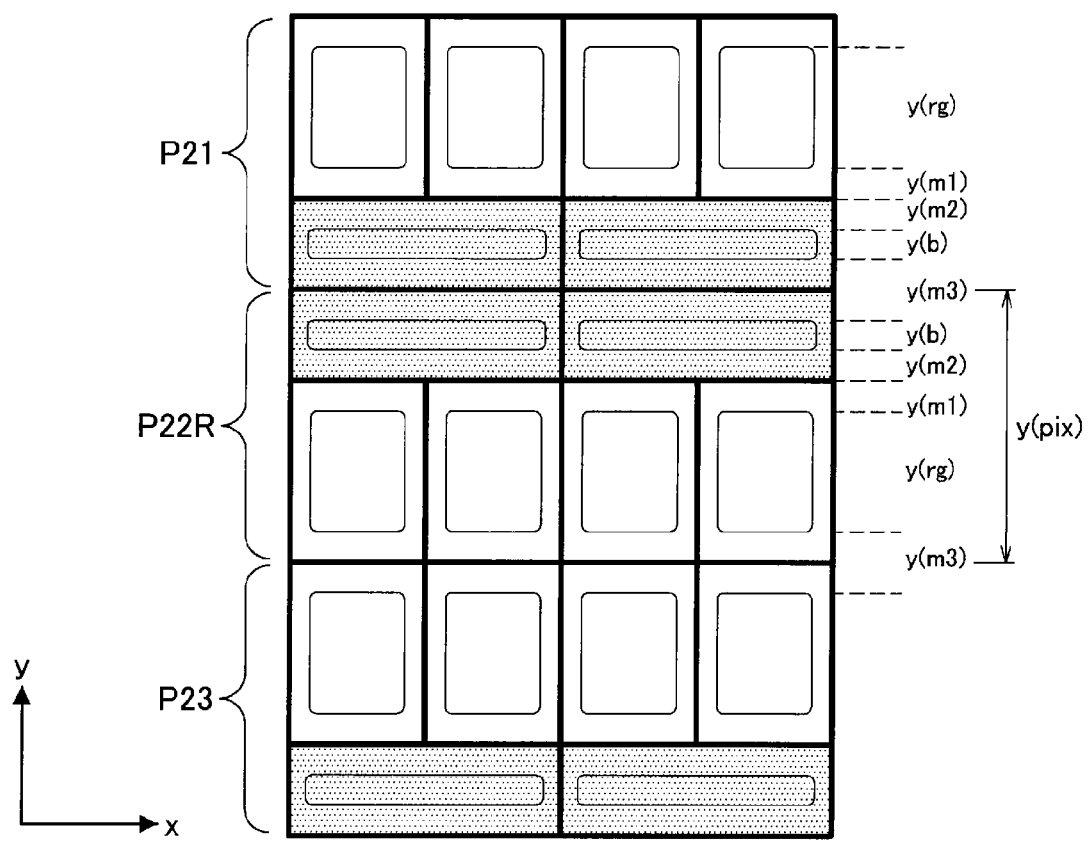
FIG. 40B is a diagram showing the layout of light emitting layers for the example in FIG. 39B.

FIGS. 40A and 40B are diagrams showing the layout of light emitting layers in the examples in FIGS. 39A and 39B respectively. In the illustrated example, the yellow (Y) light emitting layer is formed in regions corresponding to the light emitting elements R and G and the blue (B) light emitting layer is formed in regions corresponding to the light emitting elements B. As one example, such light emitting layers may be formed by vapor deposition of the light emitting layer B using an area mask across the entire surface of the display region and vapor deposition of the light emitting layer Y using a slit mask in specified regions. By producing the light emitting layer B by vapor deposition using an area mask, mask precision is demanded for only the light emitting layer Y By doing so, the manufacturing process is simplified compared to a case where both the light emitting layer B and the light emitting layer Y are split into colors by vapor deposition using a slot mask or a slit mask for example, which improves productivity. Note that that light emitting layer Y may be formed by transfer or by printing.

Since the configuration of the light emitting layer in the example in FIGS. 40A and 40B is the same as the example described with reference to FIGS. 37A and 37B, detailed description thereof is omitted. As a result, the case where patterns are laid out so as to be reversed every other pattern as shown in FIGS. 39B and 40B has a larger aperture ratio, that is, the proportion of the display region occupied by the light emitting region, increases compared to the case where patterns are laid out without reversing as shown in FIGS. 39A and 40A.

Figure 41:
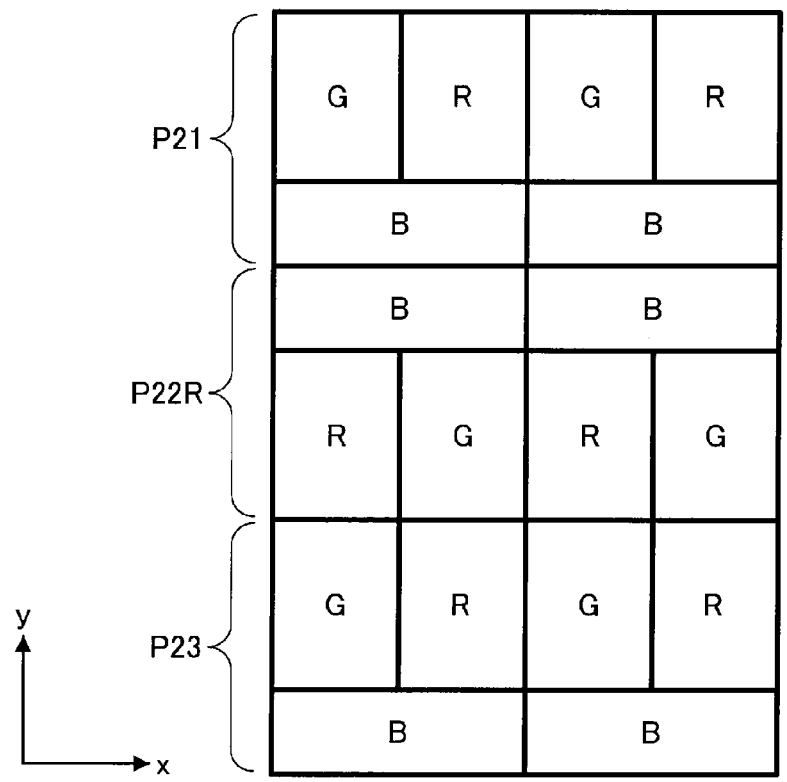
FIG. 41 is a diagram showing a fourth example layout where pixel patterns are reversed.

FIG. 41 is a diagram showing a fourth example of a layout where pixel patterns are reversed. In this example, in the first example described with reference to FIGS. 39A to 40B, the positions of red (R) and green (G) are reversed and in the reversed pattern P22R, the pattern is also reversed in the x axis direction.

Figure 42:
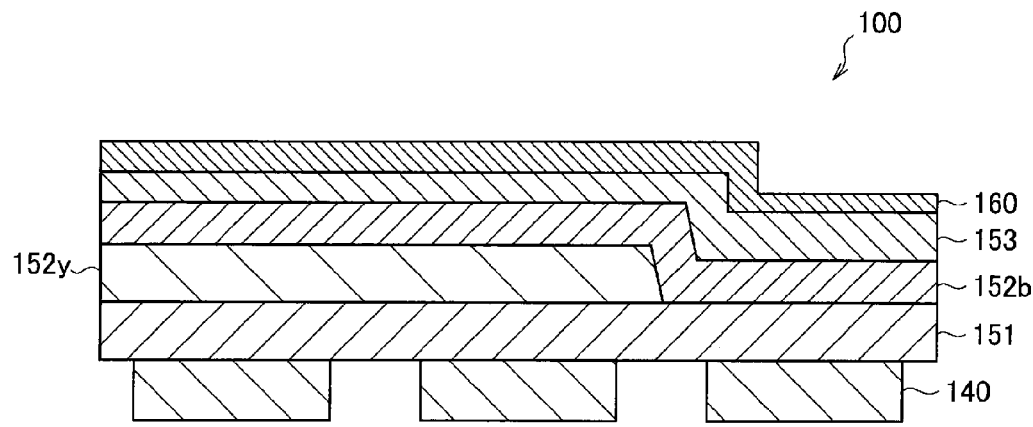
FIG. 42 is a diagram showing an example configuration of the light emitting layer.

FIG. 42 is a diagram showing an example configuration of a light emitting layer that can be used for the pixel pattern described above. FIG. 42 schematically shows, out of the structural elements of the organic EL display 100, the lower electrode 140, a hole injection layer/hole transport layer 151, a yellow light emitting layer 152$y$, a blue light emitting layer 152$b$, an electron transport layer/electron injection layer 153, and the upper electrode 160. The hole injection layer/hole transport layer 151, the yellow light emitting layer 152$y$, the blue light emitting layer 152$b$, and the electron transport layer/electron injection layer 153 correspond to the light emitting layer 150 in the above description. Out of such layers, the yellow light emitting layer 152$y$ is colored separately for each region but the other layers (the hole injection layer/hole transport layer 151, the blue light emitting layer 152$b$, and the electron transport layer/electron injection layer 153) are formed across the entire surface of the display region. Note that out of such layers, the hole injection layer/hole transport layer 151 may be split into colors. At parts where the yellow light emitting layer 152$y$ and the blue light emitting layer 152$b$ overlap, the blue light emitting layer 152$b$ functions as an electron transport layer (that is, the blue light emitting layer 152$b$ itself does not emit light), so that yellow light emitted by the yellow light emitting layer 152$y$ is obtained even though the blue light emitting layer 152$b$ is overlapped. As described above, the yellow light produced by the yellow light emitting layer 152$y$ passes through color filters such as red (R) and green (G) and is outputted as light of a specified color that constructs a pixel.

Figure 43:
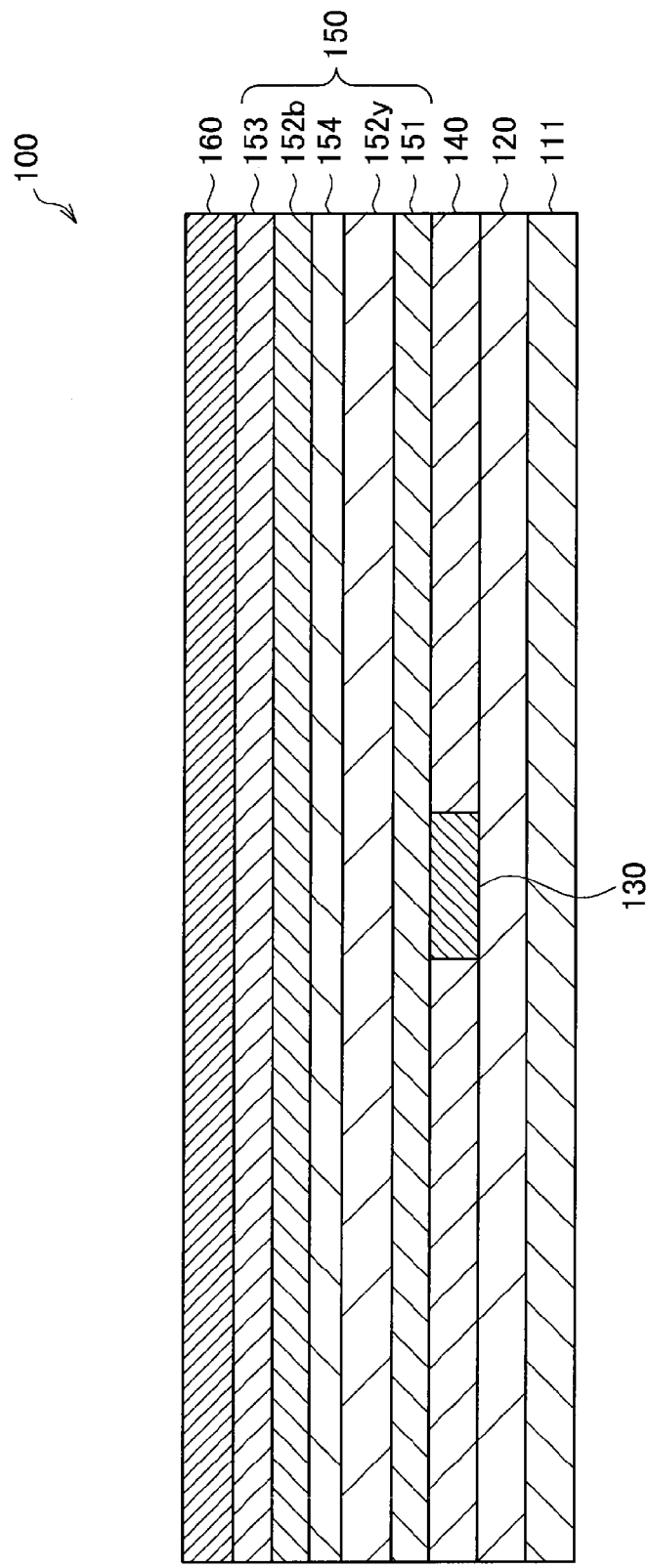
FIG. 43 is a diagram showing another example configuration of the light emitting layer.

FIG. 43 is a diagram showing another example configuration of the light emitting layer. In FIG. 43, out of the structural elements of the organic EL display 100, the substrate 111, the TFT layer 120, the smoothing insulating film 130, the lower electrode 140, the light emitting layer 150, and the upper electrode 160 are schematically shown. The light emitting layer 150 includes the hole injection layer/hole transport layer 151, the yellow light emitting layer 152$y$, the blue light emitting layer 152$b$, the electron transport layer/electron injection layer 153, and also a charge generation layer (CGL) 154. In the illustrated example, in the light emitting layer 150, the yellow light emitting layer 152$y$ and the blue light emitting layer 152$b$ are formed so as to be overlapping across the entire surface. By causing both the overlapping yellow light emitting layer 152$y$ and the blue light emitting layer 152$b$ to emit light, emitted white light is obtained. That is, the light emitting layer 150 is a white (W) light emitting layer formed across the entire display region. Here, by providing the charge generation layer 154 between the yellow light emitting layer 152$y$ and the blue light emitting layer 152$b$, it is possible for the yellow light emitting layer 152$y$ and the blue light emitting layer 152$b$ that are not directly interposed between the lower electrode 140 (anode) and the light emitting layer 150 (cathode) to emit light more efficiently.

11. Application to Electronic Appliance

Figure 44:
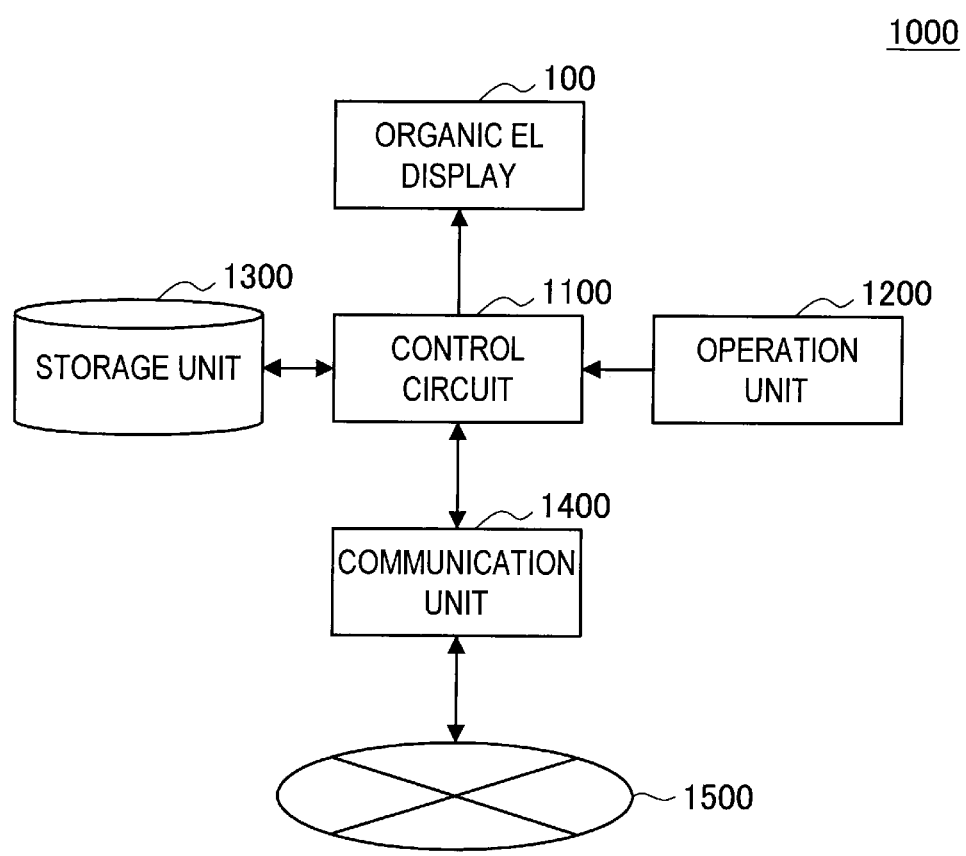
FIG. 44 is a schematic block diagram showing the configuration of an electronic appliance.

Next, the configuration of an electronic appliance including a display apparatus according to the embodiments of the present disclosure will be described with reference to FIG. 44. FIG. 44 is a schematic block diagram showing the configuration of the electronic appliance.

As shown in FIG. 44, the electronic appliance 1000 includes the organic EL display 100, a control circuit 1100, an operation unit 1200, a storage unit 1300, and a communication unit 1400. The electronic appliance 1000 is one of various types of appliance, such as a television set, a mobile phone (or smart phone), a digital camera, or a personal computer, that includes the organic EL display 100 as a display unit. Note that although the organic EL display 100 according to the first embodiment described above is shown as the display unit in the illustrated example, any of the organic EL displays 200 to 400 according to the second to fourth embodiments may be used, as may the display apparatuses according to the other embodiments.

As one example, the control circuit 1100 includes a CPU (Central Processing Unit), a RAM (Random Access Memory), a ROM (Read Only Memory), and the like, and controls the various units of the electronic appliance 1000. The organic EL display 100 is also controlled by the control circuit 1100.

The operation unit 1200 is constructed for example of a touch pad, buttons, a keyboard, or a mouse, and receives an operation input made by the user for the electronic appliance 1000. The control circuit 1100 controls the electronic appliance 1000 in accordance with the operation input acquired by the operation unit 1200.

The storage unit 1300 is constructed for example of a semiconductor memory, a magnetic disk, or an optical disc, and stores various data that is necessary for the electronic appliance 1000 to function. The control circuit 1100 may operate by reading out and executing a program stored in the storage unit 1300.

The communication unit 1400 is additionally provided. The communication unit 1400 is a communication interface connected to a wired or wireless network 1500 and is constructed for example of a modem and/or port, or an antenna. Via the communication unit 1400, the control circuit 1100 receives data from the network 1500 and transmits data to the network 1500.

The organic EL display 100 described above and also the electronic appliance 1000 including the organic EL display 100 are included in the embodiments of the present disclosure.

12. Supplementary Explanation

Although preferred embodiments of the present disclosure are described in detail above with reference to the appended drawings, the technical scope of the disclosure is not limited thereto. It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A display apparatus including:

a wiring pattern formed over a substrate;

a first insulating film which is laminated over the wiring pattern and in which a contact hole is formed in an up-down direction at a specified position;

lower electrodes each formed over the first insulating film and including a contact portion that is inserted through the contact hole and electrically connected to the wiring pattern;

a light emitting layer formed over the lower electrodes;

an upper electrode formed over the light emitting layer;

a light emitting region regulating member regulating a light emitting region where the light emitting layer is interposed between the lower electrodes and the upper electrode as a region including the contact portion; and a color filter disposed over the substrate in a region corresponding to at least the contact portion.

(2) The display apparatus according to (1), wherein a number of contact holes formed in the first insulating film is equal to a number of contact portions.

(3) The display apparatus according to (1), wherein a larger number of contact holes are formed in the first insulating film than a number of contact portions, and wherein each of the lower electrodes further includes a dummy contact portion that is inserted through the contact hole but is not connected to the wiring pattern.

(4) The display apparatus according to (1), wherein the light emitting region divided into a plurality of parts corresponding to the lower electrodes is formed.

(5) The display apparatus according to (4), wherein each of the lower electrodes includes the contact portion at a position corresponding to any of the parts into which the light emitting region is divided.

(6) The display apparatus according to any one of (1) to (5), further including:

a pixel driving circuit that is electrically connected to the wiring pattern and allows a light emitting element including the light emitting layer to function as a capacitive element in a reverse bias.

(7) The display apparatus according to any one of (1) to (6), wherein the light emitting region regulating member is laminated between the lower electrodes and the upper electrode and is a second insulating film in which an opening is formed in the light emitting region.

(8) The display apparatus according to any one of (1) to (6), wherein each of the lower electrodes functions as the light emitting region regulating member by being formed in a region corresponding to the light emitting region.

(9) The display apparatus according to (8), further including:

a second insulating film that is laminated between the first insulating film and the lower electrodes and that has an opening formed at a specified position, wherein the lower electrodes are erected along a side surface of the opening from above the first insulating film and reached an upper surface of the second insulating film.

(10) The display apparatus according to (9), further including:

a third insulating film that is laminated between the second insulating film and the light emitting layer and covers an end portion of each of the lower electrodes over the second insulating film.

(11) The display apparatus according to any one of (1) to (10), wherein the light emitting layer includes at least a first light emitting layer that is formed in first regions over the substrate and emits light of a first color and a second light emitting layer that is formed in second regions over the substrate and emits light of a second color, and wherein the layout pattern of the first regions and the second regions is reverse at every other region in a first direction over the substrate.

(12) The display apparatus according to (11), wherein the first regions and the second regions are strip-like regions that extend in a second direction that is perpendicular to the first direction over the substrate.

(13) The display apparatus according to (12), wherein the first light emitting layer is formed in the first regions and the second regions, and wherein the second light emitting layer is formed in the second regions overlapping the first light emitting layer.

(14) The display apparatus according to (13), wherein the first light emitting layer and the second light emitting layer are both formed by vapor deposition.

(15) The display apparatus according to any one of (1) to (10), wherein a first light emitting layer that emits light of a first color and a second light emitting layer that emits light of a second color are formed entirely overlapping with each other and a charge generation layer is formed between the first light emitting layer and the second light emitting layer.

(16) A method of manufacturing a display apparatus, the method including:

forming a wiring pattern over a substrate;

laminating a first insulating film over the wiring pattern and forming a contact hole in an up-down direction at a specified position over the first insulating film;

forming, over the first insulating film, a lower electrode including a contact portion that is inserted through the contact hole and electrically connected to the wiring pattern;

forming a light emitting layer over the lower electrode;

forming an upper electrode over the light emitting layer;

regulating a light emitting region where the light emitting layer is interposed between the lower electrode and the upper electrode as a region including the contact portion; and disposing a color filter over the substrate in a region corresponding to at least the contact portion.

(17) The method of manufacturing a display apparatus according to (16),
wherein forming the lower electrode includes:
forming, over the first insulating film, a first lower electrode including a contact portion that is inserted through the contact hole and is electrically connected to the wiring pattern;
laminating a second insulating film over the first lower electrode and forming an opening at a specified position in the second insulating film; and
forming, over the second insulating film, a second lower electrode that is inserted through a side surface of the opening and is connected to the first lower electrode, and
wherein regulating the light emitting region regulates a region where the light emitting layer is interposed between the second lower electrode and the upper electrode as the light emitting region.

(18) A method of manufacturing a display apparatus, the method including:
forming a wiring pattern over a substrate;
laminating a first insulating film over the wiring pattern and forming a contact hole in an up-down direction at a specified position in the first insulating film;
laminating a second insulating film over the first insulating film and forming an opening that includes the contact hole at a specified position in the second insulating film;
forming, over the second insulating film, a lower electrode including a contact portion that is inserted through an opening and the contact hole and is electrically connected to the wiring pattern;
forming a light emitting layer over the lower electrode;
forming an upper electrode over the light emitting layer;
regulating a light emitting region where the light emitting layer is interposed between the lower electrode and the upper electrode as a region including the contact portion; and
disposing a color filter over the substrate in a region corresponding to at least the contact portion.

(19) An electronic appliance including a display apparatus including:
a wiring pattern formed over a substrate;
a first insulating film which is laminated over the wiring pattern and in which a contact hole is formed in an up-down direction at a specified position;
a lower electrode formed over the first insulating film and including a contact portion that is inserted through the contact hole and electrically connected to the wiring pattern;
a light emitting layer formed over the lower electrode;
an upper electrode formed over the light emitting layer;
a light emitting region regulating member regulating a light emitting region where the light emitting layer is interposed between the lower electrode and the upper electrode as a region including the contact portion; and
a color filter disposed over the substrate in a region corresponding to at least the contact portion.

(20) A method of driving a display apparatus including a wiring pattern formed over a substrate, a first insulating film which is laminated over the wiring pattern and in which a contact hole is formed in an up-down direction at a specified position, a lower electrode formed over the first insulating film and including a contact portion that is inserted through the contact hole and electrically connected to the wiring pattern, a light emitting layer formed over the lower electrode, an upper electrode formed over the light emitting layer, a light emitting region regulating member regulating a light emitting region where the light emitting layer is interposed between the lower electrode and the upper electrode as a region including the contact portion, and a color filter disposed over the substrate in a region corresponding to at least the contact portion, the method including:
driving the display apparatus using a pixel driving circuit electrically connected to the wiring pattern so that a light emitting element including the light emitting layer function as a capacitive element in a reverse bias.

REFERENCE SIGNS LIST

100, 200, 300, 400, 500, 600 organic EL display 111 substrate
120 TFT layer
125 wiring pattern
125*d* dummy wiring pattern
130 smoothing insulating film
130*c* contact hole
140, 540 lower electrode
540*a* first lower electrode
540*b* second lower electrode
140*c* contact portion
140*d* dummy contact portion
150 light emitting layer
154 charge generation layer
160 upper electrode layer
170 opening regulating insulating film
680 additional insulating film

The invention claimed is:
1. A display apparatus comprising:
a wiring pattern formed over a substrate;
a first insulating film which is laminated over the wiring pattern and in which a contact hole is formed in an up-down direction at a specified position;
lower electrodes, each formed over the first insulating film and including a contact portion that extends through the contact hole and is electrically connected to the wiring pattern, the lower electrode contact portions located in the contact hole being provided on an inner surface of the contact hole;
a light emitting layer formed over the lower electrodes, the light emitting layer being located in the contact hole and being provided on a surface of each of the lower electrodes;
an upper electrode formed over the light emitting layer, the upper electrode being located in the contact hole and being provided on a surface of the light emitting layer; and;
a light emitting region regulating member regulating a light emitting region where the light emitting layer is interposed between the lower electrodes and the upper electrode as a region including the contact portion
wherein,
the lower electrodes contain a metal material and reflect light emitted from the light emitting layer, and
the upper electrode is a transparent electrode.

2. The display apparatus according to claim 1, wherein a number of contact holes formed in the first insulating film is equal to a number of contact portions.

3. The display apparatus according to claim 1,
wherein a larger number of contact holes are formed in the first insulating film than a number of contact portions, and
wherein each of the lower electrodes further includes a dummy contact portion that is inserted through the contact hole but is not connected to the wiring pattern.

4. The display apparatus according to claim 1, wherein the light emitting region divided into a plurality of parts corresponding to the lower electrodes is formed.

5. The display apparatus according to claim 4, wherein each of the lower electrodes includes the contact portion at a position corresponding to any of the parts into which the light emitting region is divided.

6. The display apparatus according to claim 1, further comprising a pixel driving circuit that is electrically connected to the wiring pattern and allows a light emitting element including the light emitting layer to function as a capacitive element in a reverse bias.

7. The display apparatus according to claim 1, wherein the light emitting region regulating member is laminated between the lower electrodes and the upper electrode and is a second insulating film in which an opening is formed in the light emitting region.

8. The display apparatus according to claim 1, wherein each of the lower electrodes functions as the light emitting region regulating member by being formed in a region corresponding to the light emitting region.

9. The display apparatus according to claim 8, further comprising a second insulating film that is laminated between the first insulating film and the lower electrodes and that has an opening formed at a specified position, wherein, the lower electrodes are erected along a side surface of the opening from above the first insulating film and reach an upper surface of the second insulating film.

10. The display apparatus according to claim 9, further comprising a third insulating film that is laminated between the second insulating film and the light emitting layer and covers an end portion of each of the lower electrodes over the second insulating film.

11. The display apparatus according to claim 1,
wherein the light emitting layer includes at least a first light emitting layer that is formed in first regions over the substrate and emits light of a first color and a second light emitting layer that is formed in second regions over the substrate and emits light of a second color, and
wherein the layout pattern of the first regions and the second regions is reversed at every other region in a first direction over the substrate.

12. The display apparatus according to claim 11, wherein the first regions and the second regions are strip-like regions that extend in a second direction that is perpendicular to the first direction over the substrate.

13. The display apparatus according to claim 12,
wherein the first light emitting layer is formed in the first regions and the second regions, and
wherein the second light emitting layer is formed in the second regions overlapping the first light emitting layer.

14. The display apparatus according to claim 13, wherein the first light emitting layer and the second light emitting layer are both formed by vapor deposition.

15. The display apparatus according to claim 1, wherein a first light emitting layer that emits light of a first color and a second light emitting layer that emits light of a second color are formed entirely overlapping with each other and a charge generation layer is formed between the first light emitting layer and the second light emitting layer.

16. A method of manufacturing a display apparatus, the method comprising:
forming a wiring pattern over a substrate;
laminating a first insulating film over the wiring pattern;
forming a contact hole in an up-down direction at a specified position over the first insulating film;
forming, over the first insulating film, a lower electrode including a contact portion that extends through the contact hole and is electrically connected to the wiring pattern, the lower electrode contact portion located in the contact hole being provided on an inner surface of the contact hole;
forming a light emitting layer over the lower electrode, the light emitting layer being located in the contact hole and being provided on a surface of the lower electrode;
forming an upper electrode over the light emitting layer, the light emitting layer being located in the contact hole and being provided on a surface of the lower electrode; and
regulating a light emitting region where the light emitting layer is interposed between the lower electrode and the upper electrode as a region including the contact portion;
wherein,
the lower electrode contains a metal material and reflects light emitted from the light emitting layer, and
the upper electrode is a transparent electrode.

17. The method of manufacturing a display apparatus according to claim 16, wherein:
(a) forming the lower electrode includes
forming, over the first insulating film, a first lower electrode including a contact portion that is inserted through the contact hole and is electrically connected to the wiring pattern;
laminating a second insulating film over the first lower electrode and forming an opening at a specified position in the second insulating film; and
forming, over the second insulating film, a second lower electrode that is inserted through a side surface of the opening and is connected to the first lower electrode, and
(b) regulating the light emitting region regulates a region where the light emitting layer is interposed between the second lower electrode and the upper electrode as the light emitting region.

18. A method of manufacturing a display apparatus, the method comprising:
forming a wiring pattern over a substrate;
laminating a first insulating film over the wiring pattern;
forming a contact hole in an up-down direction at a specified position in the first insulating film;
laminating a second insulating film over the first insulating film;
forming an opening that includes the contact hole at a specified position in the second insulating film;
forming, over the second insulating film, a lower electrode including a contact portion that extends through an opening and the contact hole and is electrically connected to the wiring pattern, the lower electrode contact portion located in the opening and the contact hole being provided on inner surfaces of the opening and the contact hole;
forming a light emitting layer over the lower electrode, the light emitting layer located in the opening and the contact hole and being provided on a surface of the lower electrode;
forming an upper electrode over the light emitting layer, the upper electrode located in the opening and the contact hole and being provided on a surface of the light emitting layer; and regulating a light emitting region where the light emitting layer is interposed between the lower electrode and the upper electrode as a region including the contact portion;

wherein, the lower electrode contains a metal material, whereby light emitted from the light emitting layer is reflected by each of the lower electrode, and the upper electrode is a transparent electrode.

19. An electronic appliance comprising a display apparatus including:

a wiring pattern formed over a substrate;

a first insulating film which is laminated over the wiring pattern and in which a contact hole is formed in an up-down direction at a specified position;

a lower electrode formed over the first insulating film and including a contact portion that is inserted through the contact hole and electrically connected to the wiring pattern, the lower electrode contact portion located in the contact hole being provided on an inner surface of the contact hole;

a light emitting layer formed over the lower electrode, the light emitting layer located in the contact hole and being provided on a surface of the lower electrode;

an upper electrode formed over the light emitting layer, the upper electrode located in the contact hole and being provided on a surface of the light emitting layer; and a light emitting region regulating member regulating a light emitting region where the light emitting layer is interposed between the lower electrode and the upper electrode as a region including the contact portion;

wherein, the lower electrode contains a metal material and reflects light emitted from the light emitting layer, and the upper electrode is a transparent electrode.

20. A method of driving a display apparatus including a wiring pattern formed over a substrate, a first insulating film which is laminated over the wiring pattern and in which a contact hole is formed in an up-down direction at a specified position, a lower electrode formed over the first insulating film and including a contact portion that extends through the contact hole and electrically connected to the wiring pattern, the lower electrode contract portion located in the contact hole being provided on an inner surface of the contact hole, a light emitting layer formed over the lower electrode, the light emitting layer located in the contact hole and being provided on a surface of the lower electrode, an upper electrode formed over the light emitting layer, the upper electrode located in the contact hole and being provided on a surface of the light emitting layer, and a light emitting region regulating member regulating a light emitting region where the light emitting layer is interposed between the lower electrode and the upper electrode as a region including the contact portion, wherein, the lower electrode contains a metal material and reflects light emitted from the light emitting layer, and the upper electrode is a transparent electrode, the method comprising:

driving the display apparatus using a pixel driving circuit electrically connected to the wiring pattern so that a light emitting element including the light emitting layer function as a capacitive element in a reverse bias.

* * * * *